US012796516B2

(12) United States Patent
Choi et al.

(10) Patent No.: US 12,796,516 B2
(45) Date of Patent: Nov. 10, 2026

(54) SYSTEM INCLUDING A PLURALITY OF DIE HEADS WITH RELEASABLY COUPLED DIE CHUCKS AND A METHOD OF USING THE SAME

(71) Applicant: CANON KABUSHIKI KAISHA, Tokyo (JP)

(72) Inventors: Byung-Jin Choi, Austin, TX (US); Anshuman Cherala, Austin, TX (US); Mario Johannes Meissl, Austin, TX (US); Nilabh K. Roy, Austin, TX (US); Kenichiro Mori, Utsunomiya (JP)

(73) Assignee: CANON KABUSHIKI KAISHA

( * ) Notice: Subject to any disclaimer, the term of this patent is extended or adjusted under 35 U.S.C. 154(b) by 360 days.

(21) Appl. No.: 18/516,370

(22) Filed: Nov. 21, 2023

(65) Prior Publication Data

US 2025/0167165 A1 May 22, 2025

(51) Int. Cl.
*H10W 72/00* (2026.01)
*H10W 99/00* (2026.01)
*H10W 80/00* (2026.01)

(52) U.S. Cl.
CPC .......... *H10W 72/011* (2026.01); *H10W 99/00* (2026.01); *H10W 72/071* (2026.01); *H10W 80/312* (2026.01); *H10W 80/327* (2026.01)

(58) Field of Classification Search
None
See application file for complete search history.

(56) References Cited

U.S. PATENT DOCUMENTS

| | | | | |
|---|---|---|---|---|
| 6,196,532 | B1 | 3/2001 | Otwell | |
| 6,943,038 | B2 * | 9/2005 | Meixner | H10N 50/01 438/692 |
| 6,974,168 | B2 | 12/2005 | Capewell | |
| 7,257,887 | B2 | 8/2007 | Lee | |
| 10,410,906 | B2 | 9/2019 | Wang | |
| 2002/0029857 | A1 | 3/2002 | Yamada | |
| 2004/0175845 | A1 * | 9/2004 | Molla | H10B 61/00 257/E27.005 |
| 2005/0052938 | A1 * | 3/2005 | Horikoshi | B82Y 10/00 257/E27.005 |

(Continued)

FOREIGN PATENT DOCUMENTS

| | | | |
|---|---|---|---|
| WO | 2022212260 | A1 | 10/2022 |
| WO | 2023056068 | A1 | 4/2023 |
| WO | 2023056072 | A1 | 4/2023 |

OTHER PUBLICATIONS

U.S. Appl. No. 17/935,768, specification and figures, filed Sep. 27, 2022, pp. 1-36.

*Primary Examiner* — Bilkis Jahan
(74) *Attorney, Agent, or Firm* — Abel Schillinger, LLP

(57) ABSTRACT

A system can include a plurality of die heads. Each die head within the plurality of die heads can include a device head configured to be releasably coupled to a die chuck to allow the die chuck to be at different positions within a die chuck mounting region at different times. The system can be used when moving die chucks to achieve a different pitch for die holding regions of the die chucks. The method can include coupling a die chuck to a docking station; moving the docking station from a first location along a support structure to a second location along the support structure; and decoupling the first die chuck from the docking station.

23 Claims, 31 Drawing Sheets

(56) References Cited

U.S. PATENT DOCUMENTS

| | | | | |
|---|---|---|---|---|
| 2009/0165292 | A1 * | 7/2009 | Amurao | H05K 13/0486 29/764 |
| 2010/0316478 | A1 | 12/2010 | Na | |
| 2014/0134804 | A1 * | 5/2014 | Kelly | H01L 24/95 438/118 |
| 2015/0027616 | A1 | 1/2015 | Chan | |
| 2015/0255529 | A1 * | 9/2015 | Wang | H10D 1/20 438/3 |
| 2019/0333800 | A1 | 10/2019 | Heo | |
| 2023/0163013 | A1 | 5/2023 | Sreenivasan | |
| 2023/0245996 | A1 | 8/2023 | Sreenivasan | |

* cited by examiner

SYSTEM INCLUDING A PLURALITY OF DIE HEADS WITH RELEASABLY COUPLED DIE CHUCKS AND A METHOD OF USING THE SAME

FIELD OF THE DISCLOSURE

The present disclosure relates to systems including pluralities of die heads with releasably coupled die chucks and method of using the systems.

RELATED ART

Advanced packaging technologies demand high throughput and precise placement of dies. Hybrid bonding can be particularly challenging with small misalignment tolerances. A single-die transfer technique can achieve high precision but has a low throughput. A multi-die transfer technique can achieve the high throughput, but precise placement of dies can be difficult. A need exists for a placement high throughput while still meeting specifications for die placement.

SUMMARY

In an aspect, a system can comprise a plurality of die heads. Each die head within the plurality of die heads can include a device head configured to be releasably coupled to a die chuck to allow the die chuck to be at different positions within a die chuck mounting region at different times.

In an implementation, each of the die heads further comprises a mounting plate and the die chuck including a die holding region. The mounting plate is disposed between the device head and the die chuck, and the mounting plate defines the die chuck mounting region.

In a particular implementation, the mounting plate includes a vacuum channel for holding the die chuck at the different positions.

In a more particular implementation, the die chuck comprises a distal side and a proximal side, wherein the device head is closer to the proximal side than to the distal side; and a chucking vacuum receiving zone along the proximal side of the die chuck, wherein the chucking vacuum receiving zone is configured to allow the die chuck to be held by a vacuum.

In another particular implementation, the die chuck comprises a distal side and a proximal side, wherein the device head is closer to the proximal side than to the distal side; a vacuum receiving zone along the proximal side of the die chuck; a die vacuum receiving zone along on the distal side of the die chuck; and a vacuum connection within the die chuck and between the vacuum receiving zone and the die vacuum receiving zone.

In a more particular implementation, the die chuck comprises a modulation receiving zone along the proximal side of the die chuck; a die modulation zone along the distal side of the die chuck; and a modulation connection within the die chuck and between the modulation receiving zone and the die modulation zone.

In another particular implementation, the device head has a device head mass, and the die chuck has a die chuck mass that is less than half of the device head mass.

In still another particular implementation, a center of the die holding region is offset from a center of the die chuck mounting region when the die chuck is at each of the different positions.

In a further particular implementation, the die head is configured to allow motion of the die chuck while the die chuck is coupled to the device head.

In a further implementation, the system further comprises a docking station configured to move the die chuck relative to its corresponding device head; a first coupler configured to couple the die chuck to the corresponding device head and to decouple the die chuck from the corresponding device head; and a second coupler configured to couple the die chuck to the docking station and to decouple the die chuck from the docking station.

In a particular implementation, the second coupler is configured such that the docking station does not contact a die holding region of the die chuck.

In another implementation, the system further comprises a controller configured to transmit a signal to move a first die chuck of a first die head from a first position along a first device head of the first die head to a second position along the first device head, wherein the plurality of die heads includes the first die head.

In still another implementation, the system further comprises a bridge coupled to the plurality of die heads, wherein the plurality of die heads is a plurality of bonding heads; a source substrate chuck; a base spaced apart from the bridge; a positioning stage coupled to the base; a plurality of pick-up heads coupled to the positioning stage; and a docking station coupled to the positioning stage.

In a further implementation, each of the die heads further comprises one of a first mounting plate and a second mounting plate. The first mounting plate defines a first location of a die holding region of the die chuck on the device head, the second mounting plate defines a second location of the die holding region of the die chuck on the device head, and the second location is different from the first location.

In another aspect, a method can comprise coupling a first die chuck to a docking station by activating a first coupler associated with the docking station. A plurality of die heads includes a first die head, the first die head includes a first device head and the first die chuck, the first die chuck has a first die holding region, and the first die chuck is coupled to the first device head at a first position within a first die chuck mounting region. The method can further comprise decoupling the first die chuck from the first device head by deactivating a second coupler associated with the first device head; moving the first docking station from a first location along a support structure to a second location along the support structure; coupling the first die chuck to the first device head by activating the second coupler, wherein after coupling the first die chuck to the first device head, the first die chuck is at a second position within the first die chuck mounting region, wherein the second position is different from the first position; and decoupling the first die chuck from the docking station by deactivating the first coupler.

In an implementation, the method further comprises coupling a second die chuck to the docking station by activating a third coupler or the first coupler associated with the docking station. The plurality of die heads includes a second die head, the second die head includes a second device head and the second die chuck, the second die chuck has a second die holding region, and the second die chuck is coupled to the second device head at a third position within a second die chuck mounting region. The method further comprises decoupling the second die chuck from the second device head by deactivating a fourth coupler associated with the second device head; moving the docking station from a third location along the support structure to a fourth location along the support structure; coupling the second die chuck to the second device head by activating the fourth coupler, wherein after coupling the second die chuck to the second device head, the second die chuck is at a fourth position within the second die chuck mounting region, wherein the fourth position is different from the third position; and decoupling the second die chuck from the docking station by deactivating the third coupler or the first coupler. The first die holding region and the second die holding region are at a first pitch when the first die chuck is at the first position and the second die chuck is at the third position, the first die holding region and the second die holding region are at a second pitch when the first die chuck is at the second position and the second die chuck is at the fourth position, and the second pitch is different from the first pitch.

In a particular implementation, the method further comprises mounting a destination substrate onto a destination substrate chuck coupled to a positioning stage. The destination substrate has a plurality of destination sites at a destination site pitch, the destination site pitch is closer to the second pitch than to the first pitch, and the docking station is coupled to the positioning stage.

In a more particular implementation, the method further comprises picking up a set of dies from a source substrate with a plurality of pick-up heads; transferring the set of dies from the plurality of pick-up heads to the plurality of die heads, wherein the plurality of die heads is a plurality of bonding heads, wherein transferring is performed after coupling the first die chuck to the first device head and coupling the second die chuck to the second device head; measuring alignment errors of the set of dies held by the plurality of bonding heads; adjusting a position of a first die within the set of the dies relative to the destination substrate on the destination substrate chuck based on an alignment error associated with the first die; and bonding the set of dies to the destination substrate with the plurality of bonding heads.

In another more particular implementation, the method further comprises receiving the destination site pitch including a first destination site pitch in a first direction and a second destination site pitch in a second direction; and positioning die holding regions for a first cell of four die heads to be at a first integer multiple of the first destination site pitch and a second integer multiple of the second destination site pitch. The first cell includes the first die head and the second die head.

In a still more particular implementation, the method further comprises positioning die holding regions for a second cell of four die heads with same pitches as the die holding regions for the first cell of four die heads.

In another implementation, moving the docking station is performed between a pair of transfer operations, the plurality of die heads includes the first die head, and the first device head is coupled to the support structure and is not moved when the first die chuck is moved.

In a further aspect, a method can comprise decoupling a first die chuck from a first device head. A plurality of die heads includes a first die head, the first die head includes the first device head and the first die chuck, and, before decoupling, the first die chuck has a first die holding region at a first position relative to the first device head. The method further comprise decoupling a second die chuck from a second device head. The plurality of die heads includes a second die head, the second die head includes the second device head and the second die chuck, and, before decoupling, the second die chuck has a second die holding region at a second position relative to the second device head. The method further comprises coupling a third die chuck to the first device head, wherein the third die chuck has a third die holding region at a third position relative to the first device head; and coupling a fourth die chuck to the second device head, wherein the fourth die chuck has a fourth die holding region at a fourth position relative to the second device head. Before decoupling the first die chuck and decoupling the second die chuck, the first die holding region and the second die holding region are at a first pitch, and, after coupling the third die chuck and coupling the fourth die chuck, the third die holding region and the fourth die holding region are at a second pitch that is different from first pitch.

In an implementation, the method further comprises bonding a first die to a first destination substrate using the first die chuck; bonding a second die to the first destination substrate using the second die chuck; bonding a third die to a second destination substrate using the third die chuck; and bonding a fourth die to the second destination substrate using the fourth die chuck. Bonding the first die and bonding the second die are performed before decoupling the first die chuck and decoupling the second die chuck, and bonding the third die and bonding the fourth die are performed after coupling the third die chuck and coupling the fourth die chuck.

BRIEF DESCRIPTION OF THE DRAWINGS

Implementations are illustrated by way of example and are not limited in the accompanying figures.

Figure 1:
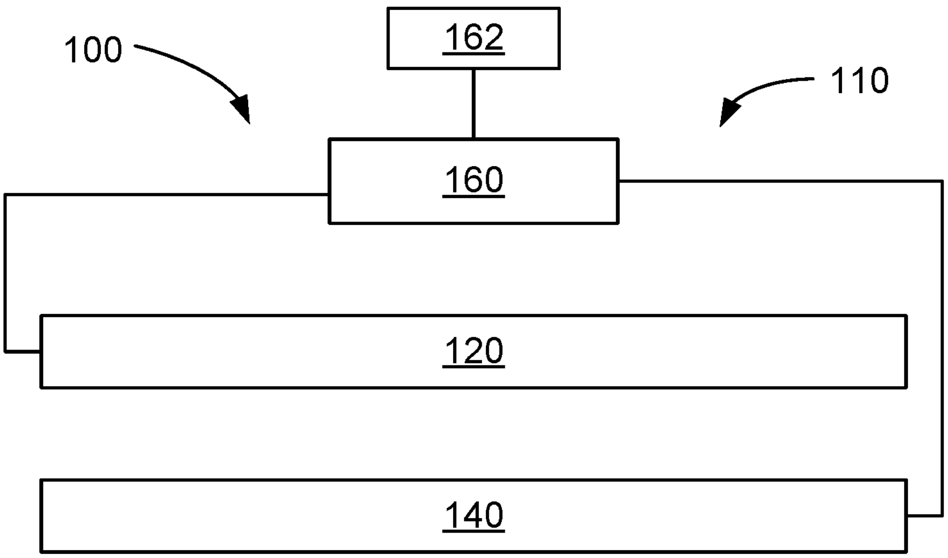
FIG. 1 includes a conceptual, high-level view of a system that can be used in transferring dies to a destination substrate.

Skilled artisans appreciate that elements in the figures are illustrated for simplicity and clarity and have not necessarily been drawn to scale. For example, the dimensions of some of the elements in the figures can be exaggerated relative to other elements to help improve understanding of implementations of the invention.

DETAILED DESCRIPTION

The following description in combination with the figures is provided to assist in understanding the teachings disclosed herein. The following discussion will focus on specific implementations and implementations of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and can be found in textbooks and other sources within the arts.

A system can include a plurality of die heads (such as bonding heads). Each die head within the plurality of die heads can include a device head configured to be releasably coupled to a die chuck to allow the die chuck to be at different positions within a die chuck mounting region at different times.

Changing a die head pitch for an array of die heads can be performed by repositioning die chucks of the die heads rather than repositioning the dies heads themselves. The die chucks have substantially less mass as compared to the device heads. The die chucks can be moved more easily and accurately as compared to moving entire die heads. Coupling systems for holding the die chucks can be more robust because of the lower mass of the die chucks as compared to the die heads. No tubes, cabling, or other mechanical feature within a device head or a die head support structure for the device head, such as a bridge, a carriage, or a base, is needed when moving the die chucks using the docking station. Such a configuration can simplify the design of the die head and its corresponding support structure(s) and reduce the likelihood of particle generation when changing the pitch for die holding regions. The pitch of the die holding regions may be an integer multiple of a destination site pitch. The destination site pitch can vary between 0.5 mm to 100 mm depending on the object being assembled.

The system and method of using the apparatus is better understood with the description below in conjunction with the corresponding figures. While much of the description addresses repositioning bonding heads, concepts as described herein can also be used to reposition pick-up heads.

Referring to FIGS. 1 to 4, in an implementation, a system 100 can include an apparatus 110 that includes a bridge 120, components coupled to the bridge 120 (illustrated in FIG. 3), a base 140, components coupled to the base 140 (illustrated in FIGS. 2 to 4), a controller 160, and a memory 162. The controller 160 can be coupled to the bridge 120, the base 140, one or more components coupled to the bridge 120 or the base 140, or a combination thereof. Each of the bridge 120 and the base 140 can be a support structure.

Figure 2:
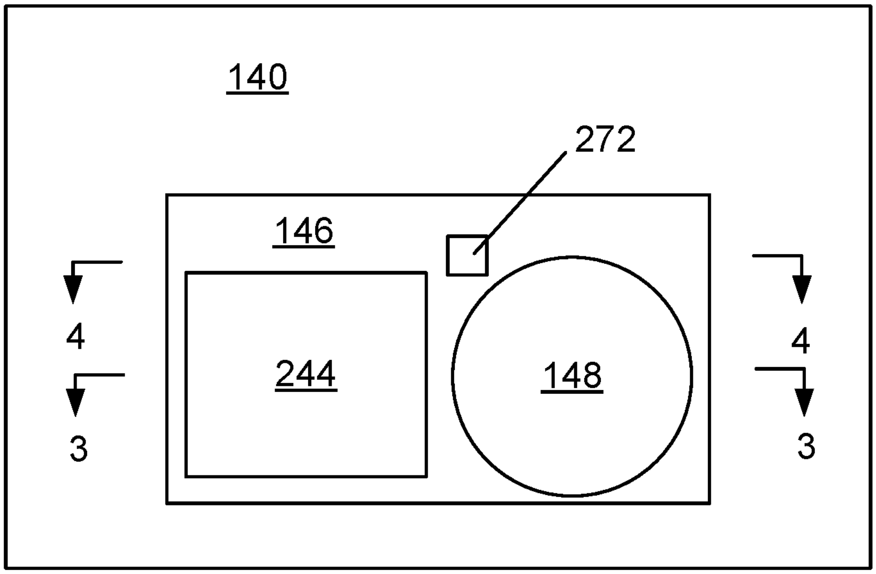
FIG. 2 includes a top view of a portion of a base of an apparatus within the system of FIG. 1.
Figure 3:
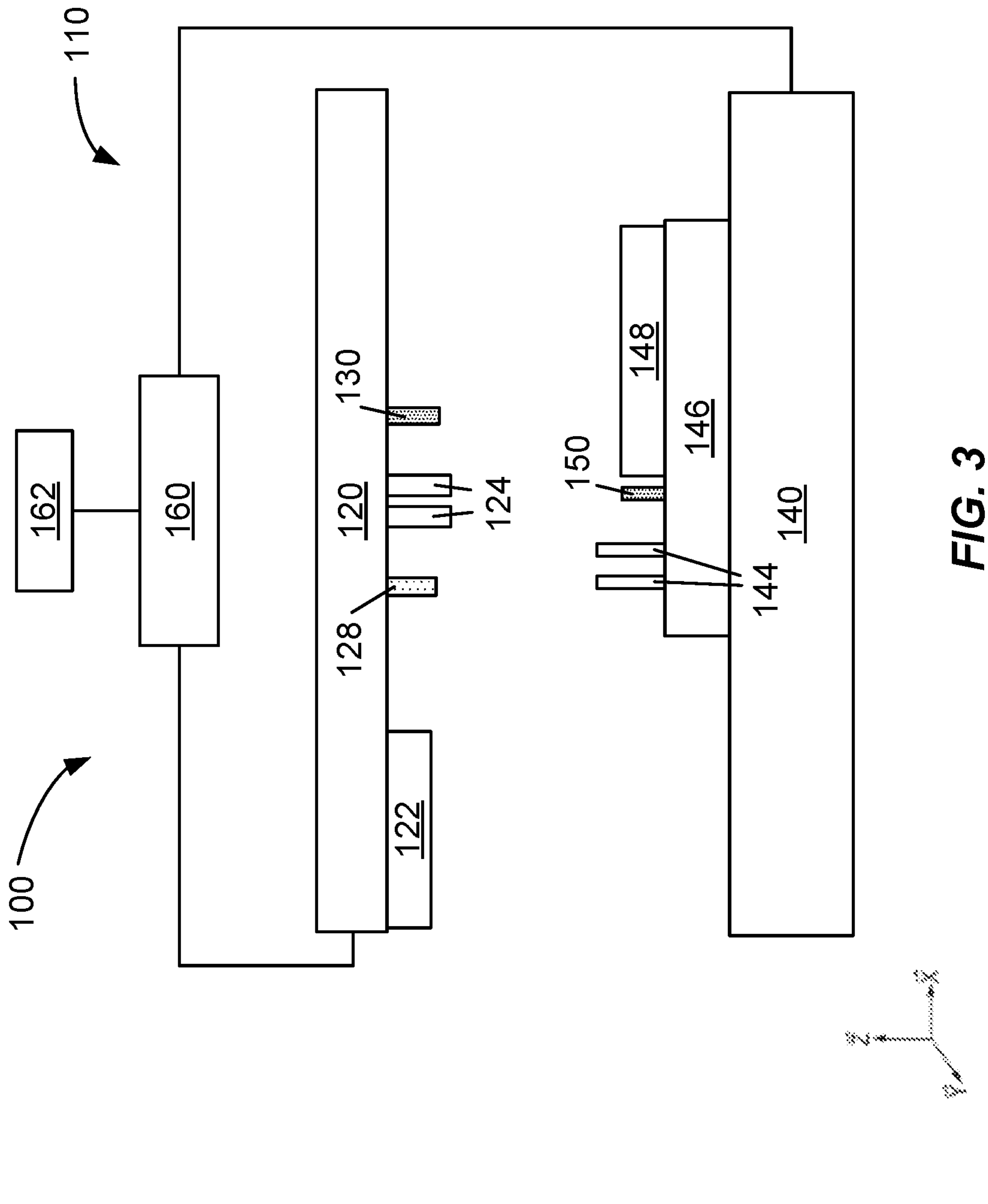
FIG. 3 includes an illustration of a cross-sectional view of a portion of the apparatus in FIG. 1 as seen along sectioning line 3-3 in FIG. 2.

FIG. 2 includes a top view of the base 140 to illustrate general locations for the carriage 146, an area 244 corresponding to the area occupied by an array of die transfer seats 144 and an optical component 150 (illustrated in FIG. 3), the destination substrate chuck 148, and a docking station 272. FIG. 3 includes a cross-sectional view along the sectioning line 3-3 in FIG. 2, and FIG. 4 includes a cross-sectional view along the sectioning line 4-4 in FIG. 2.

Figure 4:
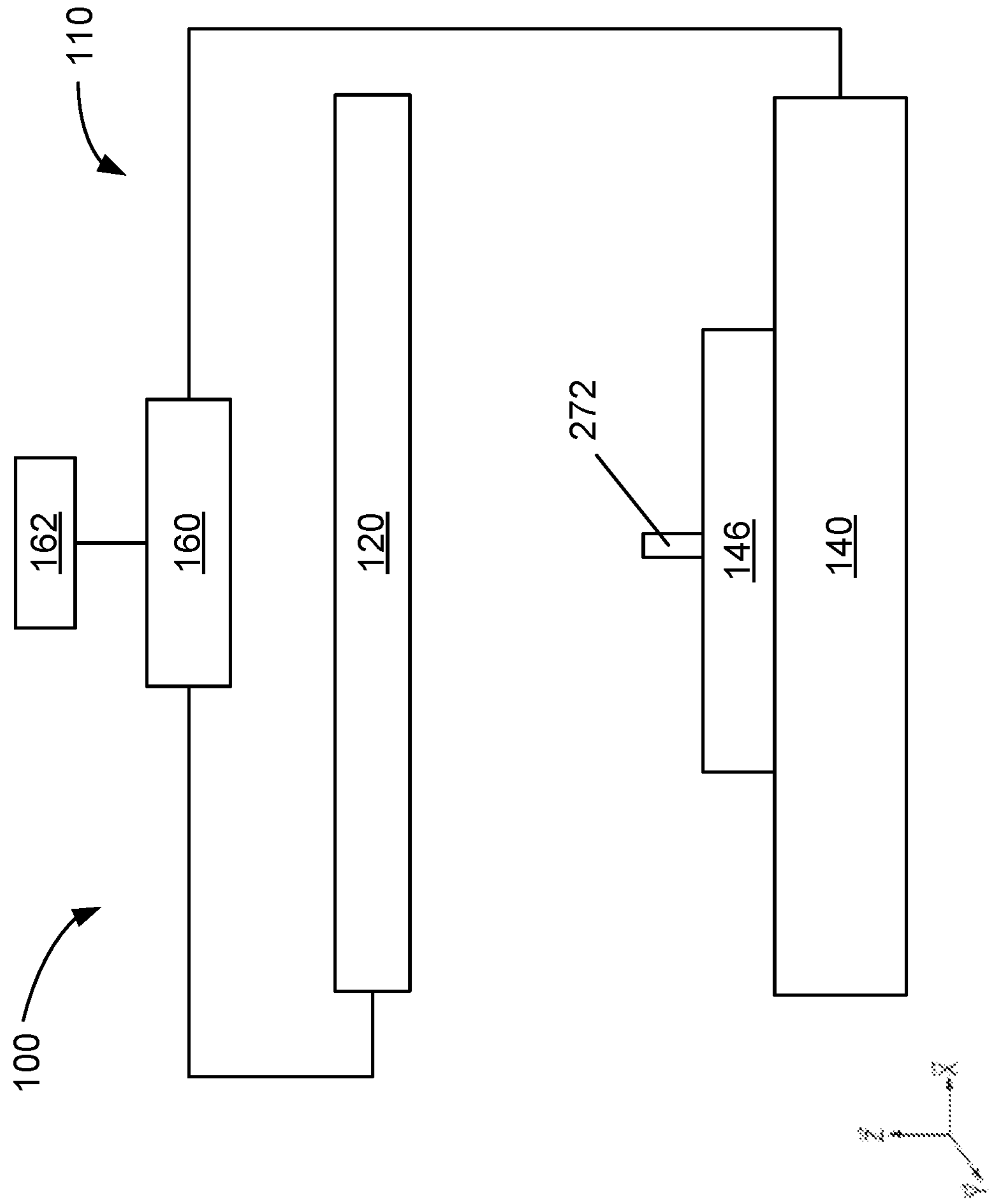
FIG. 4 includes an illustration of a cross-sectional view of another portion of the apparatus in FIG. 1 as seen along sectioning line 4-4 in FIG. 2.

In FIGS. 3 and 4, the bridge 120, the base 140, and components physically coupled to the bridge 120 or the base 140 can be organized along an X-direction, a Y-direction, a Z-direction, or a combination thereof. With respect to FIG. 3, 4, and other cross-sectional or side views in the figures, the X-direction is between the left-hand and right-hand sides of the figure, the Z-direction is between the top and bottom of the figure, and the Y-direction is into and out of the drawing sheet. Unless explicitly stated to the contrary, rotation occurs along a X-Y plane defined by the X-direction and Y-direction.

FIGS. 3 and 4 include components that are coupled to the bridge 120 or the base 140. Components coupled to the bridge 120 can include a source substrate chuck 122, an array of bonding heads 124, alignment reference 128, and an optical component 130. Components coupled to the base 140 can include the array of die transfer seats 144, the carriage 146, the destination substrate chuck 148, an optical component 150, and the docking station 272. Components coupled to the bridge 120 are described before the components coupled to the base 140.

FIG. 3 includes the source substrate chuck 122 that can be a vacuum chuck, pin-type chuck, a groove-type chuck, an electrostatic chuck, an electromagnetic chuck, or the like. The source substrate chuck 122 can be coupled to the bridge 120 by being attached to the bridge 120 directly or can be coupled to the bridge 120 via a carriage (not illustrated). The source substrate chuck 122 has a source substrate holding surface that faces the base 140 or a component coupled to the base 140.

FIG. 3 illustrates the array of bonding heads 124. The array of bonding heads 124 can be configured as a vector (a row or a column of bonding heads), or as a matrix (at least two rows and at least two columns of bonding heads), or as a staggered array. The number of bonding heads within the array of bonding heads 124 may be different between rows, between columns, or between rows and columns. Some array configurations can be 3×1, 6×1, 2×2, 2×3, 2×4, 4×2, 10×10, or another rectangular shape, where the first number corresponds to the number of bonding heads along a row or column, and the second number corresponds to the number of bonding heads along the other of the row or column. The array of bonding heads 124 can a particular implementation of a plurality of bonding heads. In another implementation, the plurality of bonding heads 124 may not be organized as an array.

The die chucks can be releasably coupled to their corresponding device heads. A different pitch for the die holding regions can be achieved by moving die chucks to different positions within their corresponding die chuck mounting regions. In another implementation, a different pitch for die holding regions can be achieved by removing a particular set of die chucks from the device heads and coupling a different set of die chucks to those device heads.

Each of die chucks can be a vacuum chuck, pin-type chuck, a groove-type chuck, an electrostatic chuck, an electromagnetic chuck, or the like. Alternatively, the die chucks can be contactless die chucks, such as Bernoulli chucks or die chucks that contact the lateral sides, and not the device side or back side, of a die. The device side is a side of the die where electrical components are formed, the back side of the die is opposite the device side, and the lateral sides are disposed between the device and back sides of the die. When a die includes a thru-substrate via (TSV), the TSV may be exposed along the back side of the die. Contactless chucks can help to reduce the likelihood that an activated surface for bonding will contact the bonding head. In an implementation, the device side, the back side, or both the device side and back side can have activated surface(s). The lateral sides may not be activated for bonding.

The bonding heads may be configured such that the die chucks have a limited range of motion relative to their corresponding device heads to provide better positioning when dies are transferred from the array of bonding heads 124 to a destination substrate (not illustrated in FIGS. 1 to 4) coupled to a destination substrate chuck 148. Each bonding head may include a positioning stage which move each bonding head independently in one or more directions of X-direction, Y-direction, Z-direction, tip, tilt, and rotation. More details regarding the bonding heads are described later in this specification.

The alignment reference 128 can include marks or other features that can help with proper positioning of the carriage 146 with respect to the bridge 120 or a component coupled to the bridge 120. The alignment reference 128 and an optical component 150 can be used during an alignment operation. More details regarding the optical component 150 are described below with respect to components coupled to the base 140.

The optical component 130 can be used to determine a pitch of the array of die transfer seats 144. The optical component 130 may also be used to confirm the presence or identity of a die (for example, a part number or type of die) coupled to a die transfer seat within the array of die transfer seats 144 or a destination substrate coupled to the destination substrate chuck 148. If needed or desired, more than one optical component 130 may be coupled to the bridge 120. The optical component 130 may also be used to determine positions of destination sites of the destination substrate coupled to the destination substrate chuck 148.

The carriage 146 can be a positioning stage and provide translating motion along the base 140 in the X-direction, Y-direction, or Z-direction or rotational motion about one or more of axes, such as rotation about a Z-axis and along a plane lying along the X-direction and Y-direction.

The array of die transfer seats 144 are coupled to the carriage 146. The array of die transfer seats 144 have device heads and die chucks. The bodies are coupled to the carriage 146. The bridge 120 or a component coupled to the bridge 120 is closer to the die chucks than to the device heads of die transfer seats within the array of die transfer seats 144. In an implementation, any one or more of the die transfer seats can have a die chuck that can be of any type described with respect to the array of bonding heads 124. The array of die transfer seats 144 can have die chucks that may or may not be releasably coupled to their corresponding device heads. The die transfer seats and the bonding heads may be of the same type or different types. In an implementation, the die transfer seats within the array of die transfer seats 144 can be pick-up heads.

The array of die transfer seats 144 can be coupled to the carriage 146 and configured as a vector (a row or a column of die transfer seats), or as a matrix (at least two rows and at least two columns of die transfer seats), or as a staggered array. Regarding the matrix, the number of die transfer seats within the array of die transfer seats 144 may be different between rows, between columns, or between rows and columns. Some array configurations can be 3×1, 6×1, 2×2, 2×3, 2×4, 4×2, 10×10, or another rectangular shape, where the first number corresponds to the number of die transfer seats along a row or column, and the second number corresponds to the number of die transfer seats along the other of the row or column. The array of die transfer seats 144 can a particular implementation of a plurality of die transfer seats. In another implementation, the plurality of die transfer seats 144 may not be organized as an array.

In theory, dies from an entire source wafer may be transferred all at once. From a top view, for such a configuration, the array of die transfer seats 144 will have fewer die transfer seats along rows closer to the top and bottom of the array as compared to the row or the pair of rows closest to the center of the array, and the array of die transfer seats 144 will have fewer die transfer seats along columns closer to the left-side and right-side of the array as compared to the column or the pair of columns closest to the center of the array. After reading this specification, skilled artisans will be able to determine an array configuration for the array of die transfer seats 144 that meets the needs or desires for a particular application.

The array of die transfer seats 144 can be configured to have an adjustable pitch that can be reversibly changed between a source-matching pitch and the bonding head-matching pitch. The array of die transfer seats 144 or the carriage 146 can include motors, electrical components or the like that can be activated to move die transfer seats to achieve a desired pitch. In an implementation, the array of die transfer seats 144 can be at the source-matching pitch when picking up a set of dies coupled to the source substrate chuck 122 and at the bonding head-matching pitch when transferring the set of dies to the array of bonding heads 124. After the dies are transferred to the array of bonding heads 124, the pitch for the array of die transfer seats 144 can be changed back to the source-matching pitch before picking up more dies.

In an implementation, die transfer seats within the array of die transfer seats 144 may or may not be pick-up heads. The die transfer seats within the arrays of die transfer seats 144 may or may not be able to extend in the Z-direction (toward the bridge 120 or a component coupled to the bridge 120). Dies can be loaded onto die transfer seats within the arrays of die transfer seats 144 by a die loading machine. Alternatively, the dies can be loaded manually by a human operator.

The optical component 150 can be coupled to the carriage 146 and be used during alignment operations. The optical component 150 can be part of registration and alignment hardware used in aligning the carriage 146 to the alignment reference 128, identifying dies that would be coupled to the source substrate chuck 122 or would be held by the array of bonding heads 124, positioning bonding heads, measuring misalignment error of dies that would be held by the array of bonding heads 124, or the like. The optical component 150 can include a lens that is optically coupled to a mirror, a prism, a grating, a light source, aa fiber optic cable, an aperture, a tube, a camera, or a combination thereof.

The destination substrate chuck 148 can be coupled to the carriage 146. In an implementation, the destination substrate chuck 148 is attached to the carriage 146. The destination substrate chuck 148 can hold a destination substrate including destination dies with destination sites. The destination substrate chuck 148 can be a vacuum chuck, pin-type chuck, a groove-type chuck, an electrostatic chuck, an electromagnetic chuck, or the like. The destination substrate chuck 148 can be heated, cooled, or both heated and cooled. The destination substrate chuck 148 can include a heater (not illustrated). In the same or different implementation, a fluid (not illustrated) can flow through the destination substrate chuck 148 to increase or decrease the temperature of the destination substrate chuck 148.

FIG. 4 includes a side view of the docking station 272. The docking station 272 can be coupled to the carriage 146 and be used to move die chucks of the bonding heads within the array of bonding heads 124. The carriage 146 can translate the docking station 272 in the X-direction, the Y-direction, rotated along an X-Y plane, or a combination thereof. The system 100 can be configured to allow a die chuck to be moved away from or closer to the bridge 120 before the docking station 272 is translated in the X-direction, the Y-direction, rotated, or a combination thereof. The system 100 may include one or more than one docking station. More details regarding the docking station 272 are described in more detail later in this specification.

In an alternative implementation, the docking station 272 includes one or more of: a hand; an arm; and a robot. The docking station 272 may also include an end effector that can hold the die chuck 560. The end effector may be adapted to hold the die chuck 560 without touching the die holding region 564. The end effector may use a vacuum(s), pin(s), finger(s), magnet(s) that may or may not be electromagnet (s), gripper(s), etc. that couple with the die chuck 560. In an alternative implementation, the docking station 272 is not attached to the carriage. In an alternative implementation, the docking station 272 may be designed to reposition multiple die chucks at one time. In an alternative implementation, the docking station 272 may remove a first die chuck 560 from the mounting plate 550 and transfer a second die chuck 560 from a library of die chucks to the mounting plate. The docking station 272 may include a pneumatic loading mechanism, an electrostatic mechanism; an electromagnetic loading mechanism, or a combination thereof.

Referring to FIGS. 1 to 4, the system 100 can be operated using a controller 160 in communication with the bridge 120, any component coupled to the bridge 120, the base 140, any component coupled to the base 140, or any combination thereof. The controller 160 can operate using a computer readable program, optionally stored in memory 162. The controller 160 can include a processor (for example, a central processing unit of a microprocessor or microcontroller), a field-programmable gate array (FPGA), an application specific integrated circuit (ASIC), or the like. The controller 160 can be within the apparatus 110. In another implementation (not illustrated), the controller 160 can be at least part of a computer external to the apparatus 110, where such computer is bidirectionally coupled to the system 100. The memory 162 can include a non-transitory computer readable medium that includes instructions to carry out the actions associated with or between transfer operations. In another implementation, the bridge 120, a component coupled to the bridge 120, the base 140, or a component coupled to the base 140 can include a local controller that provides some of the functionality that would otherwise be provided by the controller 160. The controller 160 may include multiple processors that work together and communicate with each other.

The terms "transfer operation" and "transfer cycle" are addressed to aid in understanding implementations as described herein. A transfer operation starts no later than loading a first set of dies for a destination substrate onto the array of die transfer seats 144 and ends with a last set of dies bonded to destination sites of the destination substrate overlying the destination substrate chuck 148. A transfer cycle starts no later than loading a set of dies for the destination substrate onto the array of die transfer seats 144 until that same particular set of dies is bonded to the destination sites of the destination substrate that is coupled to the destination substrate chuck 148. A transfer operation can include one or more transfer cycles.

Die heads can be designed so that die chucks can be repositioned relative to their corresponding device heads or by replacing sets of die chucks to achieve different pitches for die holding regions for the die heads. FIGS. 5 to 21 includes designs for die heads and the docking station 272. Much of the description below is with respect to the array of bonding heads 124. In the same or alternative implementation, the designs may also be used with respect to the array of die transfer seats 144.

Figure 5:
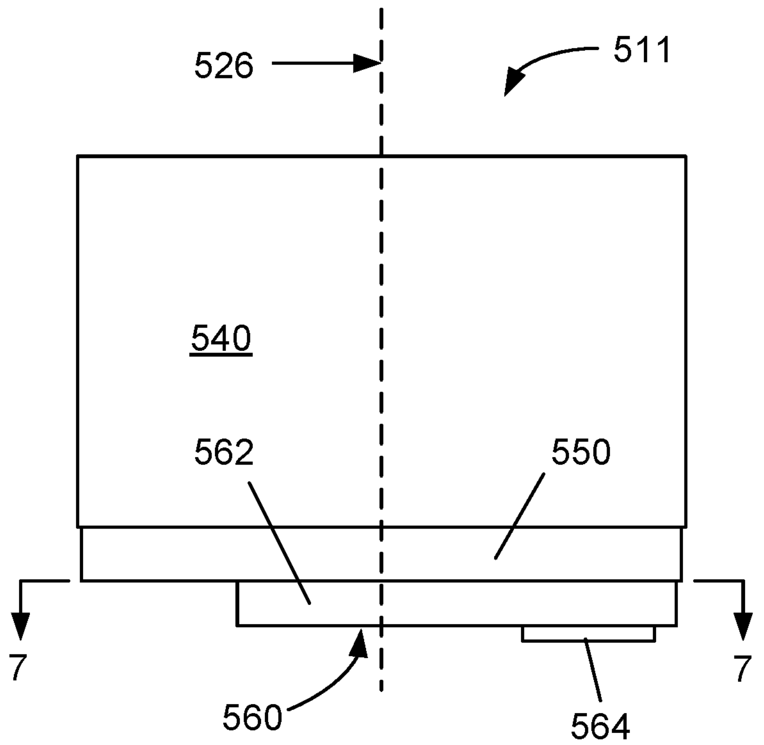
FIG. 5 includes an illustration of a side view of a die head in accordance with an implementation.

FIG. 5 includes a side view of a die head 511 that can be a bonding head within the array of bonding heads 124. The die head 511 includes a device head 540, a mounting plate 550, and a die chuck 560. The device head 540 holds the mounting plate and controls the motion of the mounting plate and everything coupled to the mounting plate including the die chuck and any die or device coupled to the die chuck. The device head 540 also provides connections, such as a pneumatic connection, an optical connection, an electrical connection, or a combination thereof, to the mounting plate, the die chuck, and any component attached to these. The device head 540 and the mounting plate 550 can have centers that lie along a centerline 526. The device head 540 can be coupled to the bridge 120 (not illustrated in FIG. 5) and be in fluid communication with the mounting plate 550 and the die chuck 560 to provide a vacuum, a pressurized fluid, or both to the mounting plate 550, the die chuck 560, or both. Each of the mounting plate 550 and the die chuck 560 can include a metal, a metal alloy, a glass, a ceramic material, a polymer compound, or the like. The mounting plate 550 and the die chuck 560 can be made of the same material or different materials.

The mounting plate 550 is disposed between the device head 540 and the die chuck 560. The mounting plate 550 defines a die chuck mounting region where the die chuck 560 can be coupled. The mounting plate 550 can be coupled to the device head 540 by a vacuum, an electrostatic charge, an electromagnetic force, a mechanical coupling, or the like. Increasing an area of the die chuck mounting region provides more flexibility in positioning the die chuck 560. In FIG. 5, the mounting plate 550 has a proximal side along the device head 540 and a distal side along the die chuck 560. The amount of area occupied by the die chuck mounting region may be confined by the size of the device head 540. The die chuck mounting region can be at least 80%, at least 90%, or at least 95% of the area along the distal side of the mounting plate 550. The mounting plate 550 may or may not have the same lateral dimensions (in the X-direction, Y-direction, or both directions) as compared to the device head 540. In an implementation, the mounting plate 550 can have X-direction and Y-direction lateral dimensions each of which is within 5% of corresponding lateral dimensions of the device head 540. In an alternative implementation, the mounting plate 550 may be an integral part of the device head 540 and is that surface of the device head 540 that interfaces with the die chuck 560. In an alternative implementation, different mounting plates 550 are available and switchable that provide different ranges of mounting locations for the die chuck.

Figure 6:
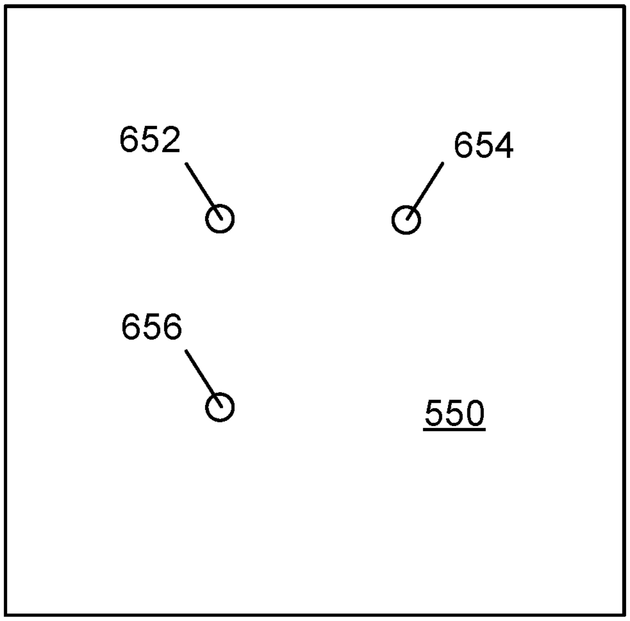
FIG. 6 includes an illustration of a bottom view of a mounting plate of the die head of FIG. 5.

FIG. 6 includes a bottom view of the mounting plate 550 and includes channels 652, 654, and 656 that extend through the thickness of the mounting plate 550. The channel 652 allows a vacuum to hold the die chuck 560 in place, the channel 654 allows a vacuum to reach a die holding of the die chuck 560, and the channel 656 allows a pressurized fluid to reach a different location within the die holding region of the die chuck 560. The significance of the locations of the channels 652, 654, and 656 will be understood better after addressing the design of the die chuck 560.

The die chuck 560 includes a main body 562 and a die holding region 564. The die chuck 560 has a proximal side along the mounting plate 550 and a distal side opposite the proximal side of the die chuck 560. The die holding region 564 has a center that may or may not directly underlie (when the die chuck 560 is part of the array of bonding heads 124) or directly overlie (when the die chuck 560 is part of the array of die transfer seats 144) centers of the device head 540 and the mounting plate 550. Directly overlie and directly underlie refers to components that lie along a vertical line that includes or is parallel to the centerline 526. Components that directly overlie or underlie each other may or may not be in contact with each other.

Figure 7:
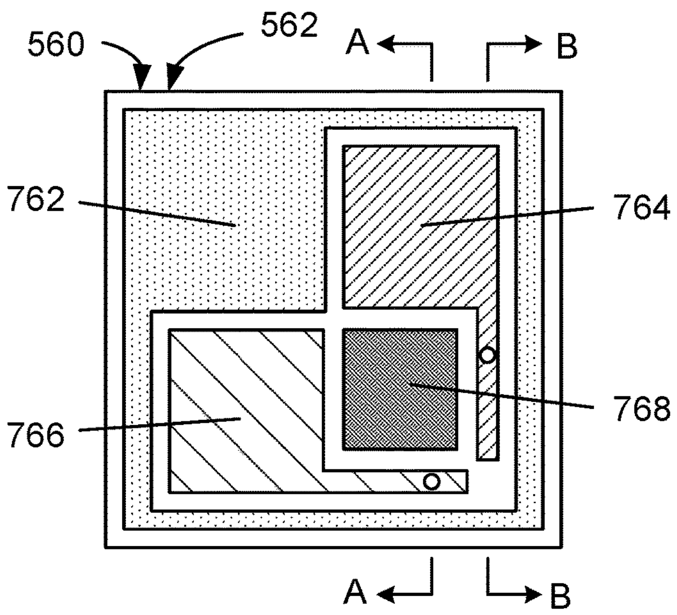
FIG. 7 includes an illustration of a top down view of a die chuck of the die head of FIG. 5, where the top down view is seen along the sectioning line 7-7 in FIG. 5.

FIG. 7 includes a top down view of the die chuck 560 along sectioning line 7-7 in FIG. 5. The die chuck 560 can include a chucking vacuum receiving zone 762, a die vacuum receiving zone 764, a die modulation receiving zone 766, and an auxiliary zone 768. Lands can include portions of the main body 562 that are between the zones 762, 764, 766, and 768 and between the outer peripheral edge of the main body 562 and the zone 762. Each of the zones 762, 764, 766, and 768 may or may not include a land or pin within such zone. Any of or all lands and, if present, the pins can contact the mounting plate 550 when coupled to the mounting plate 550. Each of the zones 762, 764, and 766 are recesses within the main body 562 of the die chuck 560. Each of the zones 764 and 766 can have a relatively large rectangular portion and a relatively narrow and long portion. The significance of the portions are described when addressing evacuating or pressurizing the zones when the die chuck is at different positions. The auxiliary zone 768 is addressed later in this specification.

Figure 8:
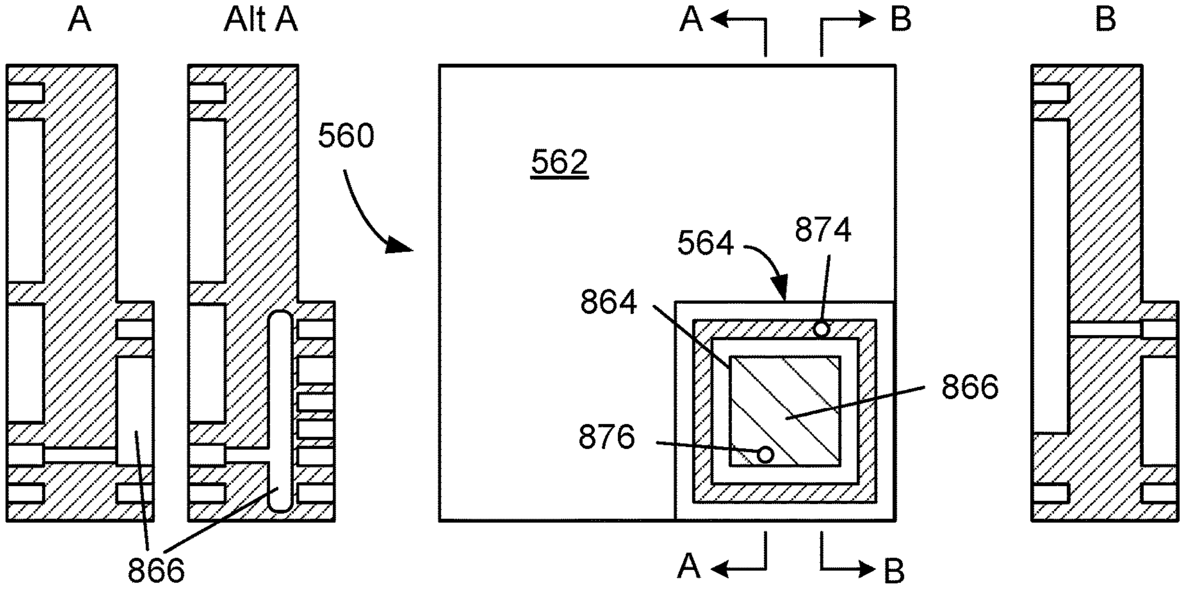
FIG. 8 includes illustrations of a bottom and cross-sectional views of the die chuck of FIG. 5.

FIG. 8 includes a bottom view of the die chuck 560 as it would be seen by the base 140 or a component coupled to the base 140. The die holding region 564 extends from the main body 562 of the die chuck 560. The die holding region 564 includes a die vacuum zone 864 and a die modulation zone 866 that are recesses within the die holding region 564. Lands are between the zones 864 and 866 and between the peripheral edge of the die holding region 564 and the zone 864. Each of the zones 864 and 866 may or may not include a land or pin within such zone. Any of or all lands and, if present, the pins can contact when the die is coupled to the die holding region. In subsequent illustrations, the lands within the die holding region 564 are not illustrated to simplify understanding the design and use of the system 100. In another implementation, the die holding region 564 can be a Bernoulli chuck or another contactless chuck.

FIG. 8 includes a view A along sectioning line A-A as illustrated in FIGS. 7 and 8 through channel 876 showing how the channel 876 connects the die modulation receiving zone 766 with the die modulation zone 866. FIG. 8 includes a view Alt A along sectioning line A-A as illustrated in FIGS. 7 to 8 through the channel 876 showing how the channel 876 connects the die modulation receiving zone 766 with the die modulation zone 866 within the die chuck 560 in an alternative implementation. FIG. 8 includes a view B along sectioning line B-B as illustrated in FIGS. 7 and 8 through the channel 874 showing how the channel 874 connects the die vacuum zone 864 and the vacuum receiving zone 764. The description below is based on the die holding region 564 as illustrated in the figures.

Figure 9:
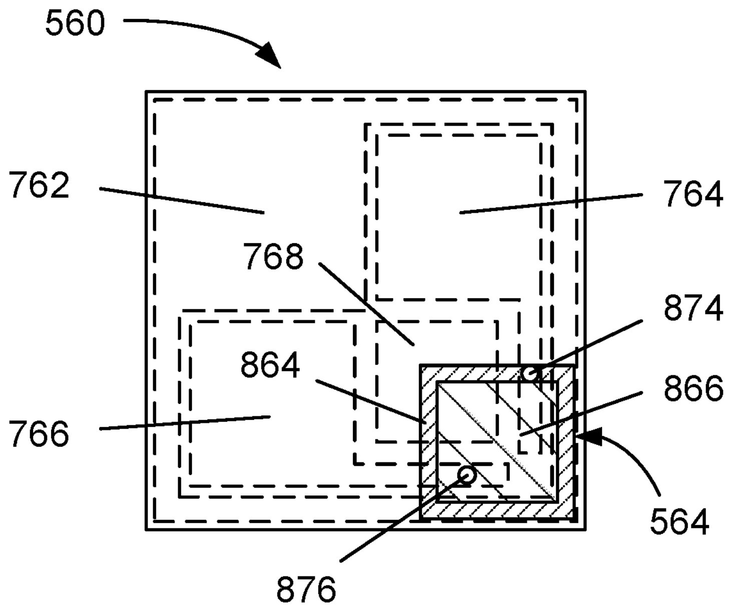
FIG. 9 includes an illustration of a bottom view of the die chuck of FIG. 5 illustrating positional relationships for fluidic couplings between zones and the die holding region of the die chuck.

FIG. 9 is a bottom view of the die chuck 560 along the distal side of the die chuck 560 and further includes features (illustrated with dashed lines) along the proximal side of the die chuck 560. A channel 874 is disposed between and fluidically couples the die vacuum zone 864 and the vacuum receiving zone 764 together. A channel 876 is disposed between and fluidically couples the die modulation zone 866 and the die modulation receiving zone 766 together. In a particular implementation, the channels 874 and 876 can directly underlie the narrow and long portions of the zones 764 and 766, respectively.

Figure 10:
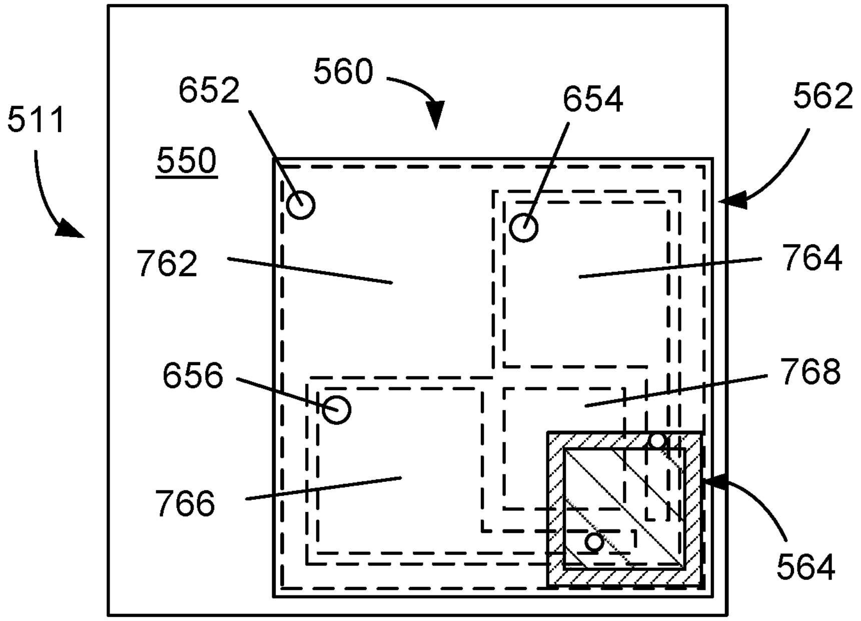
FIG. 10 includes an illustration of a bottom view of the mounting plate and die chuck when the die chuck is at a position relative to the mounting plate.
Figure 11:
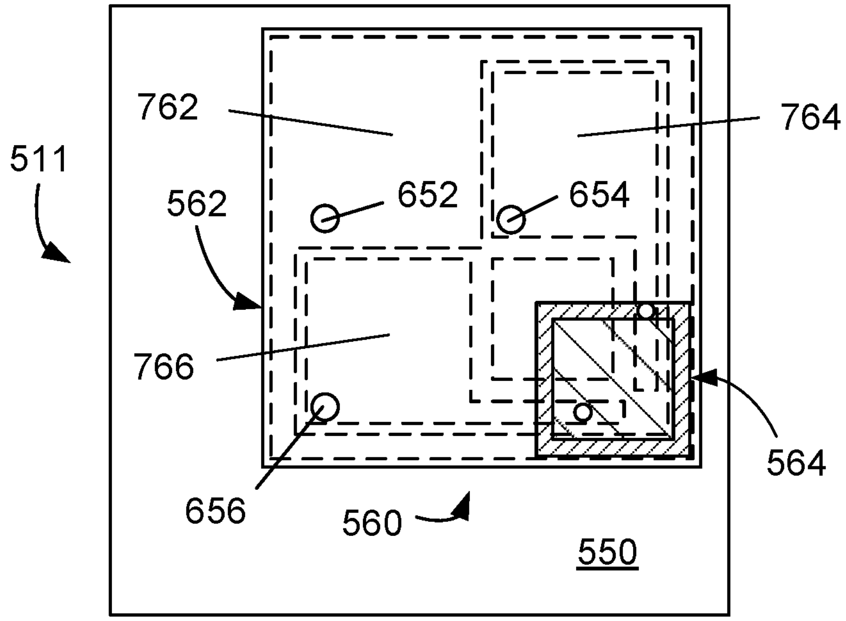
FIG. 11 includes an illustration of a bottom view of the mounting plate and die chuck when the die chuck is at another position relative to the mounting plate.
Figure 12:
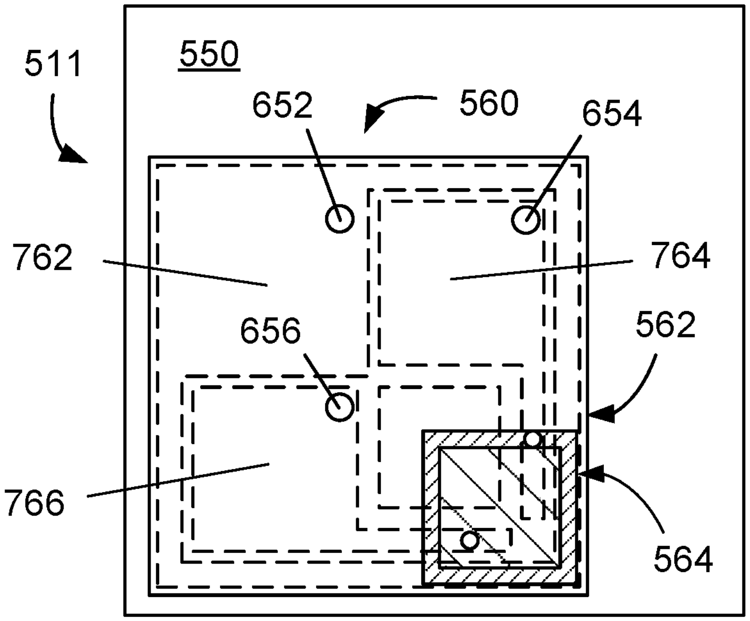
FIG. 12 includes an illustration of a bottom view of the mounting plate and die chuck when the die chuck is at still another position relative to the mounting plate.

FIG. 10 includes a bottom view of the die head 511 including the mounting plate 550 and the die chuck 560. A part of the device head 540 may or may not be visible along the peripheral edges of the mounting plate 550. Such part of the device head 540 is not illustrated in FIG. 10 to simplify understanding of the relationships between the mounting plate 550 and the die chuck 560.

The mounting plate 550 includes the channels 652, 654, and 656. The channels 652, 654, and 656 are not seen from the bottom view but are illustrated with solid lines to illustrate better their positional relationships to the zones 762, 764, and 766, respectively. The die chuck 560 includes the main body 562 and the die holding region 564. The main body 562 includes the zones 762, 764, 766, and 768 that are disposed along the proximal side of the die chuck 560. The zones 762, 764, 766, and 768 are not seen from the bottom view and are illustrated with dashed lines. The die holding region 564 can be on the distal side of the die chuck 560.

The zone 762 of the die chuck 560 is in fluid communication with the channel 652 of the mounting plate 550. A vacuum line (not illustrated) can be routed through the device head 540 and coupled to the channel 652. When the vacuum line is evacuated by a vacuum source, the channel 652 and the zone 762 become evacuated and can hold the die chuck 560 in place with respect to the mounting plate 550. The zone 764 of the die chuck is in fluid communication with the channel 654 of the mounting plate. Another vacuum line (not illustrated) can be routed through the device head 540 and coupled to the channel 654. When the vacuum line is evacuated by a vacuum source, the channel 654, the zone 764, the channel 874, and the die vacuum zone 864 become evacuated and can hold a die to the die holding region 564. The zone 766 of the die chuck 560 is in fluid communication with the channel 656 of the mounting plate 550. A pressure line (not illustrated) can be routed through the device head 540 and coupled to the channel 656. When the pressure line is pressurized with a fluid, the channel 656, the zone 766, the channel 876, and the die modulation zone 866 become pressurized and can allow a die held by the die holding region 562 to bow away from the die holding region 564. The fluid can be a liquid or a gas. The gas can be air, such as clean dry air (CDA), or a relatively inert gas, such as $N_2$, $CO_2$, or a noble gas, such as Ar or He.

FIGS. 10 to 13 illustrate different positions for the die chuck 560 with respect to the mounting plate 550. The die chuck 560 can be at its closest position to the lower right corner of the mounting plate 550 in FIG. 10. The die chuck 560 can be at its closest position to the upper right corner of the mounting plate 550 in FIG. 11. The die chuck 560 can be at its closest position to the lower left corner of the mounting plate 550 in FIG. 12. The die chuck 560 can be at its closest position to the upper left corner of the mounting plate 550 in FIG. 13. FIGS. 10 to 13 may or may not represent the full range of positions for the die chuck 560. In FIGS. 10 to 13, the channel 652 remains in fluid communication with the zone 762, the channel 654 remains in fluid communication with the zone 764, the channel 656 remains in fluid communication with the zone 766. The range of positions for the die chuck 560 in the X-direction and Y-direction can be at or near the X-direction and Y-direction dimensions of any of the relatively large rectangular portions (excludes the relatively narrow and long portions) of the zones 762, 764, and 766. Referring to FIGS. 5 and 10 to 13, the center of the die holding region 564 may or may not lie along the centerline 526. In the particular implementations illustrated, the center of the die holding region 564 does not lie along the centerline 526 for the full range of positions for the die chuck 560 with respect to the mounting plate 550.

Referring to FIGS. 5 and 7, the auxiliary zone 768 may be in one of a few different forms. The mass of the die chuck 560 can be less than half the mass of the device head 540. In another implementation, the die chuck 560 can be at most 40%, 30%, or 20% of the mass of the device head 540. As the mass of the die chuck 560 decreases, less force is needed to hold the die chuck 560 in place relative to the mounting plate 550. The zone 768 may be recessed into main body 562 of the die chuck 560 similar to the zones 762, 764, and 766 to further reduce the mass of the die chuck 560. The zone 768 may or may not be coupled to any one or more of the zones 762, 764, and 766 along the proximal side of the die chuck 560. In a particular implementation, the zone 768 can be fluidically coupled to the zone 762 to allow more area to be evacuated when holding the die chuck 560 to the mounting plate 550. In FIG. 7, a portion of the land between the zones 762 and 768 may not be present to achieve such fluidic coupling. In another implementation, the zone 768 may not be recessed and is part of the land between the zones 766 and 764. This implementation may be easier to manufacture as compared to the zone 768 being recessed within the main body 562. After reading this specification, skilled artisans can select a design for the auxiliary zone 768 to meet the needs or desires for a particular application.

Figure 14:
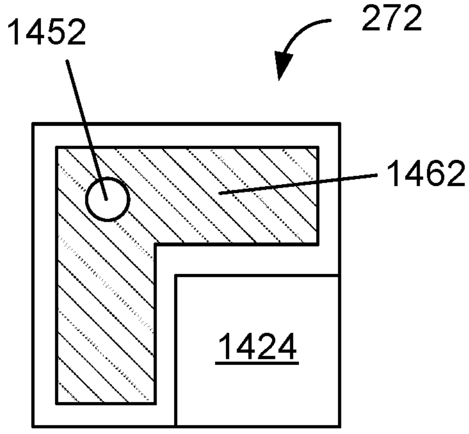
FIG. 14 includes an illustration of a top view of the docking station in FIGS. 2 and 4.
Figure 15:
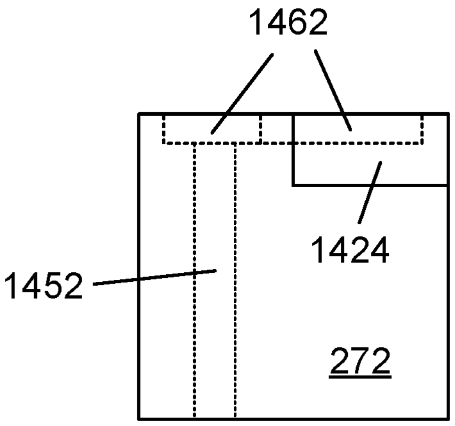
FIG. 15 includes an illustration of a side view of the docking station of FIG. 14.

The docking station 272 can be used in moving the die chuck 560 to a different position with respect to the mounting plate 550. FIGS. 14 and 15 includes a top view and a side view of the docking station 272. A chucking vacuum receiving zone 1462 can be a recession within the docking station 272 along a distal side of the docking station 272. A channel 1452 is fluidically coupled to the zone 1462. A vacuum line (not illustrated) can be routed through the carriage 146 and coupled to the channel 1452. As illustrated in FIG. 14, a land surrounds the zone 1462. A die chuck can contact the land when the die chuck is held by the docking station 272. The zone 1462 may or may not include a land or pin within such zone. Any of or all lands and, if present, the pins can contact the mounting plate 550 when coupled to the mounting plate 550.

A recession 1424 allows the docking station 272 to hold a die chuck, such as the die chuck 560 without contacting a die holding region of the die chuck, such as the die holding region 564 of the die chuck 560. The recession 1424 is not required or may have a depth such that the die holding region contacts the die chuck. For a die chuck having its distal side along a single plane, the recession 1424 may not be present and the zone 1462 may or may not be expanded to occupy at least some of the area of the docking station 272 that would otherwise be occupied by the recession 1424.

Figure 13:
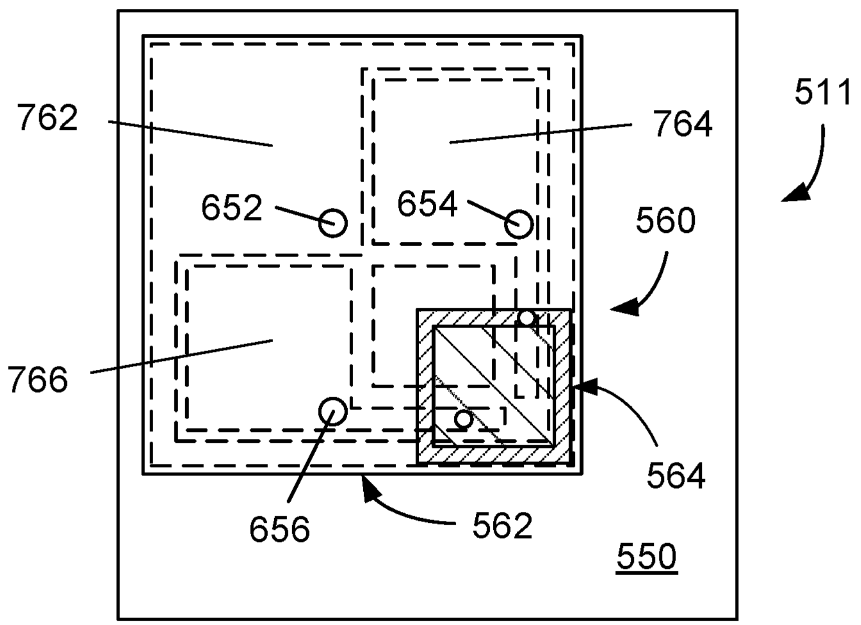
FIG. 13 includes an illustration of a bottom view of the mounting plate and die chuck when the die chuck is at a further position relative to the mounting plate.

Each of the device head 540 and the docking station 272 can be coupled to a die chuck, such as the die chuck 560, using a vacuum-based coupler. Referring to FIGS. 13 to 15, a vacuum source can be coupled to the zone 762 of the die chuck 560 and to the zone 1452 of the docking station 272. The system 100 can have a common vacuum source for the zone 762 and the zone 1452 or different vacuum sources for the zones 762 and 1462. A vacuum line can be routed through the bridge 120 and the device head 540 to the channel 652 that is fluidically coupled to the zone 762 of the die chuck 524. Another vacuum line can be routed through the base 140 and the carriage 146 to the channel 1452 that is fluidically coupled to the zone 1462 of the docking station 272.

Each of the vacuum lines can include one or more components along the vacuum line. A pressure regulator, a pressure control valve, or both may or may not be used. Each of the pressure regulator or a pressure control valve can limit how much vacuum can be drawn within the zone coupled to the corresponding vacuum line. The pressure regulator, a pressure control valve, or both may be controlled by the controller 160, a local controller, or manually by a human operator.

Each vacuum line within the system 100 can have a coupling control valve that can be disposed between a corresponding zone and the vacuum source. The coupling control valve can be controlled by a controller 160 or a local controller. The coupling control valve can be activated by a signal from the controller 160 or a local controller so that the corresponding vacuum source is fluidically connected to the corresponding zone. The coupling control valve can be deactivated by a signal from the controller 160 or a local controller so that the vacuum source is not fluidically connected to the corresponding zone.

In a particular implementation, the coupling control valve can be a three-way valve that can also be coupled to atmosphere or a pressurized gas source via a gas line. When a pressurized gas source is used (as opposed to atmosphere) within the system 100, a pressure regulator, a pressure control valve, or both may or may not be used. Each of the pressure regulator and a pressure control valve can limit the pressure of the gas that is supplied to the coupling control valve. At the time of or after deactivating the coupling control valve with respect to the vacuum source, the control value can fluidically connect atmosphere or the pressurized gas with the zone to backfill the zone so that the die chuck 560 can be removed. In another implementation, another coupling control valve can be coupled between the zone and atmosphere or the pressurized gas. The other coupling control valve can be activated when the zone is being backfilled and be deactivated before the coupling control valve coupled to the vacuum source is activated. The other coupling control valve for backfilling can be coupled to the controller 160 or a local controller and operated in a similar manner as the coupling control valve coupled to the vacuum source.

In a further implementation, the vacuum coupling with respect to the device head 540 and the die chuck 560 can be replaced with electrostatic coupling, electromagnetic coupling, or mechanical coupling. After reading this specification, skilled artisans will be able to design die heads for a particular type of coupling that meets the needs or desires for a particular application.

For an electrostatic coupler, an electrical circuit can be within the device head 540 or the mounting plate 550. The electrical circuit can be activated when the electrical circuit is turned on and deactivated when the electrical circuit is turned off. In another implementation, electromagnetic material can be in the die chuck 560, and the electrical circuit can be in the device head 540 or the mounting plate 550. The magnetic force from the electromagnetic material in the die chuck 560 is sufficient to hold the die chuck 560 in position. Thus, coupling can occur by activating the electrical circuit, and decoupling can occur by deactivating the electrical circuit that is controlled by the controller 160 or a local controller. An electrostatic or electromagnetic coupler for the docking station 272 can be configured and operate substantially as described with respect to the electrostatic or electromagnetic coupler for the die head 511.

For a mechanical coupler, a hook, a clip, a pair of projections or the like can be used to hold the device head 540 or the mounting plate 550 and a die chuck 560 in position relative to each other. The mechanical coupler can be manually set or activated by an electrical circuit that is within the device head 540 or the mounting plate 550. For the electrical circuit, coupling can occur by activating the electrical circuit, and decoupling can occur by deactivating the electrical circuit, and such activation/deactivation can be controlled by the controller 160 or a local controller. A mechanical coupler for the docking station 272 can be configured and operate substantially as described with respect to the mechanical coupler for the die head 511.

Figure 16:
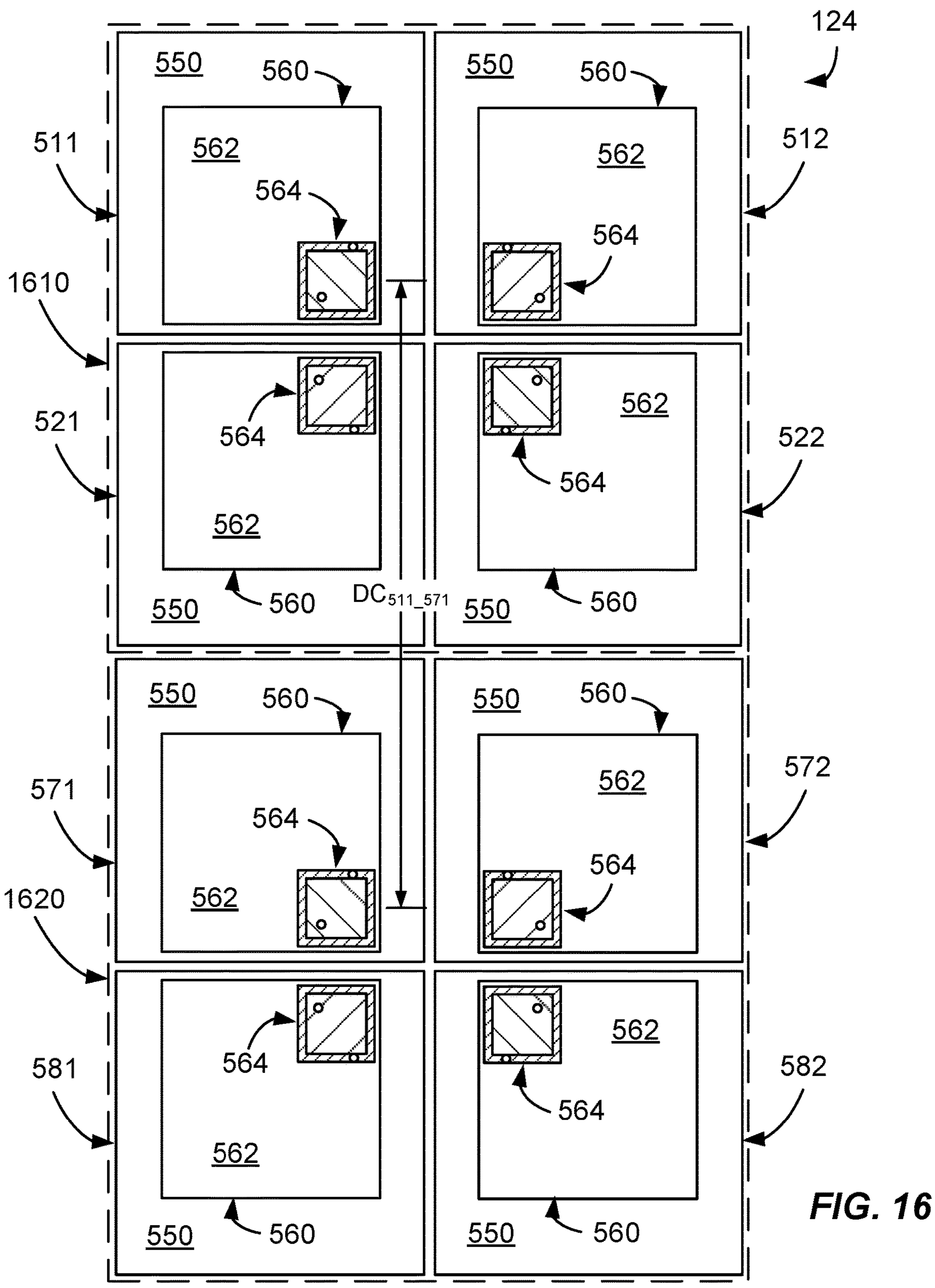
FIG. 16 includes an illustration of a bottom view of a portion of an array of bonding heads of the apparatus in FIG. 3.
Figure 17:
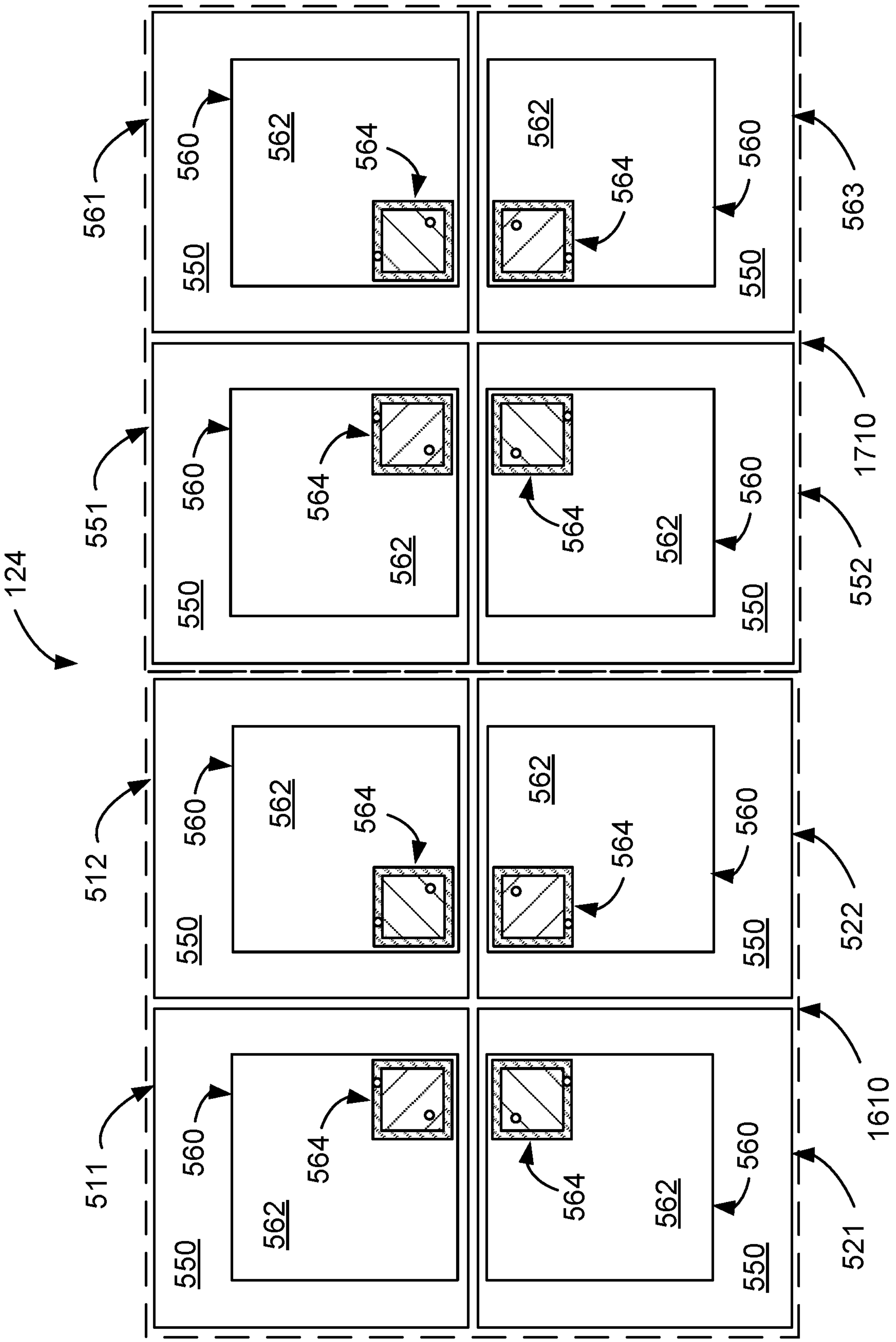
FIG. 17 includes an illustration of a bottom view of another portion of an array of bonding heads of the apparatus in FIG. 3.

FIGS. 16 and 17 include bottom views of portions of the array of bonding heads 124 that includes the bonding head 511 and other bonding heads 512, 521, 522, 551, 552, 561, 563, 571, 572, 581, and 582. The construction of the other heads 512, 521, 522, 551, 552, 561, 563, 571, 572, 581, and 582 is substantially the same as the bonding head 511.

The array of bonding heads 124 can be organized into groups, such as cells, where a cell 1610 (FIGS. 16 and 17) is made up of the bonding heads 511, 512, 521, and 522, a cell 1620 (FIG. 16) is made up of the bonding heads 571, 572, 581, and 582, and a cell 1710 (FIG. 17) is made up of the bonding heads 551, 552, 561, and 563. The cells 1610, 1620, and 1710 are illustrated with dashed lines. The cells 1610, 1620, and 1710 may or may not be identical to one another. The array of bonding heads 124 can include more or fewer cells. The cell 1610 can be an immediately adjacent cell and above the cell 1620 (in the Y-direction) and an immediately adjacent cell to the left of the cell 1710 (in the X-direction).

The bonding head 511 in the cell 1610, the bonding head 571 in the cell 1620, and the bonding head 551 in the cell 1710 can be identical to one another. The bonding head 512 in the cell 1610, the bonding head 572 in the cell 1620, and the bonding head 552 in the cell 1710 can be identical to one another. The bonding head 521 in the cell 1610, the bonding head 581 in the cell 1620, and the bonding head 561 in the cell 1710 can be identical to one another. The bonding head 522 in the cell 1610, the bonding head 582 in the cell 1620, and the bonding head 563 in the cell 1710 can be identical to one another.

The design of the bonding heads 512 and 521 can be mirror images of the bonding head 511, and the design of the bonding head 522 can be a mirror image of either or both bonding heads 512 and 521. The bonding heads 552 and 561 can be mirror images of the bonding head 551, and the bonding head 563 can be a mirror image of either or both bonding heads 552 and 561. The bonding heads 572 and 581 can be mirror images of the bonding head 571, and the bonding head 582 can be a mirror image of either or both bonding heads 572 and 581.

The bonding heads 512, 521, 522, 551, 552, 561, 563, 571, 572, 581, and 582 can have channels 652, 654, and 656 and zones 762, 764, 766, and 768 as previously described with respect to the bonding head 511. The evacuation and pressurization of the channels 652, 654, and 656 and zones 762, 764, 766 for the bonding heads 512, 521, 522, 551, 552, 561, 563, 571, 572, 581, and 582 may or may not be the same as previously described with respect to the bonding head 511.

The destination site pitch for a destination substrate can include an X-direction pitch and a Y-direction pitch. The X-direction pitch and the Y-direction pitch of the die holding regions 564 within the cell 1610 can be the same as or within an allowable tolerances of the X-direction pitch and the Y-direction pitch of the die holding regions 564 within the cell 1620 and the cell 1710. As will be described in a method later in this specification, the die chucks 560 can be positioned so that the pitch of the die holding regions 564 with the cell 1610, the cell 1620, the cell 1710 or any combination of the cells 1610, 1620, and 1710 are the same as or within an allowable tolerance of an integer multiple of the destination site pitch. The integer can be 1, 2, 3, 4, or another value and may depend on the size and number of bonding heads within the array of bonding heads 124. The allowable tolerance can be +/−10% of the pitch of the destination sites, including the X-direction pitch and the Y-direction pitch.

The die holding regions 564 in the one cell can be spaced apart from the die holding region 564 in an immediately adjacent cell. The distance between the die holding regions 564 in the immediately adjacent cells can be an integer multiple of the X-direction pitch or the Y-direction pitch for the destination sites or within an allowable tolerance. The allowable tolerance can be +/−0.10% of the X-direction pitch, the Y-direction pitch, or both X-direction and Y-direction pitches of the destination sites.

For example, the destination substrate can have destination sites along rows (in the X-direction in FIG. 16) that include Rows 1 to 8. The cell 1610 can be used to bond source dies to destination sites in Rows 1 and 2, and the cell 1620 can be used to bond source dies to destination sites in Rows 7 and 8. A portion of the destination substrate can lie between the die holding regions 564 for the cells 1610 and 1620 and correspond to Rows 3 to 6 of the destination substrate. Source dies coupled to the die holding regions 564 of the cells 1610 and 1620 can be bonded to the destination sites in Rows 1, 2, 7, and 8 without having to move the carriage 146 to a different position. For this particular example, the integer multiple is 3.

$DC_{511\_571}=5\times YP_{DS}$, where:

$DC_{511\_571}$ is the distance between the centers of the die holding regions 564 for the bonding heads 511 and 571, and $YP_{DS}$ is the Y-direction pitch for the destination sites of the destination substrate.

When the Y-direction pitch for the destination sites is 20 mm, the distance between the centers of the die holding regions 564 for the bonding heads 511 and 571 is 100 mm. In practice, slight differences can be attributed to the equipment or repeatability of a manufacturing process. An allowable tolerance can be +/−0.1% of $YP_{DS}$. The allowable tolerance may depend on the size of the contact pads, overlay requirement in connecting these contacts, and the positioning range of a device head positioning system that moves the die chucks. Thus, the distance between the centers of the die holding regions 564 for the bonding heads 511 and 571 is 100 mm+/−0.05 mm. The relationship can be the same for the other corresponding pairs of bonding heads in the cells 1610 and 1620. The distance between the centers of the die holding regions 564 for the bonding heads 512 and 572 is 100 mm+/−0.05 mm, the distance between the centers of the die holding regions 564 for the bonding heads 521 and 581 is 100 mm+/−0.05 mm, and the distance between the centers of the die holding regions 564 for the bonding heads 522 and 582 is 100 mm+/−0.05 mm. The allowable tolerance may be less than +/−10% of $YP_{DS}$ in view of another consideration, and the allowable tolerance may be +/−5% of $YP_{DS}$, +/−2% of $YP_{DS}$, or +/−10% of $YP_{DS}$. The allowable tolerance for the die chuck placement accuracy can be determined by the lateral positioning range of the device head positioning system. For e.g., if the device head positioning stage has a travel range of +/−50 μm, +/−100 μm, +/−200 μm, +/−500 μm, the tolerance requirement for the die chuck placement should be no more than 50% or more than 75% of the travel range.

The same principles can be applied with respect to the X-direction. For example, the destination substrate can have destination sites along rows (in the X-direction in FIG. 17)

that include Columns 1 to 6. The cell 1610 can be used to bond source dies to destination sites in Columns 1 and 2, and the cell 1710 can be used to bond source dies to destination sites in Columns 5 and 6. A portion of the destination substrate can lie between the die holding regions 564 for the cells 1610 and 1710 and correspond to Columns 3 and 4 of the destination substrate. Source dies coupled to the die holding regions 564 of the cells 1610 and 1710 can be bonded to the destination sites in Columns 1, 2, 5, and 6 without having to move the carriage 146 to a different position. For this particular example, the integer multiple is 2.

$DC_{511\_551=2} \times XP_{DS}$, where:

$DC_{511\_551}$ is the distance between the centers of the die holding regions 564 for the bonding heads 511 and 551, and $XP_{DS}$ is the X-direction pitch for the destination sites of the destination substrate.

When the X-direction pitch for the destination sites is 15 mm, the distance between the centers of the die holding regions 564 for the bonding heads 511 and 551 is 30 mm. In practice, slight differences can be attributed to the equipment or repeatability of a manufacturing process. An allowable tolerance can be +/−0.10% of $XP_{DS}$. Thus, the distance between the centers of the die holding regions 564 for the bonding heads 511 and 551 is 30 mm+/−0.05 mm. The relationship can be the same for the other corresponding pairs of bonding heads in the cells 1610 and 1710. The distance between the centers of the die holding regions 564 for the bonding heads 512 and 552 is 30 mm+/−0.05 mm, the distance between the centers of the die holding regions 564 for the bonding heads 521 and 561 is 30 mm+/−0.05 mm, and the distance between the centers of the die holding regions 564 for the bonding heads 522 and 562 is 30 mm+/−0.05 m. Similar to $YP_{DS}$, the allowable tolerance may be less than +/−0.1% of $XP_{DS}$ in view of another consideration, and the allowable tolerance may be +/−5% of $XP_{DS}$, +/−2% of $XP_{DS}$, or +/−10% of $XP_{DS}$. As previously described, the size of contact pads for the source dies, the destination sites or both may be as small as 4 μm. The allowable tolerance may be +/−2 μm to ensure sufficient physical contact between the contact pads for the source dies and the destination sites. When the each of the bonding heads has a positioning stage, the tolerance may be relaxed up to 50% or up to 75% of the range of the positioning heads.

Figure 18:
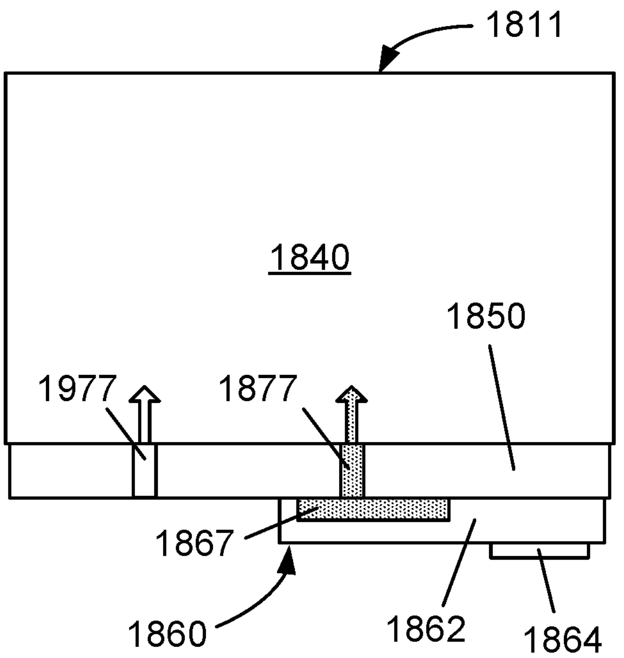
FIG. 18 includes an illustration of a cross-sectional view of a die head in accordance with an alternative implementation.

More than one channel can be coupled to a zone within a die chuck. FIG. 18 includes a cross-sectional view of a die head 1811 that includes a device head 1840, a mounting plate 1850, and a die chuck 1860. The device head 1840 and mounting plate 1850 can have any of the designs as previously described with respect to the device head 540 and mounting plate 550 except that the mounting plate 1850 has more than one channel for holding the die chuck 1860, and the device head 1840 is modified to support more than one channel that can couple to a particular zone within the die chuck 1860. In particular, the mounting plate 1850 includes channels 1877 and 1977 that perform the same function as the channel 652 as illustrated and described with respect to FIG. 6. The arrows above the channels 1877 and 1977 represent couplings within the device head that couple the channels 1877 and 1977 to a vacuum source. The die chuck 1860 can include a main body 1862 and a die holding region 1864. The main body 1862 includes a chucking vacuum receiving zone 1867 that performs the same function as the chucking vacuum receiving zone 762 in FIG. 7. The die chuck 1860 can have a smaller dimension in the X-direction, Y-direction, or both directions as compared to the die chuck 560 as previously described.

When the die chuck 1860 is in the position as illustrated in FIG. 18, the zone 1867 can be coupled to the vacuum source via the channel 1877. When a control coupling valve coupled to the channel 1877 is activated, the channel 1877 and the zone 1867 are evacuated (illustrated with shading), and the die chuck 1860 is held in position by a vacuum that as illustrated by the shaded arrow above the channel 1877. Another control coupling valve is coupled to the channel 1977. The control coupling valve associated with the channel 1977 is deactivated. Thus, the channel 1977 (illustrated without shading) is at atmospheric pressure and its corresponding arrow is clear (no shading).

Figure 19:
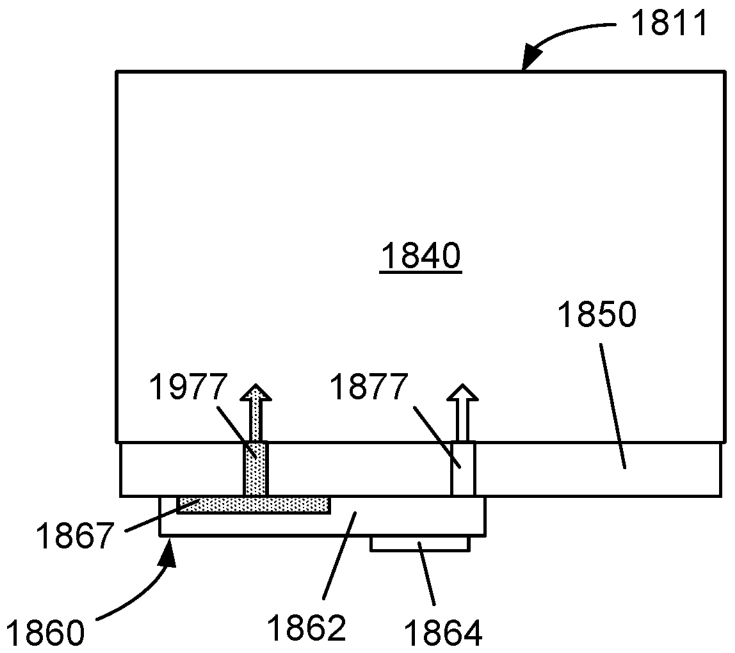
FIG. 19 includes an illustration of a cross-sectional view of the die head of FIG. 18 after moving a die chuck.

The die chuck 1860 can be moved toward the left-hand side of FIG. 19. The control coupling valve associated with the channel 1877 can be deactivated, the die chuck 1860 can be moved, and the control coupling valve associated with the channel 1977 can be activated. The channel 1977 and the zone 1867 are evacuated (illustrated with shading), and the die chuck 1860 is held in position by a vacuum that as illustrated by the shaded arrow above the channel 1977. The channel 1877 (illustrated without shading) is at atmospheric pressure and its corresponding arrow is clear (no shading).

Figure 20:
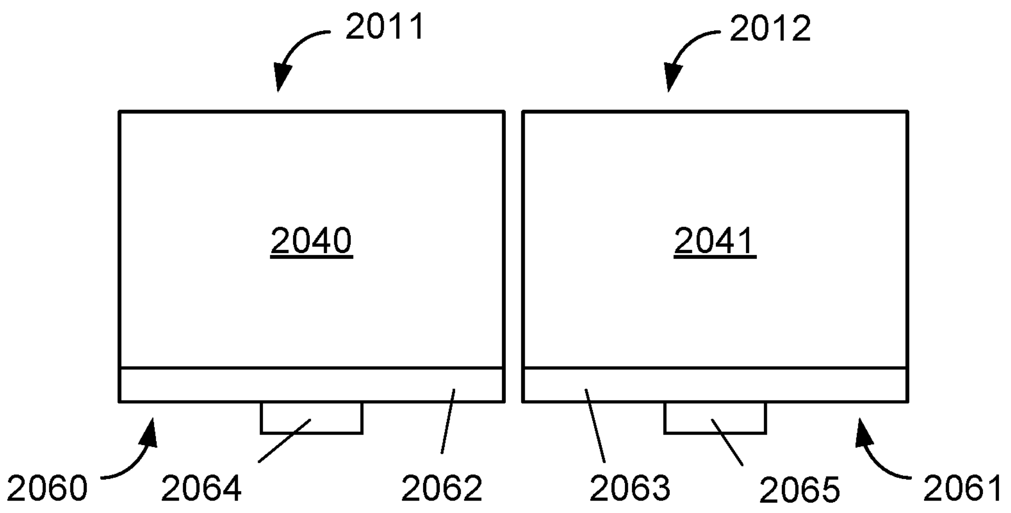
FIG. 20 includes an illustration of a side view of bonding heads in accordance with an alternative implementation.
Figure 21:
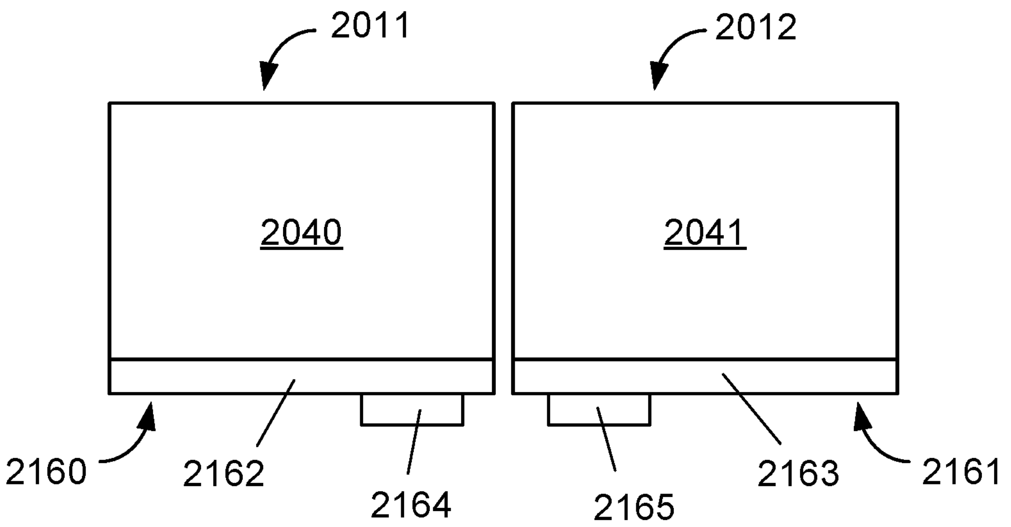
FIG. 21 includes an illustration of a side view of the bonding heads of FIG. 20 after replacing a set of die chucks.

FIGS. 20 and 21 illustrate an alternative implementation in which die chucks can be replaced to achieve a different pitch for the die holding regions. FIG. 20 includes a side view of die heads 2011 and 2012. The die head 2011 includes a device head 2040 that is coupled to the bridge 120 (not illustrated in FIGS. 20 and 21). A die chuck 2060 is coupled to the device head 2040 and includes a main body 2062 and a die holding region 2064. A mounting plate may or may not be disposed between any device head and the main body of its corresponding die chuck. The die head 2012 includes a device head 2041 that is coupled to the bridge 120. A die chuck 2061 is coupled to the device head 2041 and includes a main body 2063 and a die holding region 2065.

FIG. 21 includes a side view of the die heads 2011 and 2012 after replacing the die chucks 2060 and 2061 with die chucks 2160 and 2161. The die chuck 2160 is coupled to the device head 2040 and includes a main body 2162 and a die holding region 2164. The die head 2012 includes the device head 2041 that is coupled to the bridge 120. The die chuck 2161 is coupled to the device head 2041 and includes a main body 2163 and a die holding region 2165. Other die heads may also be present but are not illustrated. The die chucks 2060, 2061, 2160, and 2161 can be vacuum-coupled, electrostatically coupled, or electromagnetically coupled to the die bodies 2040 and 2041.

Referring to FIG. 20, the die heads 2011 and 2012 can have die chucks 2060 and 2061 having die holding regions 2064 and 2065 at an X-direction pitch and a Y-direction pitch that is used for destination sites of a destination substrate. Referring to FIG. 21, the die heads 2011 and 2012 can have die holding regions 2164 and 2165 at a different X-direction pitch and a different Y-direction pitch that is used for destination sites of a different destination substrate. Thus, the X-direction pitch, the Y-direction pitch, or both the X-direction and Y-direction pitches can be changed by replacing the die chucks.

Figure 22:
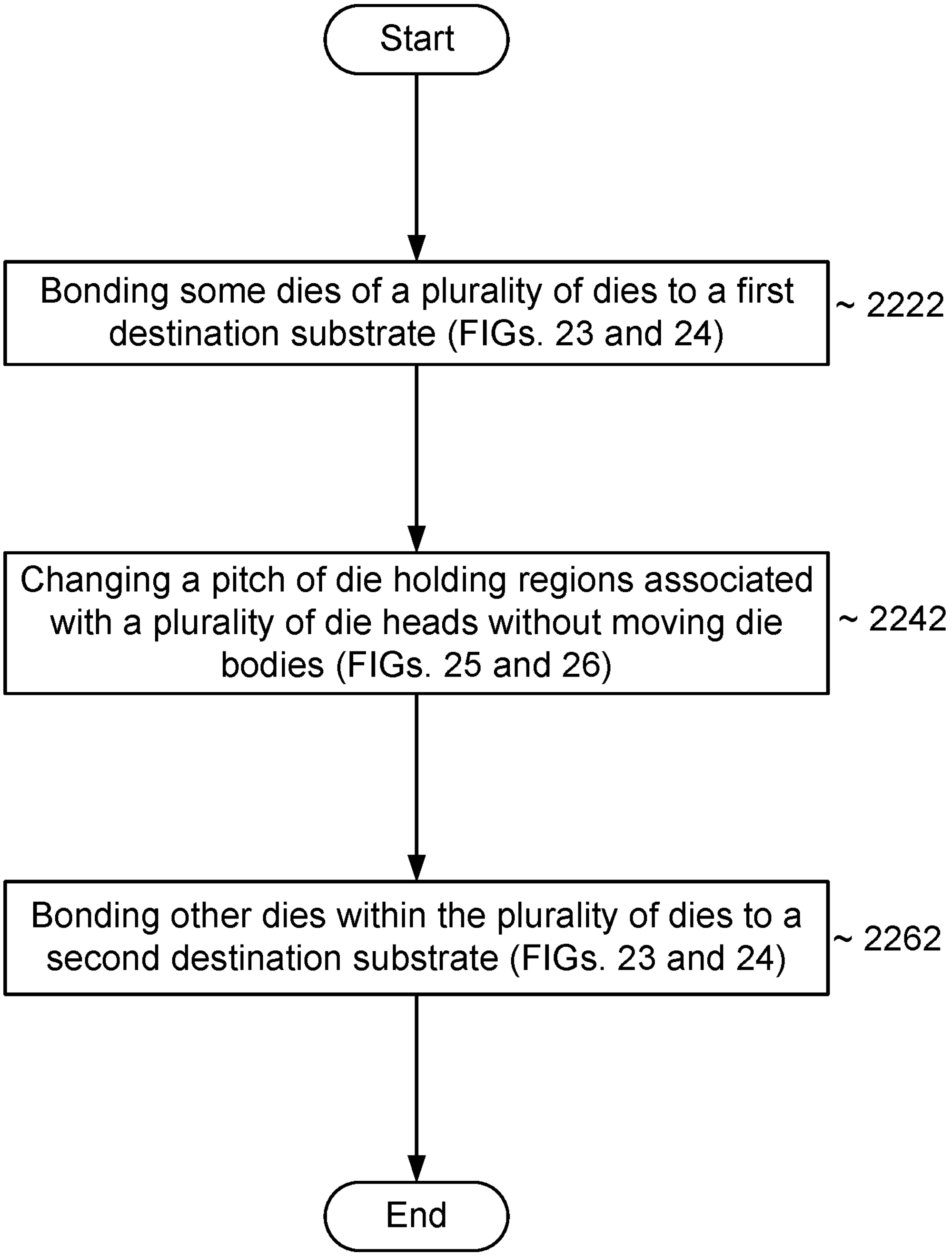
FIG. 22 includes a high-level process flow diagram for a method of bonding some dies to a destination substrate, changing a pitch of die holding regions, and bonding other dies to another destination substrate.
Figure 23:
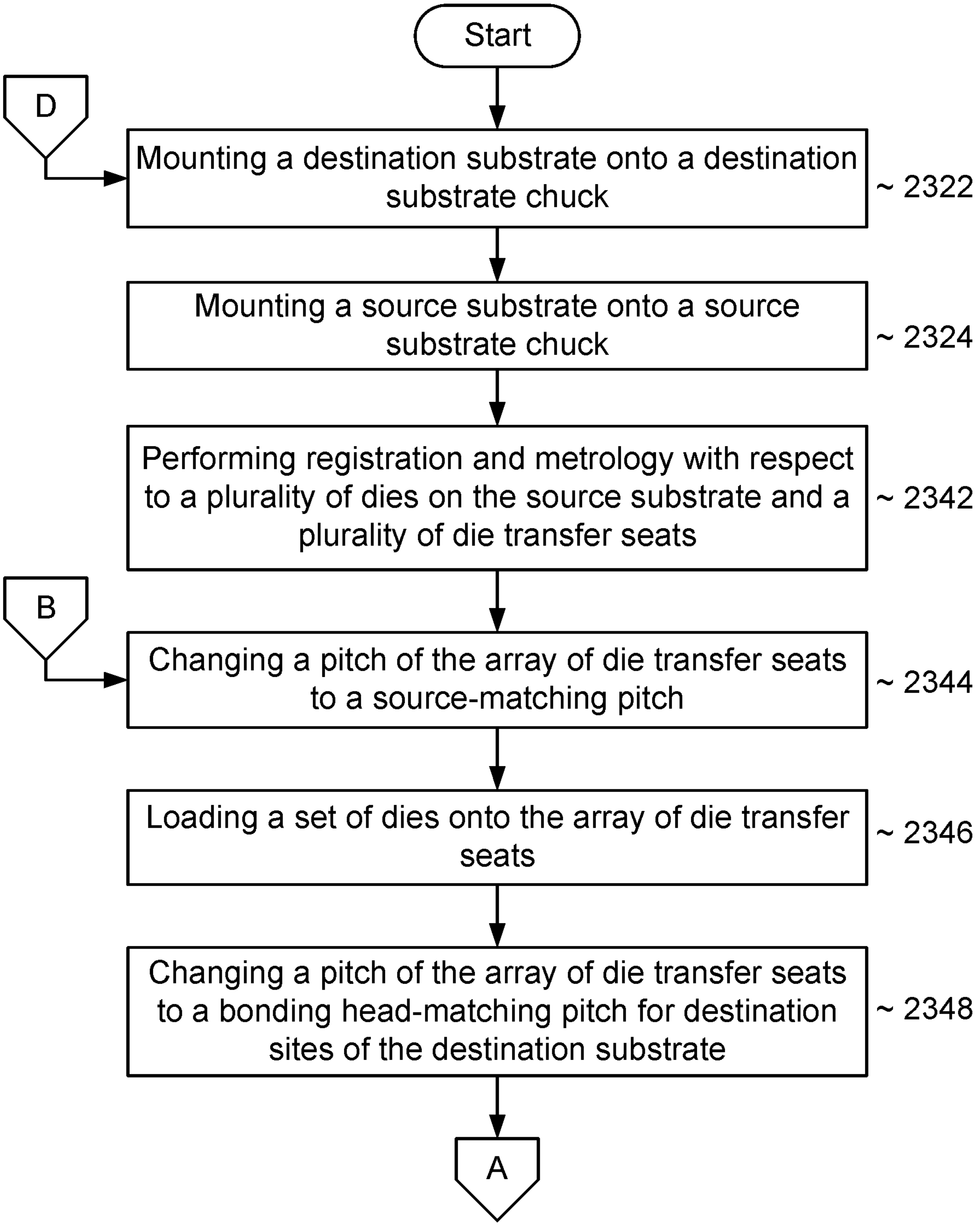
FIGS. 23 to 26 includes a detailed process flow diagram for carrying out the method in FIG. 22.
Figure 24:
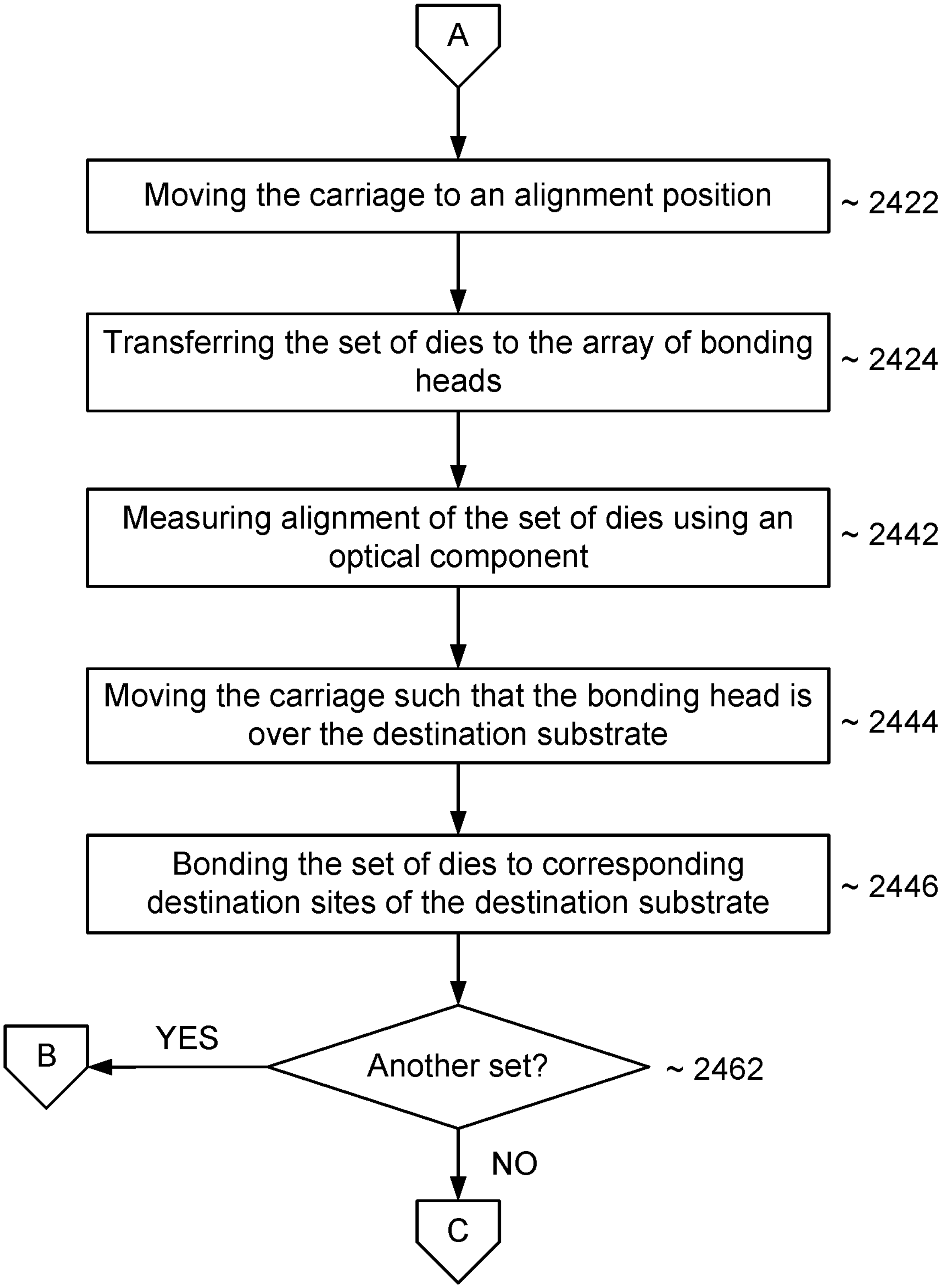
Figure 25:
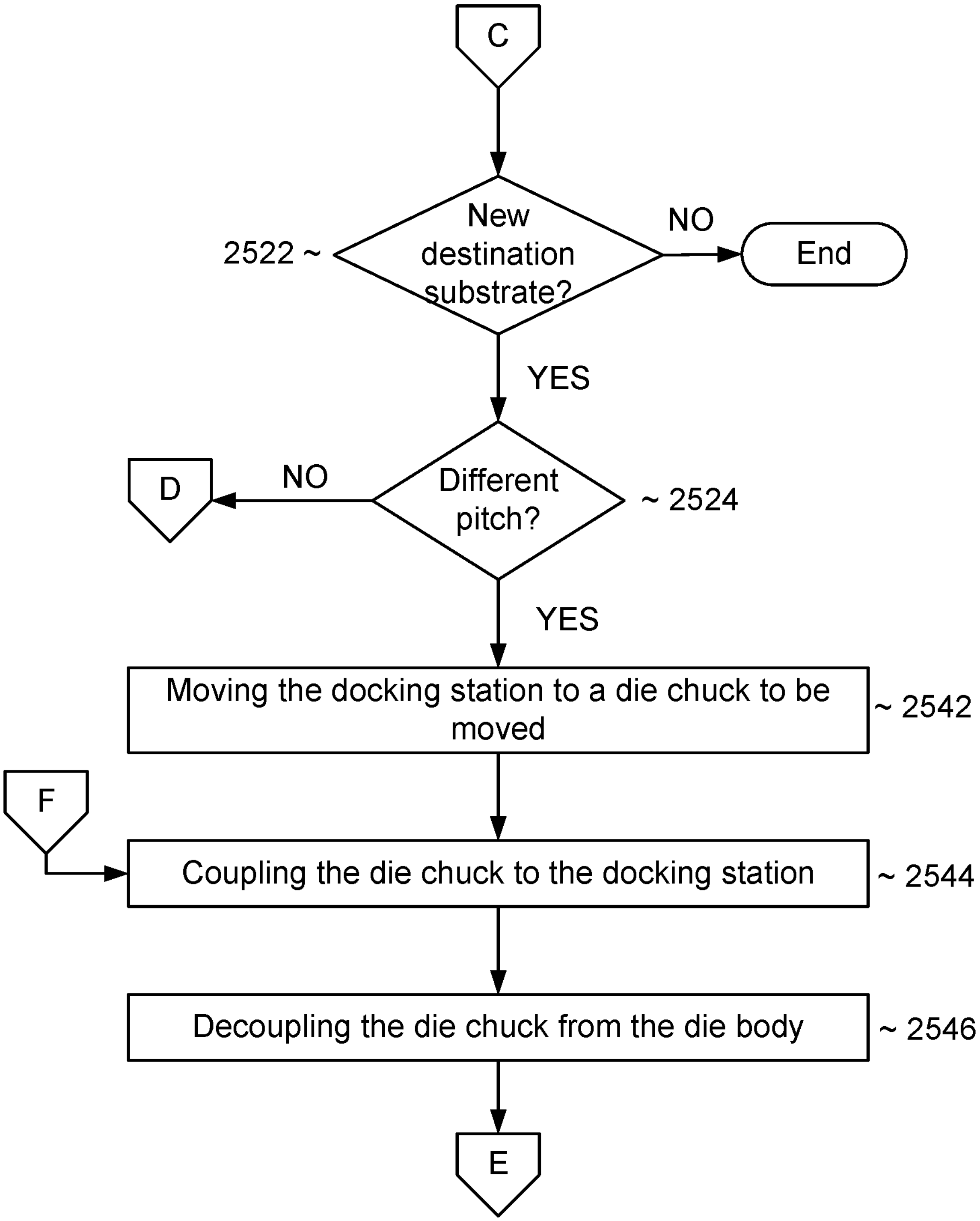
Figure 26:
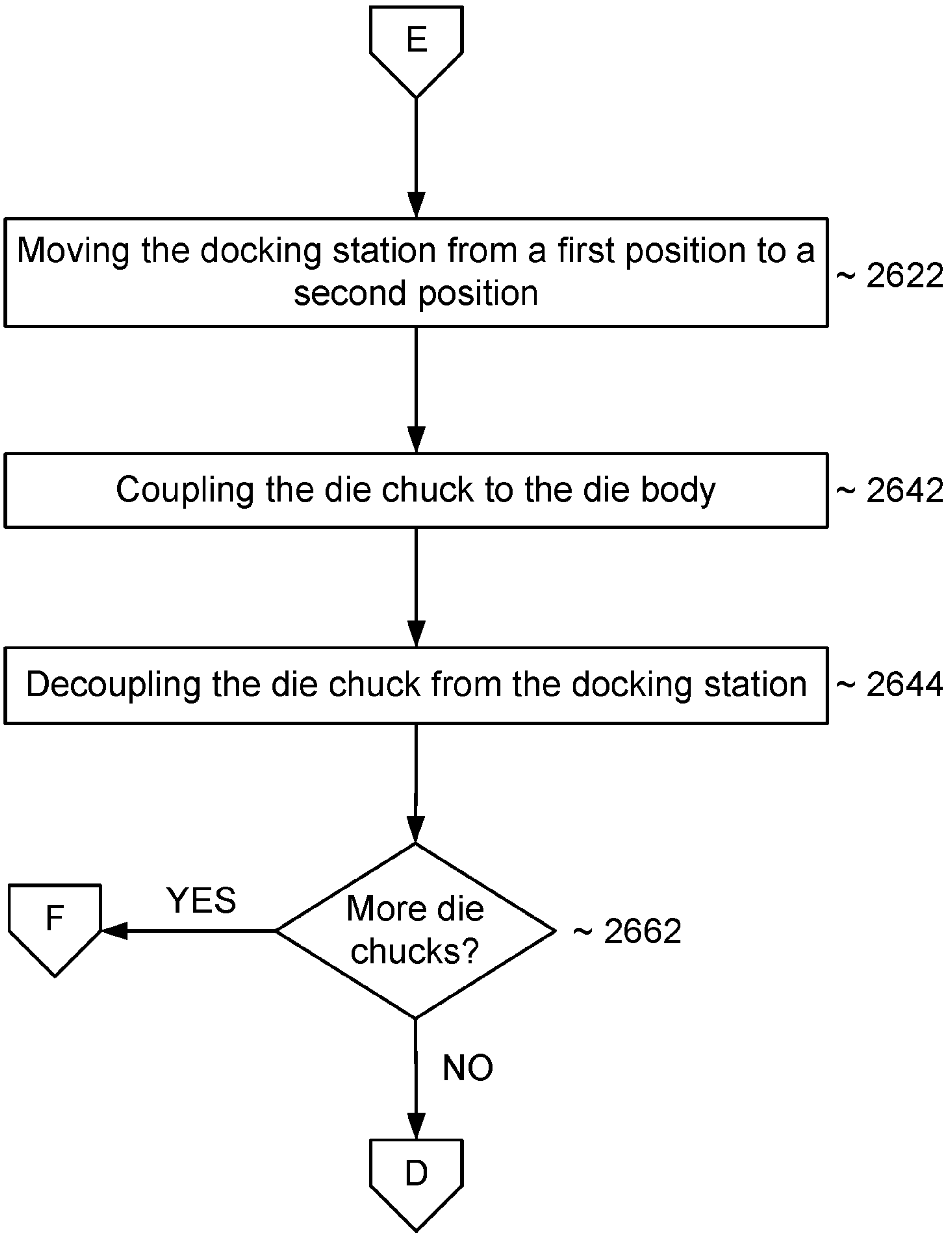

Attention is directed to methods of using the system 100. FIG. 22 includes a high-level process flow for bonding dies to different destination substrates having different pitches for destination sites. The method can include bonding some dies of a plurality of dies to a destination substrate at block 2222, changing a pitch of die holding regions associated with a plurality of die heads without moving die bodies at block 2242, and bonding other dies within the plurality of dies to a second destination substrate at block 2262 in FIG. 22. Bonding some dies at block 2222 is performed using a process flow as illustrated in FIGS. 23 and 24 and described in the text corresponding to such figures. Changing the pitch of the die holding regions is illustrated in FIGS. 25 and 26 and described in the text corresponding to such figures. Bonding other dies at block 2262 is performed using a process flow as illustrated in FIGS. 23 and 24 and described in the text corresponding to such figures. The method is described with respect to the bonding heads 511, 512, 521, and 522 of the cell 1610 within FIGS. 16 and 17. Other source die can be bonded to other destination sites using other bonding heads present within the array of bonding heads 124, such as bonding heads within the cell 1620 in FIG. 16, the bonding heads within the cell 1710 in FIG. 17, or bonding heads within other cells within the array of bonding heads 124, but are not illustrated in order to simplify understand the concepts described herein.

Figure 27:
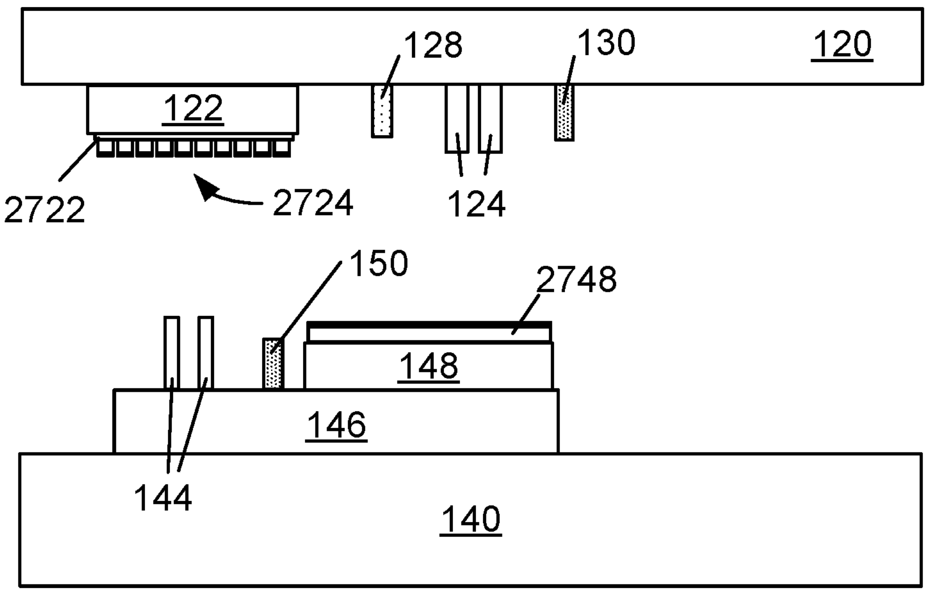
FIG. 27 includes an illustration of a cross-sectional view of a portion of the system of FIG. 1 after mounting a destination substrate and a source substrate including a plurality of source dies.

The method can include mounting a destination substrate onto a destination substrate chuck at block 2322 and mounting a source substrate onto a source substrate chuck at block 2324 and in FIG. 23. Referring to FIG. 27, the carriage 146 may be moved to allow easier access to the source substrate chuck 122 and destination substrate chuck 148. The actions in blocks 2322 and 2324 can be performed in either order. Referring to FIG. 27, a destination substrate 2748 is mounted over the destination substrate chuck 148, and a source substrate 2722 is mounted to the source substrate chuck 122.

The destination substrate 2748 can include a semiconductor wafer, a package substrate, a printed wiring board, a circuit board, an interposer, or the like. Microelectronic devices may be part of the destination substrate 2748, such as a semiconductor wafer. The package substrate, the printed wiring board, the circuit board, or the interposer may or may not have dies mounted thereto. Part or all of the side of the destination substrate 2748 can be activated for hybrid bonding. In an implementation, an activated surface for hybrid bonding is illustrated as a dark band along the exposed surface of the destination substrate 2748.

Figure 28:
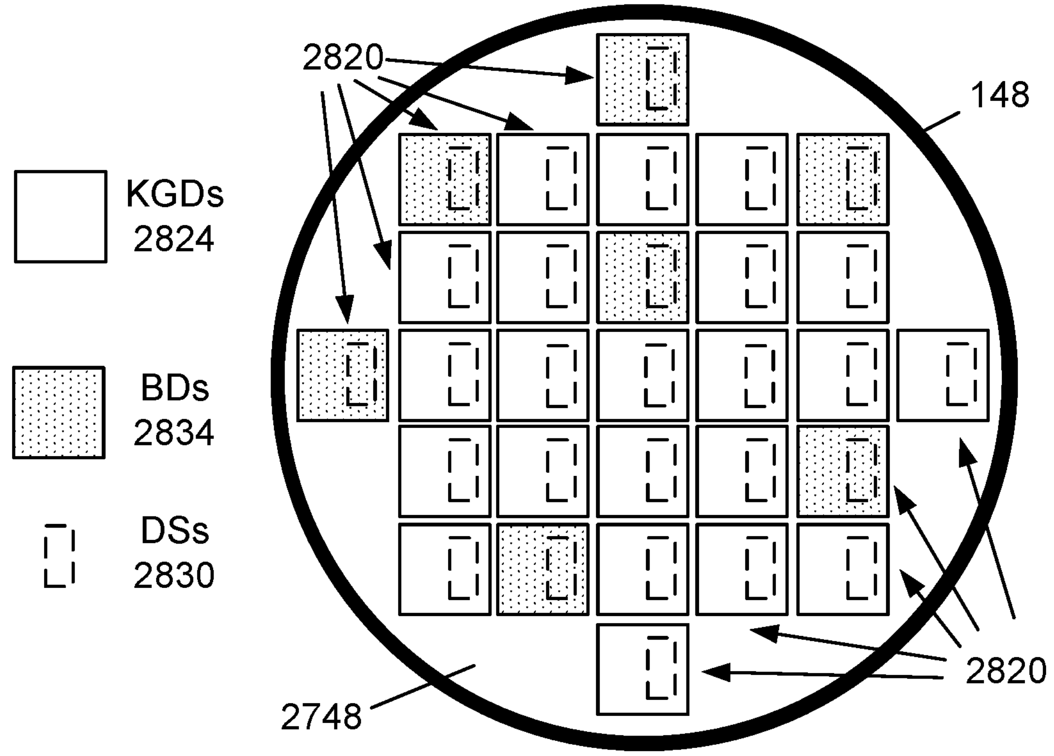
FIG. 28 includes a top view of a destination substrate chuck and the destination substrate, wherein the destination substrate includes known good dies and bad dies.

FIG. 28 includes a top view of the destination substrate chuck 148 and the destination substrate 2748. The destination substrate 2748 includes destination dies 2820. Any or all dies 2820 can include a microprocessor, a microcontroller, a graphic processing unit, a digital signal processor, a memory die (for example, a Level 2 or Level 3 cache, a flash memory, or the like), a field programmable gate array (FPGA), a power transistor die, a power circuit die, a charge coupled-device (CCD), an image sensor, a semiconductor circuit element, a die bonding location of the destination substrate, or the like.

Each of the destination dies 2820 can be a known good die (KGD) 2824 or a bad die (BD) 2834. A KGD passed one or more tests and is acceptable for bonding to another die. A bad die failed at least one test, where the test can be for electrical opens, electrical shorts, other functional testing (e.g., a process operation may not have been performed (missing an implant, an insulating layer was not formed, an etch operation was missed, or the like), the process operation may have been inadvertently performed more than one time, or the like), or the die operates too slowly (e.g., operating frequency is too low, read access time is too long, or the like)) for a particular application. Each of the destination dies 2820 can include a destination site 2830 that is illustrated with a dashed line. At this point in the method, the destination sites 2830 are not bonded to dies, and thus, the destination sites (DSs) 2830 are unoccupied.

The information regarding the KGDs 2824, the bad dies 2834, the destination sites 2830, and their locations with respect to the destination substrate 2748 can be stored in the memory 162 or another data storage unit (e.g., a hard disk, a database, or the like) external to the system 100 for later use when determining where source dies are to be bonded to the destination substrate 2748. Such information can include an X-direction pitch, a Y-direction pitch, or both the X-direction and Y-direction pitches for the destination sites 2830. The controller 160 or a local controller can receive information related to the destination substrate 2748 that can be used in the transfer operation, for moving die chucks to positions consistent with the X-direction and Y-direction pitches, or the like. In an implementation, all the destination dies 2820, whether KGDs 2824 or bad die 2834, can have the electrical circuit elements and electrical circuits including pluralities of electrical circuit elements.

Attention is directed to a source substrate 2722 and a plurality of dies 2724. Referring to FIGS. 27 and 28, dies from the plurality of dies 2724 will be bonded to the destination sites 2830 within the destination dies 2820 of the destination substrate 2748. The source substrate 2722 can be mounted along the source substrate chuck 122. The plurality of dies 2724 can be attached to the source substrate 2722. The plurality of dies 2724 can include a plurality of production source dies. As used herein, a production source die is a die that is formed during a microelectronic fabrication process and includes an electrical circuit element. The production source die may include a single electrical circuit element or may include an electrical circuit that includes a plurality of electrical circuit elements. A production source die may be a KGD or a bad die. All or only some and not all, of the plurality of the dies 2724 are to be transferred to the destination substrate 2748. The source substrate 2722 can be an adhesive tape that may be in the form of a tape frame or tape reel, a container having a lattice that defines a matrix of regions that can hold the plurality of dies 2724, or the like.

Any or all dies within the plurality of dies 2724 can include a microprocessor, a microcontroller, a graphic processing unit, a digital signal processor, a memory die (for example, a Level 2 or Level 3 cache, a flash memory, or the like), a field programmable gate array (FPGA), a power transistor die, a power circuit die, a charge coupled-device (CCD), an image sensor, a semiconductor circuit element, or the like. All dies within the plurality of dies 2724 can include identical electrical circuit element(s) and, if an electrical circuit is present, identical electrical circuit(s).

The information regarding the KGDs, the bad dies, and their locations with respect to the source substrate 2722 can be stored in the memory 162 or another data storage unit (e.g., a hard disk, a database, or the like) external to the system 100 for later use when loading source dies onto the array of die transfer seats 144. Such information can include an X-direction pitch, a Y-direction pitch, or both the X-direction and Y-direction pitches for the plurality of source dies 2724. The controller 160 or a local controller can receive information related to the plurality of source dies 2724 that can be used in the transfer operation.

Each of the source dies within the plurality of dies 2724, has a device side, which has most or all the electrical circuit elements of the die, and a back side opposite the device side. In the implementation as illustrated in FIG. 27, the back sides of the source dies within the plurality of dies 2724 are disposed between the source substrate chuck 122 and the device sides of the source dies. In another implementation, the device sides of the source dies within the plurality of dies 2724 are disposed between the source substrate chuck 122 and the back sides of the source dies. The sides of the dies facing the base 140 or a component coupled to the base 140 are activated for hybrid bonding to the destination substrate 2748, and the dark bands along the bottom of the source dies within the plurality of dies 2724 are used to illustrate the activated surface. Any one or more of the source dies can have a TSV or an electrical component along the back side, and such die(s) may also include back side bonding sites that may function as future destination substrate bonding sites that may be used at a later time.

The method includes performing registration and metrology with respect to a plurality of dies on the source substrate and a plurality of die transfer seats at block 2342 in FIG. 23. Referring to FIG. 27, the registration and metrology operations can be performed with respect to the plurality of dies 2724 and the array of die transfer seats 144. The optical component 150 can be used to collect information regarding the plurality of dies 2724. The information from the optical component 150 can be transmitted to and received by the controller 160 or a local controller and used to determine the source pitch for the plurality of dies 2724 coupled to the source substrate chuck 122. The source pitch can include an X-direction source pitch, a Y-direction source pitch, or both the X-direction and Y-direction source pitches. If needed or desired, the information may be used to identify or confirm dies within the plurality of dies 2724 are in the correct relative locations for the destination sites of the destination substrate 2748. The plurality of dies 2724 can be production source KGDs that will be bonded to KGDs 2824 of the destination substrate 2748. The plurality of dies 2724 may include bad dies that can be bonded to bad dies 2834 of the destination substrate 2748.

The method can further include changing a pitch of the array of die transfer seats to a source-matching pitch at block 2344 in FIG. 23. The controller 160 or a local controller can transmit a signal for the array of die transfer seats 144 to be moved to achieve the source-matching pitch. The source-matching pitch can be the same or within an allowable tolerance of the source pitch. Similar to the source pitch, the source-matching pitch can include an X-direction source-matching pitch, a Y-direction source-matching pitch, or both the X-direction and Y-direction source-matching pitches. The allowable tolerance may account for slight differences that can be attributed to the equipment or repeatability of a manufacturing process. As used herein, an allowable tolerance can be within 2.0%, 1.0%, 0.5% or 0.1% of the desired value. For example, the source-matching pitch can be within 2.0%, 1.0%, 0.5% or 0.1% of the source pitch.

Figure 29:
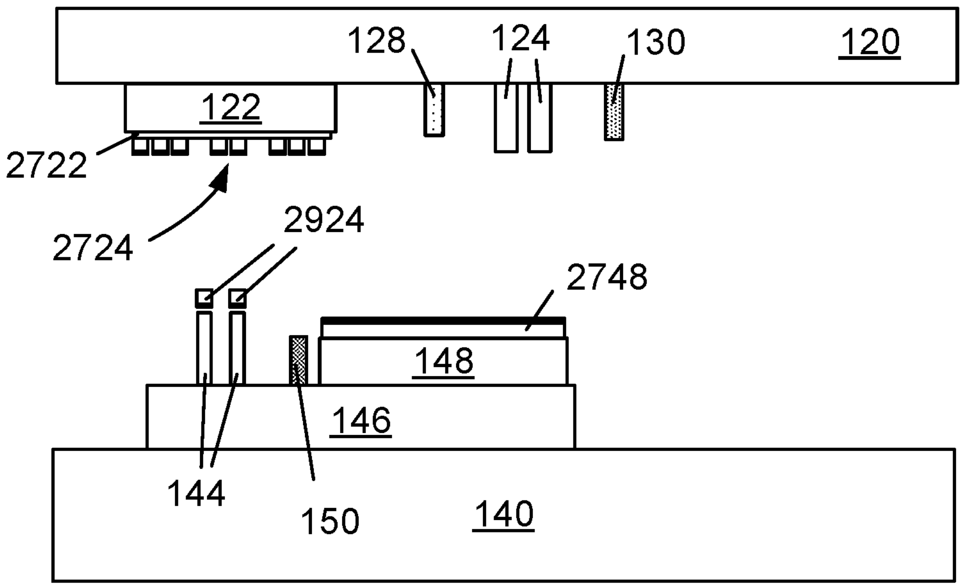
FIG. 29 includes an illustration of a cross-sectional view of the system of FIG. 27 after transferring a set of source dies to a plurality of die transfer seats.
Figure 30:
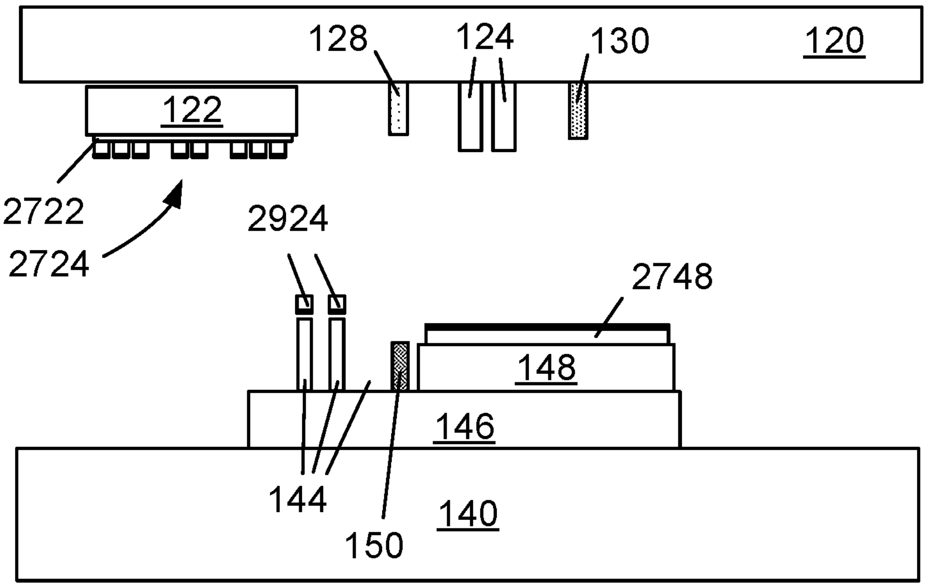
FIG. 30 includes an illustration of a cross-sectional view of the system of FIG. 29 when positioning the carriage using an optical component under an alignment reference coupled to the bridge.

The method can include loading a set of dies onto the array of die transfer seats at block 2346 in FIG. 23. The set may be as little as one die or may be any number of dies up to the number of die transfer seats within the plurality of die transfer seats 144. Referring to FIG. 29, the controller 160 or a local controller can transmit a signal for the array of die transfer seats 144 to be extended toward the source substrate 2722, pick up a set of dies 2924, and retract the die chucks away from the source substrate 2722. When the set of dies is less than the number of die transfer seats within the array of die transfer seats 144, only the die transfer seat(s) that will be picking up source die(s) during the current transfer cycle may be extended. Picking up the die is a particular type of loading. Another type of loading with respect to the system 100 can be to load any or all the die transfer seats using a die loading machine (not illustrated). Within the plurality of dies 2724, dies not picked up remain coupled to the source substrate chuck 122 as illustrated in FIG. 29.

In an implementation, the array of die transfer seats 144 does not contact the activated surfaces of the set of dies 2924. The die chucks of the array of die transfer seats 144 may be Bernoulli chucks. Although the set of dies 2924 is held by the corresponding die chuck, the set of dies 2924 is drawn in FIG. 29 as being spaced apart from its corresponding die transfer seat within the array of die transfer seats 144 to illustrate that the activated surface of the set of dies 2924 does not contact its corresponding die transfer seat. The array of die transfer seats 144 can have a design that allows dies to be picked up along lateral side surfaces of dies, where the lateral side surfaces are between the device and back sides of the dies.

If a die is too thin to be held by its sides, a backing plate can be coupled to the die. For example, a die may have a thickness of less than 50 μm. A thickness of the backing plate or a combined thickness of the backing plate and die is sufficient to allow a pick-up head to pick up the backing plate or a combination of the backing plate and die without having an activated surface of the die contacting the pick-up head. The backing plate can have a thickness in a range from 100 μm to 500 μm.

The backing plates can be coupled to the set of dies 2924 using an adhesive compound. The backing plates may be removed at a later time or remain coupled to the die in the finished electrical device. After the die is bonded to the destination substrate 2748, the backing plates may be removed. In an implementation, the adhesive compound may be deactivated by exposure to actinic radiation. The actinic radiation may be in a range from 100 nm to 10 μm. In such an implementation, at least 70% of the actinic radiation is to be transmitted through the backing plate. In another implementation, a solvent can be used to remove the adhesive compound from between the set of dies 2924 and the backing plates.

In another implementation, a die may not have an activated surface but has a relatively fragile component along a surface that will be bonded to the destination substrate 2748, and such surface should not contact a die transfer seat within the array of die transfer seats 144. A die transfer seat as described with respect to the die having the activated surface can be used for the die with a fragile component along the surface facing the die transfer seat.

In a further implementation, the die chucks for the array of die transfer seats 144 can have a design where the die chuck contacts the bottom-facing surface of the set of dies 2924. After reading this specification in its entirety, skilled artisans will be able to determine whether the array of die transfer seats 144 should or should not contact device sides or back sides of the dies and determine a design that meets the needs or desires for a particular application.

The method can further include changing a pitch of the array of die transfer seats to a bonding head-matching pitch at block 2348 in FIG. 23. The controller 160 or a local controller can transmit a signal for the array of die transfer seats 144 to be moved to achieve the bonding head-matching pitch. The bonding head-matching pitch can be the same or within an allowable tolerance of the bonding head pitch for the array of bonding heads 124. For the purposes of this specification, the bonding head pitch is the pitch of the die holding regions of the bonding heads. The bonding head-matching pitch and the bonding head pitch can include an X-direction bonding head-matching pitch, a Y-direction bonding head-matching pitch, or both the X-direction and Y-direction bonding head-matching pitches.

Figure 31:
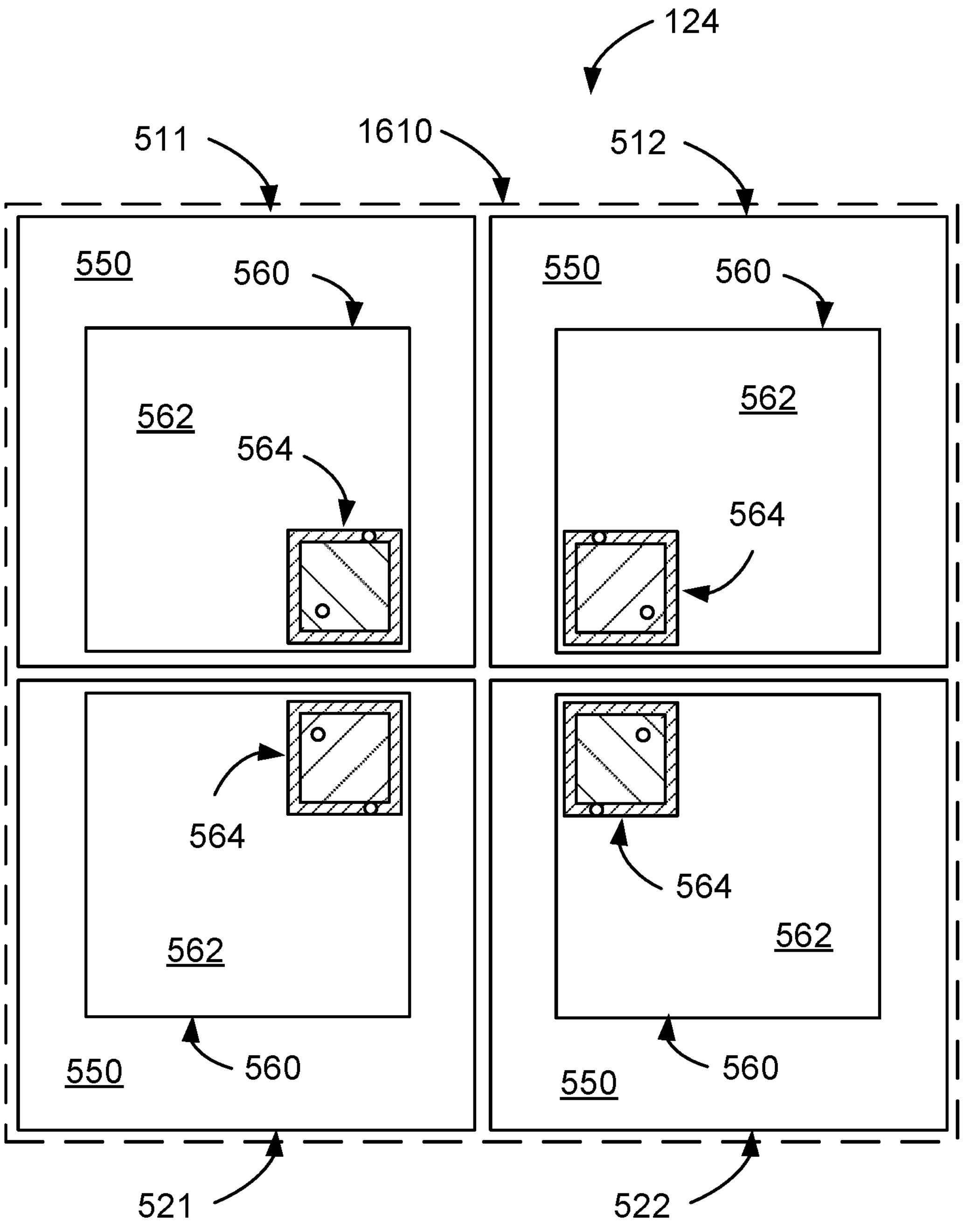
FIG. 31 includes an illustration of a bottom view of a cell of bonding heads.

FIG. 31 includes a bottom view of portion of the array of bonding heads 124 and includes the cell 1610 that includes the bonding heads 511, 512, 521, and 522. The die bodies 540 (not separately illustrated in FIG. 31) are placed close to each other. The die chucks 560 can have a range of positions as previously described with respect to FIGS. 10 to 13.

The bonding head pitch is the pitch of the die holding regions 564 for the bonding heads 511, 512, 521, and 522. The die chucks 560 are positioned to achieve the proper bonding head pitch that is at or close to the pitch of the destination sites 2830 of the destination substrate 2748 as illustrated in FIG. 28. In the particular example illustrated in FIG. 31, in the X-direction, the die chucks 560 are positioned near the middle of the die chuck mounting regions for each of the bonding heads. Along the upper row, the die chucks 560 are near the bottom of die chuck mounting regions for each of bonding heads 511 and 512, and along the lower row, the die chucks are near the top of die chuck mounting regions for each of the bonding heads 521 and 522. As compared to the X-direction, the Y-direction the die chucks in the different rows are closer together. Thus, the array of bonding heads 124 have an intermediate value for the X-direction pitch and a relatively small value for the Y-direction pitch. Information regarding the X-direction pitch and Y-direction pitch can be stored in the memory 162, a database or a memory external to the system 100 and may be received by the controller 160 or a local controller when setting values for the bond head-matching pitches for the array of die transfer seats 144.

The allowable tolerance between the bonding head pitch and the bond-head matching pitch may account for slight differences that can be attributed to the equipment or repeatability of a manufacturing process. For example, the bonding head-matching pitch can be within 2.0%, 1%, or 0.5% of the bonding head pitch. The allowable tolerance for the bonding head pitch is determined by the size of the interconnect pads on each of the die, for example, the allowable tolerance of the bonding head pitch may be 0.1% to 10% of the size of the smallest interconnect contact pad. The allowable tolerance may be relaxed when each of the die bodies of the bonding heads includes or is attached to an independent positioning stage, in which case the allowable tolerance may be relaxed up to a fraction of the range of the positioning stage. The positioning stages may be 6-axis positioning stages.

Figure 32:
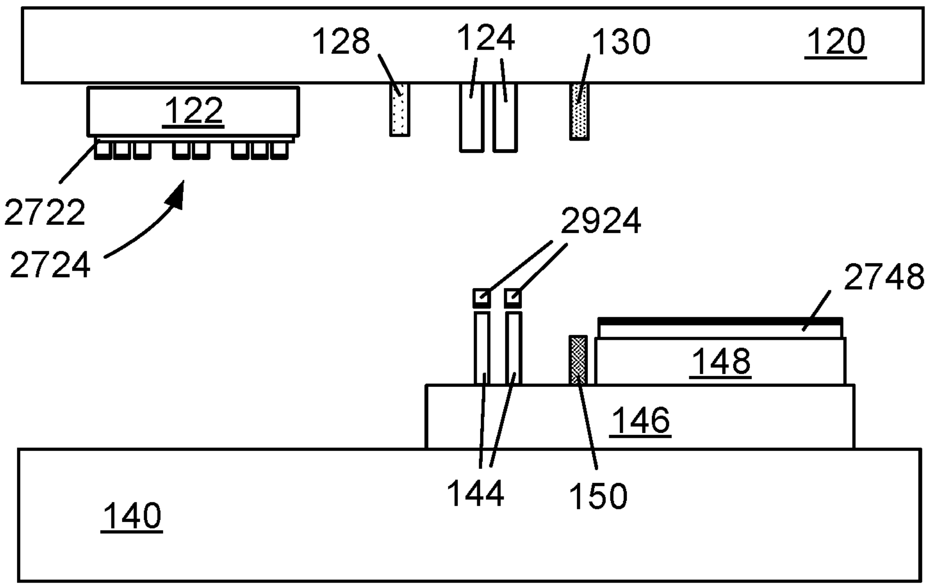
FIG. 32 includes an illustration of a cross-sectional view of the system of FIG. 30 after positioning the source die under a bonding head.

The method can include moving the carriage to an alignment position at block 2422 in FIG. 24. In FIG. 32, the carriage 146 is moved so that the alignment reference 128 is over the optical component 150. Information collected from the optical component 150 can be received by the controller 160 or a local controller. The controller 160 or a local controller can use the information regarding a subsequent movement of the carriage 146 to a desired location.

The method can further include moving the carriage 146 so that the set of dies 2924 can be transferred from the array of die transfer seats 144 to the array of bonding heads 124. The controller 160 or a local controller can transmit a signal to move the carriage 146 to a desired position. In an implementation as illustrated in FIG. 32, the carriage 146 is moved so that the array of bonding heads 124 is over the set of dies 2924. The movement can include moving the carriage 146 in an X-direction, a Y-direction, rotating the carriage along an X-Y plane, or a combination thereof.

Figure 33:
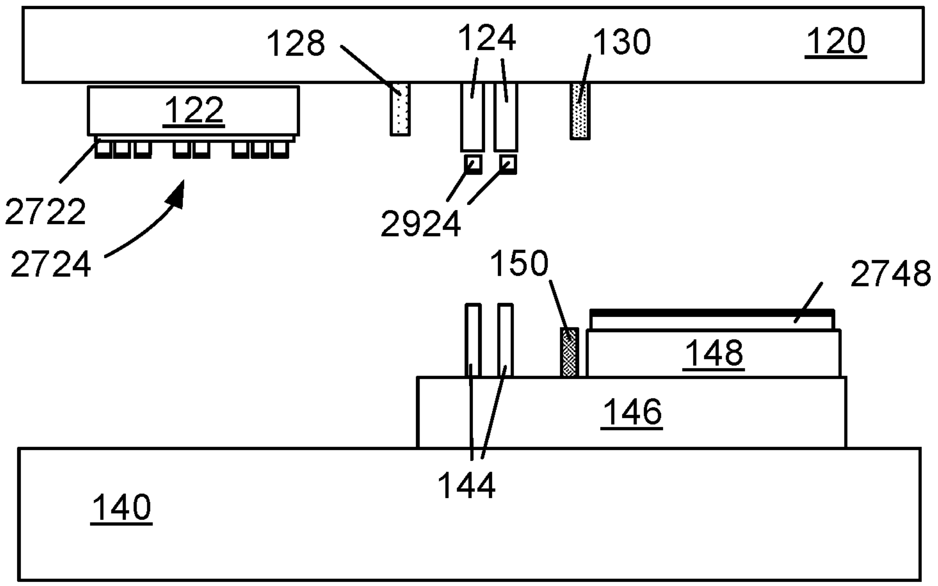
FIG. 33 includes an illustration of a cross-sectional view of the system of FIG. 32 after transferring the set of source dies from the die transfer seats to the bonding heads.

The method can further include transferring the set of dies from the array of die transfer seats to the array of bonding heads at block 2424 in FIG. 24. The controller 160 or a local controller can transmit a signal for the set of dies 2924 to be transferred from the array of die transfer seats 144 to the array of bonding heads 124. The die chucks for the array of die transfer seats 144 can be extended toward the array of bonding heads 124, the die chucks for the bonding heads within the array of bonding heads 124 can be extended toward the array of die transfer seats 144, or both. FIG. 33 includes the set of dies 2924 after transferring the set from the array of die transfer seats 144 to the array of bonding heads 124.

Figure 34:
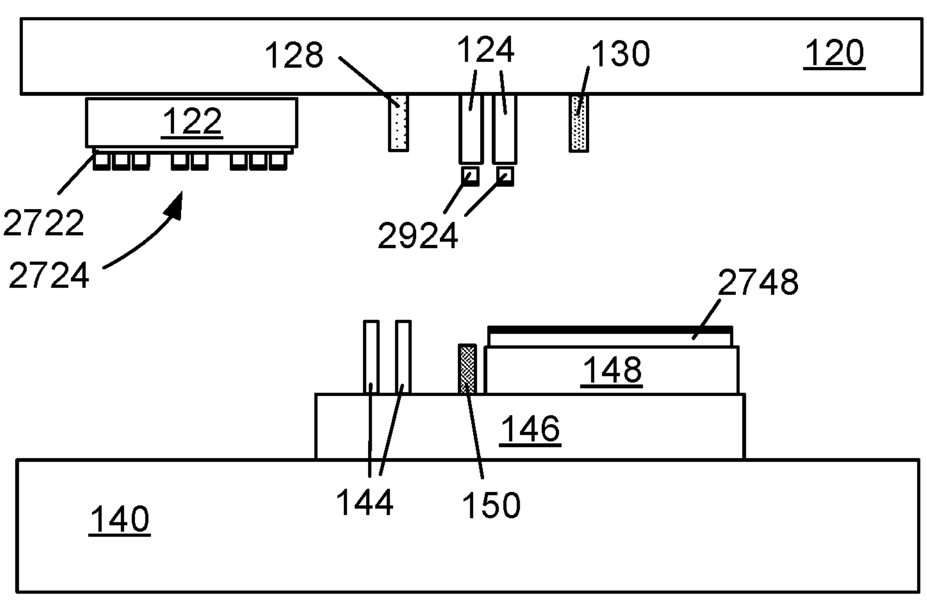
FIG. 34 includes an illustration of a cross-sectional view of the system of FIG. 33 when measuring alignment error for the set of source dies.

The method can include measuring alignment of the set of dies using an optical component at block 2442 in FIG. 24. The optical component 150 coupled to the carriage 146 may be used in positioning the set of dies 2924, measuring alignment error of the set of dies 2924, or both as illustrated in FIG. 34. The position of each die on each die holding region 564 may be measured relative to one or more alignment marks on one or more of the: die chuck 560; mounting plate 550; and device head 540. Better positioning of the dies can be accomplished by measuring an alignment error as a position of each die on each bonding head relative to an ideal position of the die on the bonding head. The position of each die may be adjusted using one or more positioning stages that is part of/are parts of or connected to the device head 540. Information from the optical component 150 can be sent to and received by the controller 160 or a local controller. The controller 160 or a local controller can receive and use the information to determine an alignment error and an amount of positioning of the die so that the die will be more closely aligned to its corresponding destination site of the destination substrate 2748. The controller 160 or a local controller can transmit a signal, so that the position of each die is adjusted by moving the die chuck of the bonding head using the limited range of motion of the die chuck relative to its corresponding body. Thus, in an implementation, moving the die chuck allows the position of the die to be adjusted relative to the destination substrate 2748 that is held by the destination substrate chuck 148. Positioning and measuring alignment error may be performed iteratively until the alignment error is zero or an acceptably low value. The alignment error is determined at least by the pitch of the die on all of the bonding heads relative to the destination pitch.

The method further includes moving the carriage such that the bonding head is over the destination substrate at block 2444 in FIG. 24. The controller 160 or a local controller can transmit a signal for the carriage 146 to move to a desired position. The carriage 146 is moved so that the set of dies 2924 is over its corresponding destination site for the destination substrate 2748.

Figure 35:
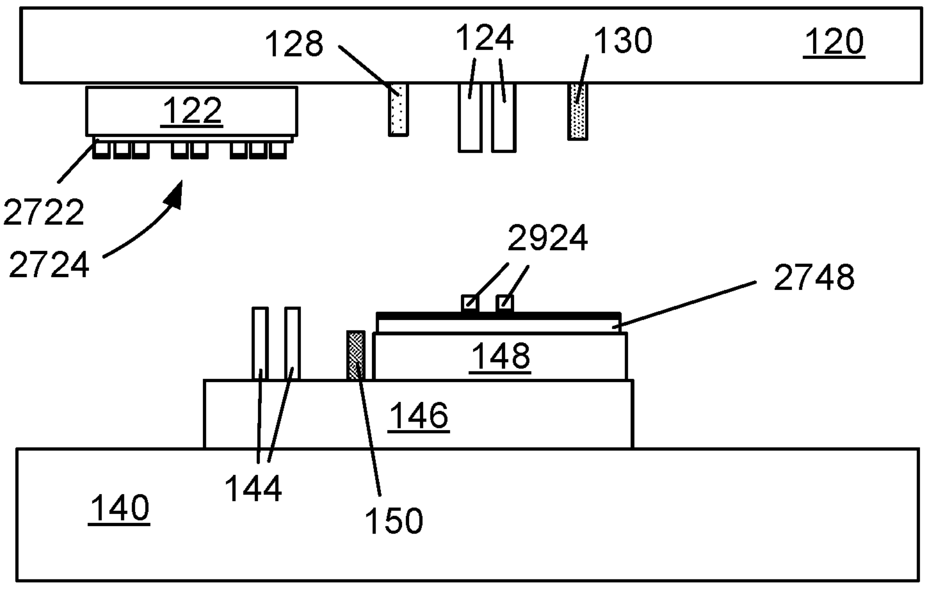
FIG. 35 includes an illustration of a cross-sectional view of the system of FIG. 34 after bonding the set of source dies to destination sites of the destination substrate.

The method can further include bonding the set of die to corresponding destination sites of the destination substrate at block 2446 in FIG. 24. The controller 160 or a local controller can transmit a signal for the set of dies 2924 to be bonded to destination sites of the destination substrate 2748. The die chuck for the bonding head within the array of bonding heads 124 can be extended toward the destination substrate 2748, the destination substrate chuck 148 can be extended toward the array of bonding heads 124, or both. Pressure is exerted to bond the set of dies 2924 to their corresponding destination sites of the destination substrate 2748 in FIG. 35. In an implementation, the bond can be an oxide-to-oxide bond. The pressure during bonding can be in a range 0.5 $N/cm^2$ to 20 $N/cm^2$. The bonding can be performed at room temperature (for example, at a temperature in a range from 20° C. to 25° C.) or higher. Bonding is performed at a temperature less than a subsequent anneal to expand conductive metal within the dies and at the destination sites. The temperature and pressure may be limited depending on films present during bonding or components within the apparatus 110. For example, the temperature may be no higher than approximately 200° C. After reading this specification, skilled artisans will be able to determine the pressure and temperature used for bonding.

Figure 36:
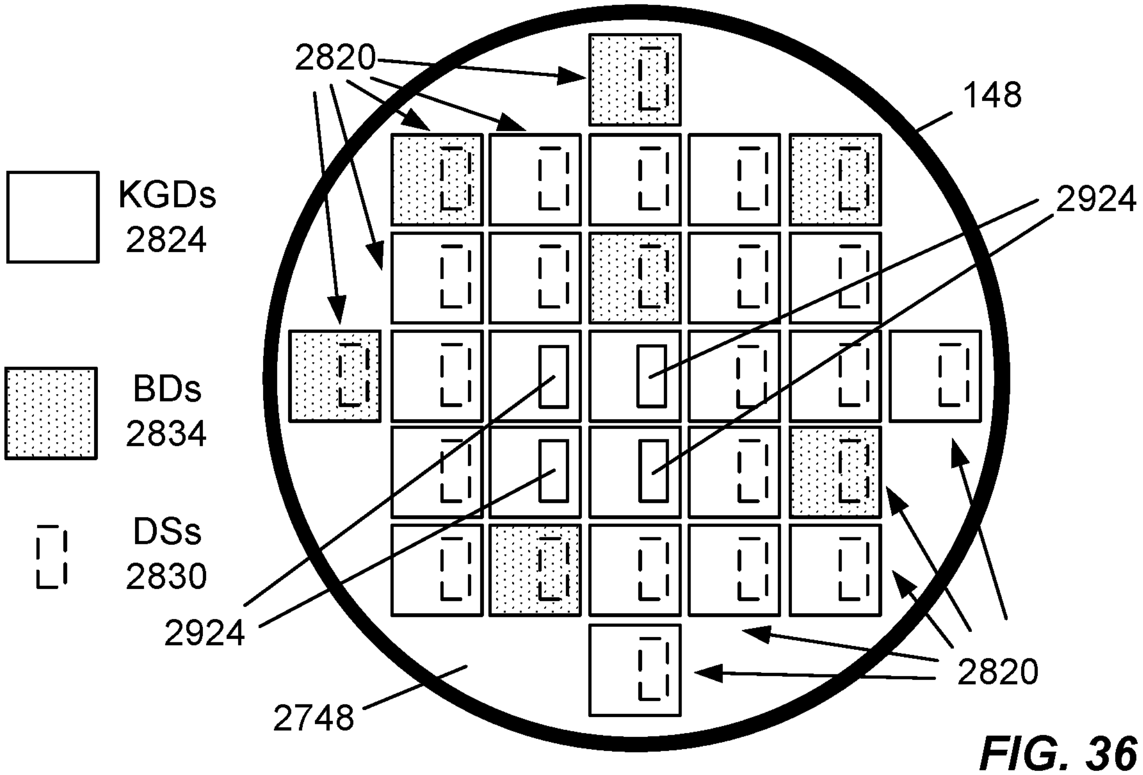
FIG. 36 includes an illustration of a top view of the destination substrate chuck and the destination substrate of the system of FIG. 35 after bonding the source die to the destination site.

FIG. 36 includes a top view of the destination substrate chuck 148 and the destination substrate 2748 after the set of dies 2924 is bonded to their corresponding destination sites of the destination substrate 2748. The destination sites 2830 that are not bonded to source dies are illustrated with dashed lines in FIG. 36.

Figure 37:
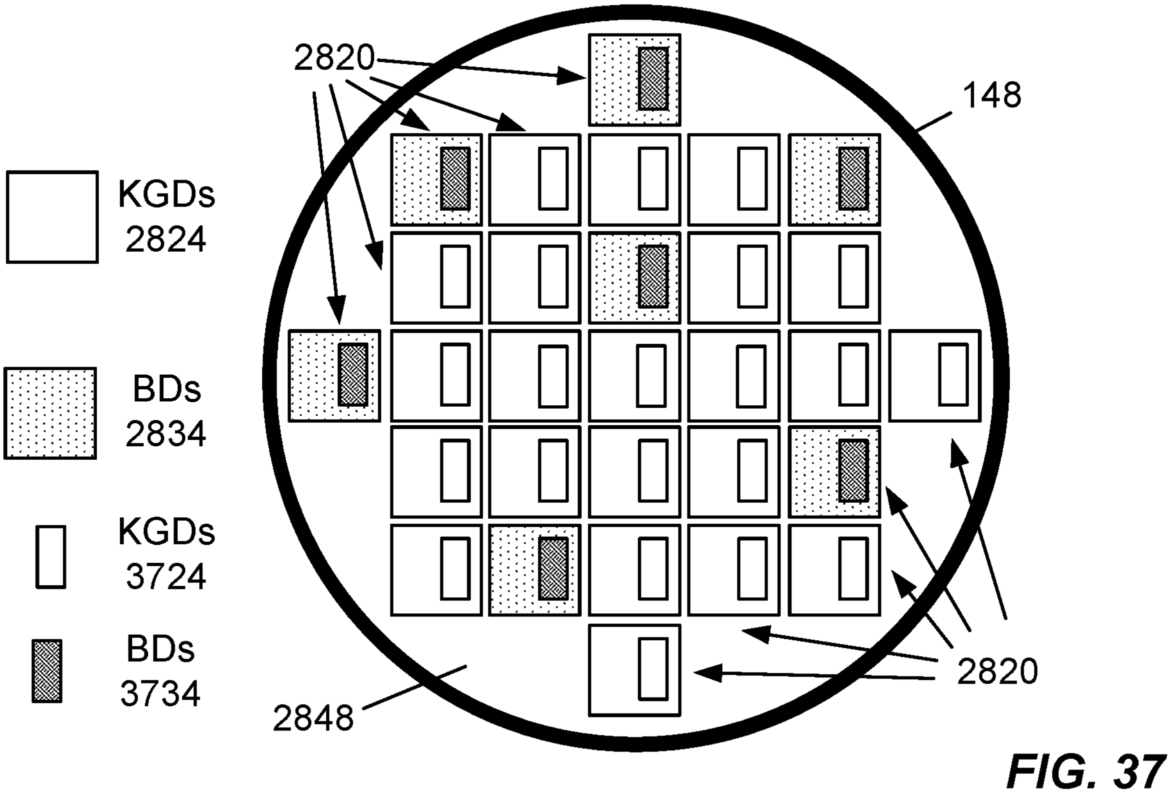
FIG. 37 includes an illustration of a top view of the destination substrate chuck and the destination substrate after bonding source dies to the remaining destination sites of the destination substrate.

The method includes deciding whether another set of dies is to be transferred to the destination substrate at decision diamond 2462 in FIG. 24. More dies are to be transferred ("YES" branch from decision diamond 2462 in FIG. 24), the method continues starting at block 2344 in FIG. 23. In an implementation as illustrated in FIG. 37, more source dies are bonded to destination sites of the destination substrate 2748. The dies include source KGDs 3724 within the plurality of dies 2724 that are bonded to destination sites of destination KGDs 2824. The source KGDs 3724 include the set of dies 2924, although the set of dies 2924 are not labelled in FIG. 37.

Source dies may or may not be bonded to the bad destination dies 2834. In the implementation illustrated in FIG. 37, bad source dies 3734 may be bonded to the bad destination dies 2834. The bad source dies 3734 may be part of the plurality of dies 2724 or may be coupled to a different source substrate that is coupled to a different source substrate chuck. The bad source dies 3734 may be processed similar to the set of dies 2924. In another implementation, the bad source dies 3734 may be loaded onto the plurality of die transfer seats 144 by a die loading machine.

In another implementation, some or all of the bad source dies 3734 can be replaced by dummy source dies. The dummy source dies may have X-direction, Y-direction, and Z-direction dimensions that are the same as or within an allowable tolerance of the X-direction, Y-direction, and Z-direction dimensions, respectively, of the KGDs 3724. For example, the X-direction, Y-direction, and Z-direction dimensions can be within 2.0%, 1%, or 0.5% of the X-direction, Y-direction, and Z-direction dimensions the KGDs 3724. When the KGDs 3724 are bonded to a backing plate, the Z-direction dimension of the dummy source dies may be the same as or within an allowable tolerance of the combined thickness of the KGDs 3724 and backing plates.

The dummy source dies may be within the plurality of dies 2724 or coupled to a different source substrate that is coupled to a different source substrate chuck. The dummy source dies may be processed similar to the set of dies 2924. In another implementation, the dummy source dies may be loaded onto the plurality of die transfer seats 144 by a die loading machine.

Returning to the method in FIG. 24, when no further sets of source dies are to be transferred to the destination substrate ("NO" branch of decision diamond 2462 in FIG. 24), the method can include determining whether or not a new destination substrate will be processed at decision diamond 2522 in FIG. 25. If no further destination substrate is to be processed ("NO" branch), the method for the transfer operation regarding the destination substrate 2748 may end.

Further processing can be performed to complete a hybrid bonding process of the source dies to the destination sites of the destination substrate 2748. The hybrid bonding process can include three steps that include a bonding operation corresponding to the transfer operation, a first anneal to cause the metal within the dies and at the destination sites to expand and contact each other, and a second anneal to cause metal atoms to cross the metal-metal interface and reduce contact resistance. The destination substrate can be removed from the apparatus 110 or moved to a different portion of the apparatus 110 or a different tool to perform the anneal operations. This method may also be used with other processes for bonding die to substrates such as: tape automated bonding; pre-attachment for wire bonding; solder bump bonding; ball bonding; etc.

Returning the method for another transfer operation, if a new destination substrate is to be processed ("YES" branch from decision diamond 2522), the method can further include determining whether or not the new substrate has a different pitch for destination sites of the new substrate at decision diamond 2524. The new substrate can have destination dies that have identical electrical circuits and destination sites as the prior substrate. The pitches for the prior and new substrates can be the same or within an allowable tolerance of one another.

If the pitches are not significantly different ("NO" branch from decision diamond 2524), the method can proceed to block 2322 in FIG. 23 where the new destination substrate is mounted to the destination substrate chuck. The actions in blocks 2324 and 2342 may or may not be performed. For example, the plurality of dies 2724 can include source dies that are to be bonded to the new destination substrate. In this instance, the actions in blocks 2324 and 2342 are not performed. In another example, the plurality of dies 2724 may not have a sufficient number of source dies for the new destination substrate. A new source substrate coupled to a new plurality of source dies can be mounted onto the source substrate chuck (block 2322) and registration and metrology can be performed (block 2342). Whether or not a new source substrate and new plurality of dies is processed, the method can continue starting with changing the pitch of the array of die transfer seats at block 2344.

If the new destination substrate has a different pitch for its destination sites ("YES" branch from decision diamond 2524), the die chucks for the array of bonding heads 124 will need to be moved for the different pitch. Referring to FIG. 31, the die chucks 560 for the array of bonding heads 124, including the bonding heads 511, 512, 521, and 522, will be moved so that the die holding regions 564 are at pitches for the destination sites of the new destination substrate.

Figure 38:
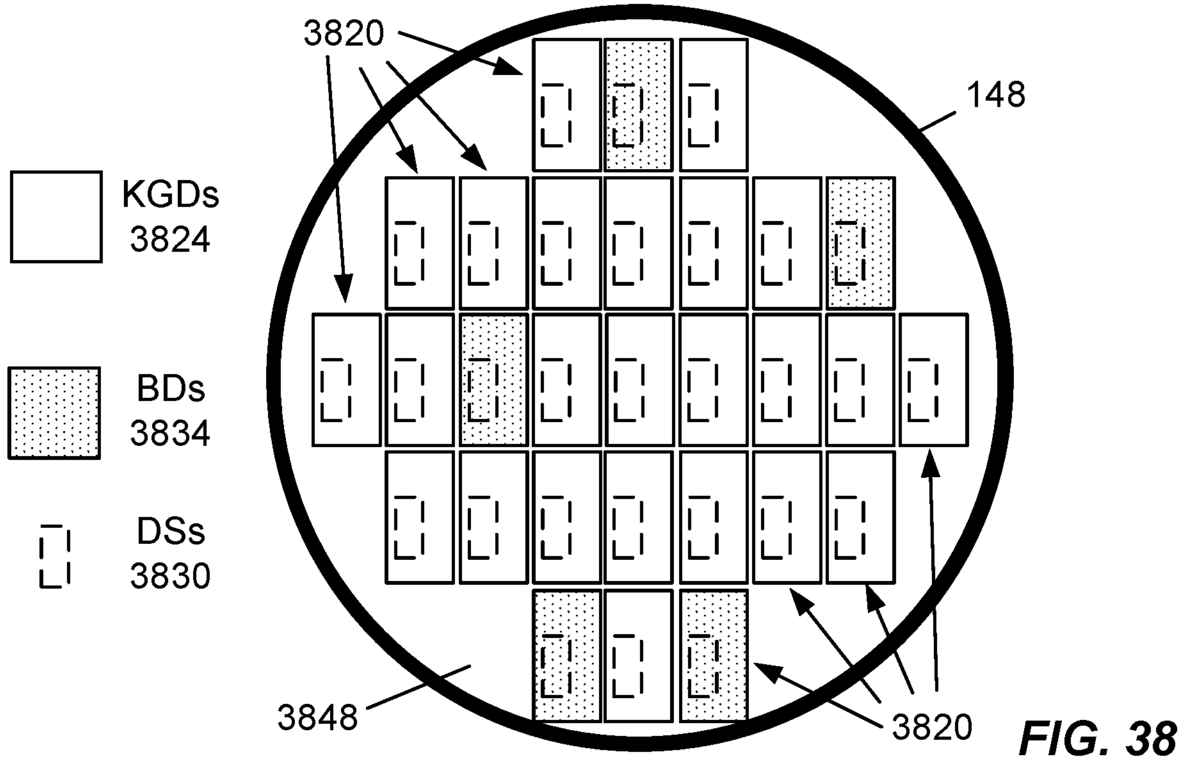
FIG. 38 includes an illustration of a top view of the destination substrate chuck and another destination substrate before bonding any source die to destination sites of the other destination substrate.

FIG. 38 is a top view of a destination substrate 3848 that is coupled to the destination substrate chuck 148. The destination substrate 3848 includes destination dies 3820. Any or all dies 3820 can include a microprocessor, a microcontroller, a graphic processing unit, a digital signal processor, a memory die (for example, a Level 2 or Level 3 cache, a flash memory, or the like), a field programmable gate array (FPGA), a power transistor die, a power circuit die, a charge coupled-device (CCD), an image sensor, a semiconductor circuit element, a die bonding location of the destination substrate, or the like. Each of the destination dies 3820 can be a KGD 3824 or a bad die 3834. In an implementation, all of the destination dies 3820, whether KGDs 3824 or bad die 3834, can have electrical circuit elements and electrical circuits including pluralities of electrical circuit elements.

Each of the destination dies 3820 can include a destination site 3830 that is illustrated with a dashed line. At this point in the method, the destination sites 3830 are not bonded to dies, and thus, the destination sites 3830 are unoccupied in FIG. 38. As compared the destination sites 2830 of the destination substrate 2748 in FIG. 28, the destination sites 3830 along a single row are closer together, and the destination sites 3830 along a single column are farther apart. The X-direction pitch for the destination sites 3830 is less than the X-direction pitch for the destination sites 2830, and the Y-direction pitch for the destination sites 3830 is greater than the Y-direction pitch for the destination sites 2830. The positions of the die chucks for the array of bonding heads 124 can be moved to achieve the X-direction and Y-direction pitches for the destination sites 3830 of the destination substrate.

The information regarding the KGDs 3824, the bad dies 3834, the destination sites 3830, and their locations with respect to the destination substrate 3848 can be stored in the memory 162 or another data storage unit (e.g., a hard disk, a database, or the like) external to the system 100 for later use when repositioning die chucks for the array of bonding heads 124 and determining where source dies are to be bonded to the destination substrate 3848. Such information can include an X-direction pitch, a Y-direction pitch, or both the X-direction and Y-direction pitches for the destination sites 3830. The information can be received by the controller 160 or a local controller to allow for the proper positioning of the die chucks 560.

Figure 39:
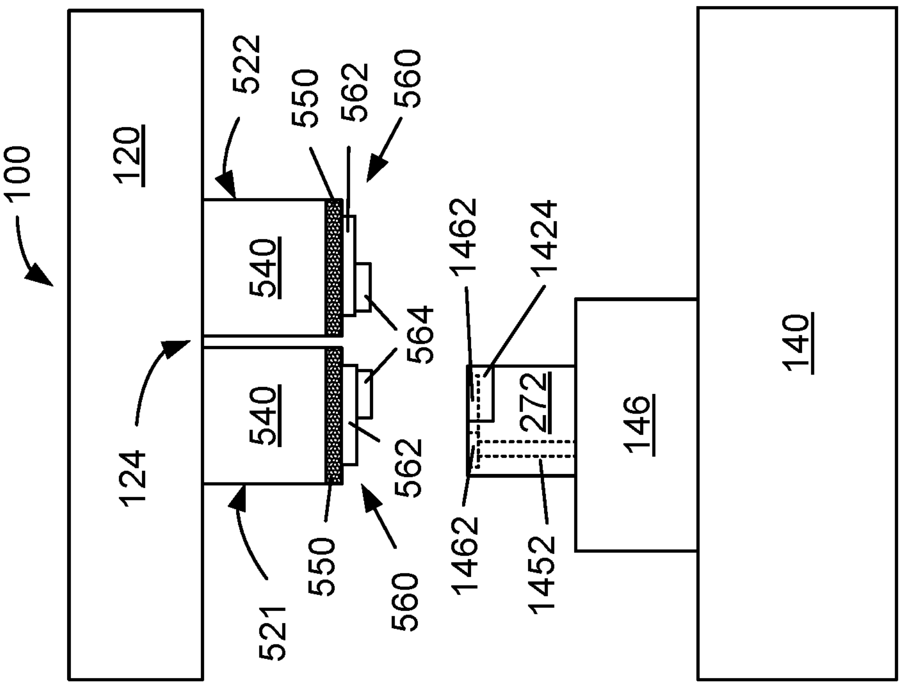
FIG. 39 includes an illustration of a cross-sectional view of a portion of the system of after moving a docking station into position for a bonding head.

Referring to FIG. 25, because the bonding head pitch is different ("YES" branch of decision diamond 2524), the method can include moving the docking station to a die chuck to be moved at block 2542. The controller 160 or a local controller can transmit a signal for the carrier 146 to be moved to the desired position. FIG. 39 includes a side view of a portion of the system 100 that includes the bridge 120, the bonding heads 521 and 522 of the array of bonding heads 124, the docking station 272, the carriage 146, and the base 140. The array of the bonding heads 124 can include more or fewer bonding heads as compared to the implementation illustrated in FIG. 39. Many of the details of the bonding heads 521 and 522 and docking station 272 are described above. The bridge-side couplings are illustrated by shading the mounting plates 550 of the bonding heads 521 and 522 because the die chucks 560 are coupled to the bridge 120. The controller 160 or a local controller can transmit a signal for the carriage 146 to move so that the docking station 272 is under the bonding head 521.

Figure 40:
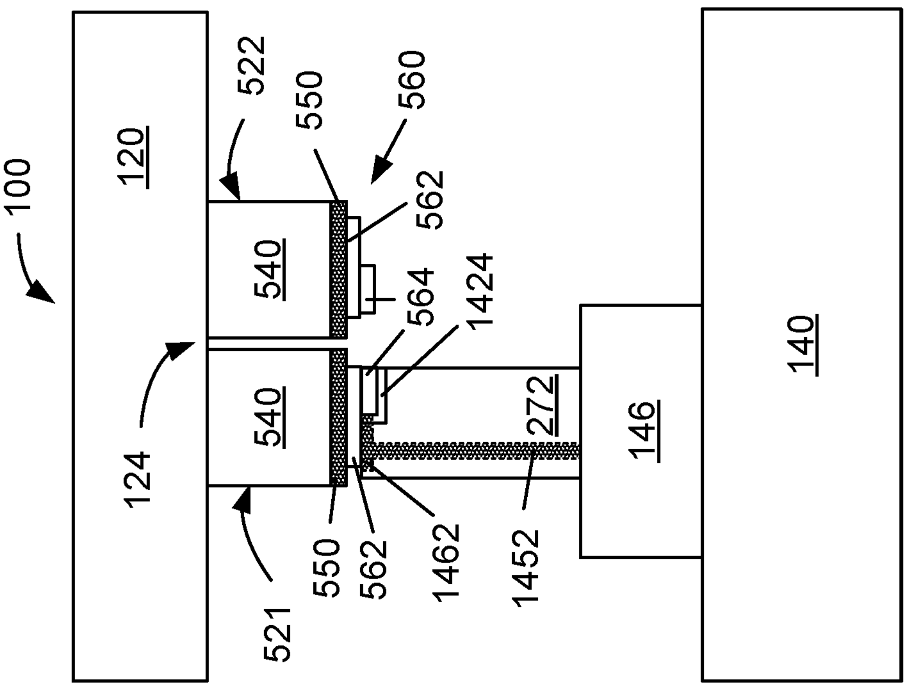
FIG. 40 includes an illustration of a cross-sectional view of the portion of the system of FIG. 39 after activating a docking-side coupler to couple a die chuck and the docking station together.

The method can further include coupling the die chuck to the docking station at block 2544 in FIG. 25. Referring to FIG. 40, the docking station 272 is extended to contact the die chuck 560 that is coupled to the die chuck 560 of the bonding head 521. The docking station 272 can contact the main body 562 of the die chuck 560. Data from a sensor can provide to the controller 160 or a local controller information that the docking station 272 and the die chuck 560 are at or close to each other. The controller 160 or the local controller can transmit a signal for the docking-side coupler for the die chuck 560 to be activated and couple the die chuck 560 to the docking station 272. The docking-side coupling of the docking station 272 is illustrated by shading the channel 1452 and the zone 1462 within the docking station 272.

The die holding region 564 is within the recession 1424 of the docking station 272. In the implementation as illustrated in FIG. 40, the docking station 272 is spaced apart from and does not contact the surface along the distal side of the die holding region 564. Such surface may come in contact with source dies during the transfer cycles. The likelihood of particles coming into contact with or damage to such surface by the docketing station 272 are eliminated or substantially reduced. In another implementation, the surface may contact the docking station 272. Care may be used to reduce the amount of particles that are transferred to the surface or other part of the die holding region 564 or the amount of damage to the surface when the die chuck 560 is coupled to the docking station 272.

Figure 41:
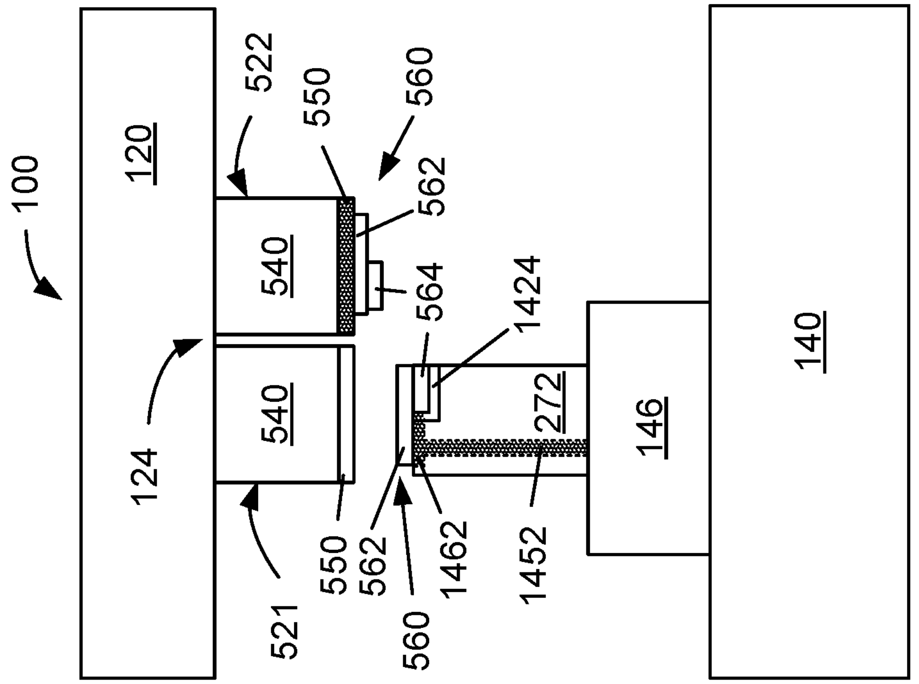
FIG. 41 includes an illustration of a cross-sectional view of the portion of the system of FIG. 40 after deactivating a bridge-side coupler to decouple the die chuck and a device head from each other.

The method can include decoupling the die chuck from the device head at block 2546 in FIG. 25. The controller 160 or a local controller can send a signal for the bridge-side coupler to deactivate and decouple the die chuck 560 from the device head 540 of the bonding head 521 in FIG. 41. The docking station 272 can be spaced apart from the remaining portion of the die head 521. The docking station 272 may be fully retracted or partly, not fully, retracted before the docking station is moved in the X-direction, the Y-direction, or both the X-direction and the Y-direction.

Figure 42:
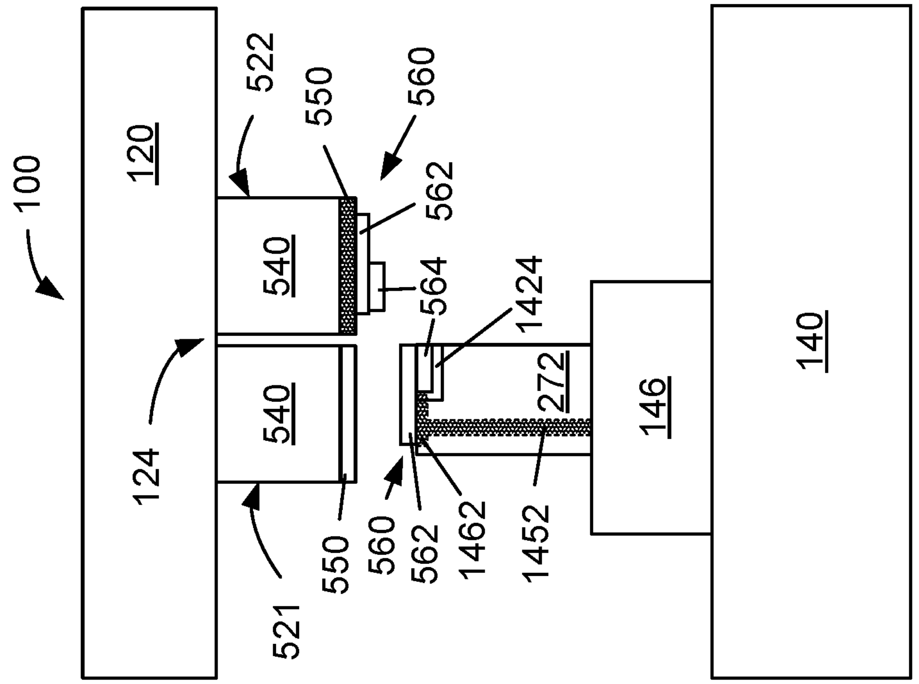
FIG. 42 includes an illustration of a cross-sectional view of the portion of the system of FIG. 41 after moving the die chuck into its desired position.

The method can further include moving the docking station from a first position to a second position at block 2622 in FIG. 26. The controller 160 or a local controller can transmit a signal for the carriage 146 to move so that the docking station 272 is under a desired location along the bridge 120. Referring to FIG. 38, the destination sites 3830 are closer together in the X-direction and farther apart in the Y-direction. The carriage 146 can move the die chuck 560 toward the right-hand side of FIG. 42 for the X-direction and closer to the front of FIG. 42 for the Y-direction.

Figure 43:
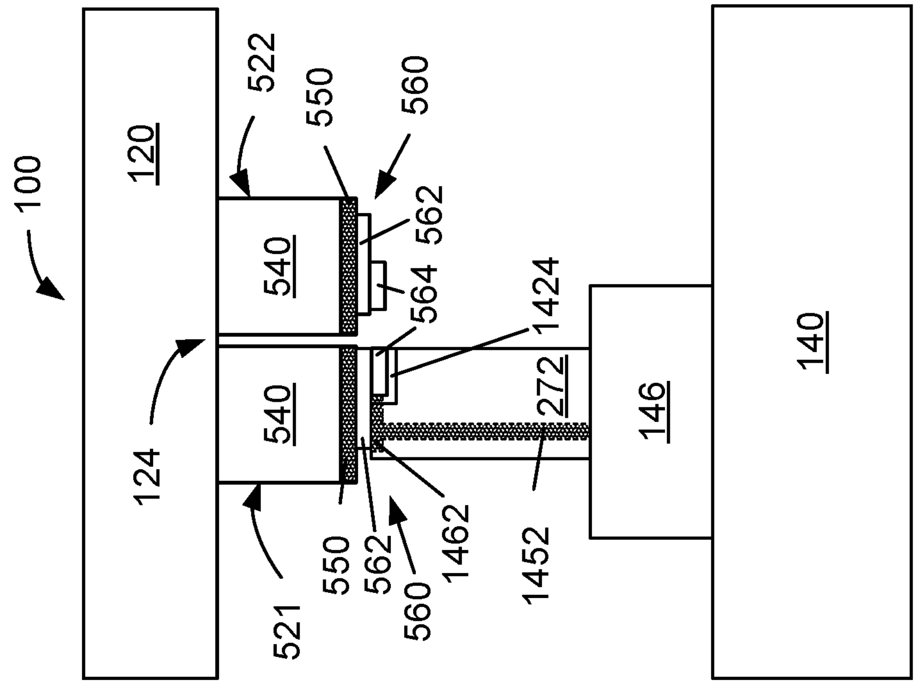
FIG. 43 includes an illustration of a cross-sectional view of the portion of the system of FIG. 42 after activating the bridge-side coupler to couple the die chuck and the device head together.

The method can further include coupling the die chuck to the device head at block 2642 in FIG. 26. Referring to FIG. 43, the docking station 272 is extended to contact the die chuck 560 to the device head 540 of the bonding head 521. The docking station 272 can contact the main body 540 of the bonding head 521. Data from a sensor can provide to the controller 160 or a local controller information that the docking station 272 and the device head 540 of the bonding head 521 are at or close to each other. The controller 160 or a local controller can transmit a signal for the bridge-side coupler for the bonding head 521 to be activated and couple the die chuck 560 to the remaining portion of the bonding head 521, as illustrated by the mounting plate 550 being shaded in FIG. 43.

Figure 44:
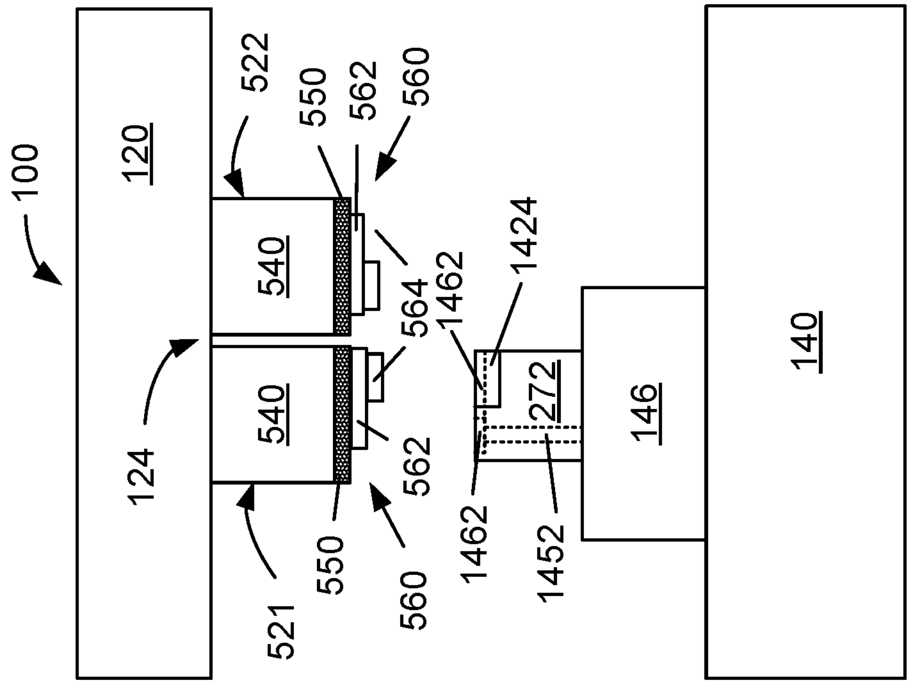
FIG. 44 includes an illustration of a cross-sectional view of the portion of the system of FIG. 43 after deactivating a docking-side coupler to decouple the die chuck and the docking station from each other.

The method can include decoupling the die chuck from the docking station at block 2644 in FIG. 26. The controller 160 or a local controller can send a signal for the docking-side coupler for the docking station 272 to deactivate and decouple the die chuck 560 from the docking station 272 in FIG. 44. The docking station 272 can be moved away from the bonding head 521. At this point in the process, the die holding region 564 for the bonding head 521 is at the desired location corresponding to a destination site 3830 for the destination substrate 3848 (FIG. 38).

A determination is made whether any more bonding heads need to be moved, at decision diamond 2662 in FIG. 26. If another bonding head needs to be moved ("YES" branch), actions corresponding to blocks 2542, 2544, and 2546 in FIG. 25 and blocks 2622, 2642, and 2644 in FIG. 26 are repeated for another die chuck. Along a row of bonding head within the array of bonding heads 124 (X-direction), one, some, or all die chucks 560 can be moved, and along a column of bonding heads within the array of bonding heads 124 (Y-direction), one, some, or all die chucks 560 can be moved.

Figure 45:
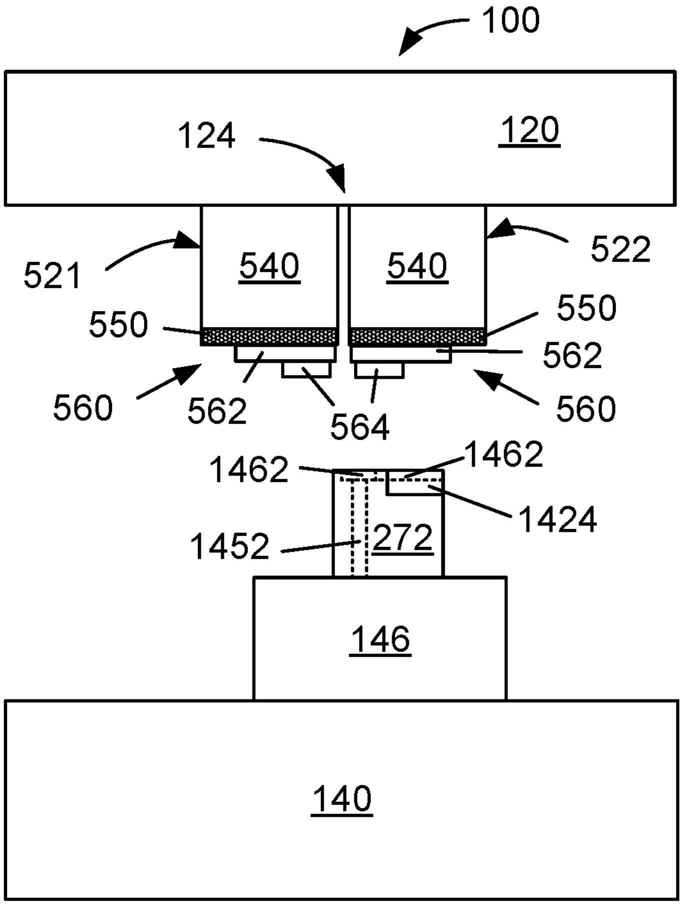
FIG. 45 includes an illustration of a cross-sectional view of the portion of the system of FIG. 44 after repositioning another bonding head.
Figure 46:
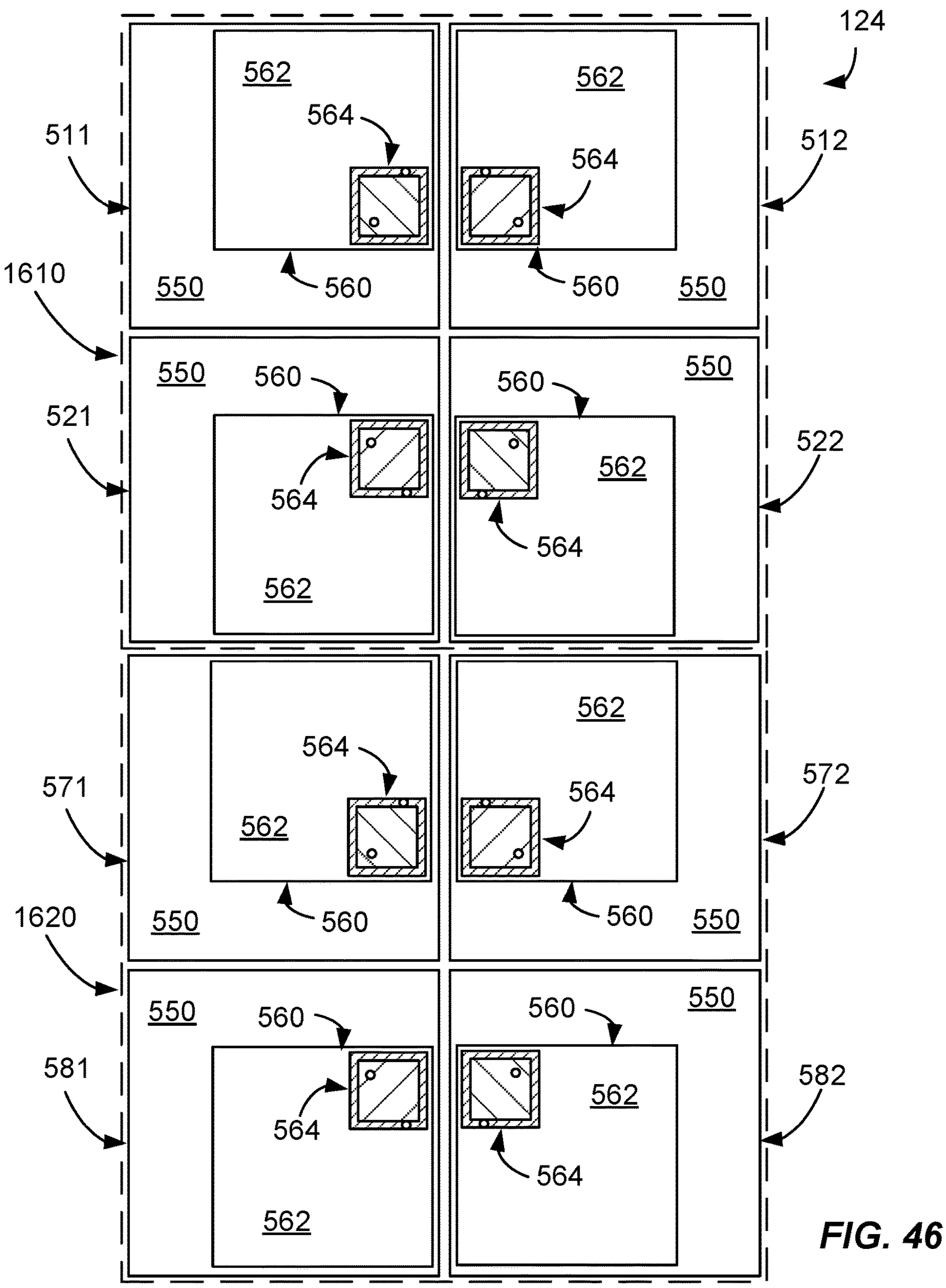
FIG. 46 includes an illustration of a bottom view of the array of bonding heads after die chucks have been repositioned for the destination substrate of FIG. 36.

FIG. 45 includes a side view of the system after the die chuck 560 for the bonding head 522 is moved toward the left-hand side of FIG. 45, and closer to the front of FIG. 45. FIG. 46 includes a bottom view of the portion of the array of bonding heads 511, 512, 521, 522, 571, 572, 581, and 582 of the cells 1610 and 1620 after their die chucks 560 have been moved into different positions. When comparing FIGS. 31 and 46, in the X-direction, the die holding regions 564 are closer to each other for the pair of the bonding heads 511 and 512, the pair of the bonding heads 521 and 522, the pair of the bonding heads 571 and 572, the pair of the bonding heads 581 and 582. In the Y-direction, the die holding regions 564 are farther from each other for the pair of the bonding heads 511 and 521, the pair of the bonding heads 512 and 522, the pair of the bonding heads 571 and 581, and the pair of the bonding heads 582 and 582.

The bonding heads in other cells, such as the cell 1710, are moved as previously described for the bonding heads within the cell 1610 so that the die holding regions 564 of the bonding heads in the other cells are properly positioned for the destination sites 3830 for the destination substrate 3848.

Figure 47:
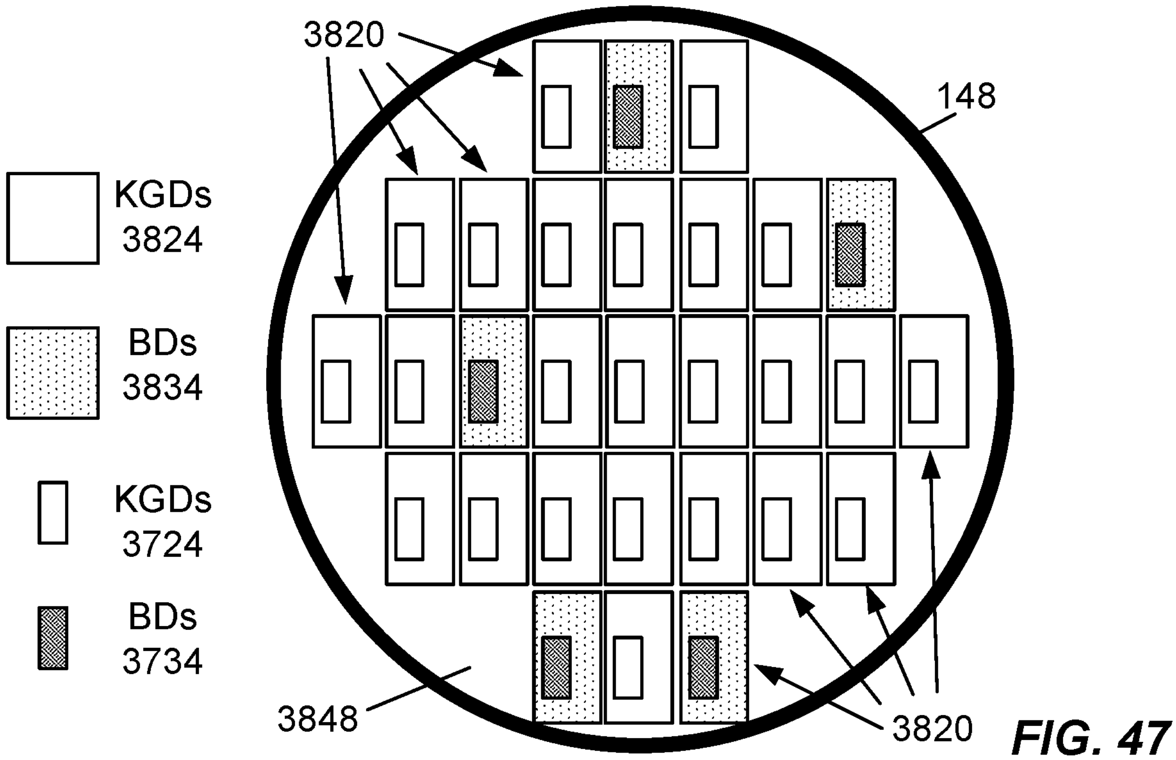
FIG. 47 includes an illustration of a top view of the destination substrate chuck and the destination substrate of FIG. 38 after bonding source dies to the destination sites of the other destination substrate.

If no further bonding heads need to be moved ("NO" branch), the method continues at block 2322 in FIG. 23 where the destination substrate 3848 is mounted to the destination substrate chuck 148. The method continues until source dies are bonded to the destination sites of the destination substrate 3848 as illustrated in FIG. 47. Source KGDs 3724 can be bonded to the destination KGDs 3824. The destination sites for the bad destination dies 3834 may be bonded to bad source dies 3734, to dummy source dies, or to a combination of bad source dies 3734 and dummy source dies. In another implementation, all, some but not all, or none of the destination sites may be left unoccupied and not bonded to any die.

The method can continue until all desired destination substrates have been processed. The method can end ("NO" branch of decision diamond 2522 in FIG. 25). Further processing can be performed to complete a hybrid bonding process of the source dies to the destination sites 3830 of the destination substrate 3848. The hybrid bonding process can include three steps that include a bonding operation corresponding to the transfer operation, a first anneal to cause the metal within the dies and at the destination sites to expand and contact each other, and a second anneal to cause metal atoms to cross the metal-metal interface and reduce contact resistance.

The destination substrate can be removed from the apparatus 110 or moved to a different portion of the apparatus 110 or a different tool to perform the anneal operations.

Figure 48:
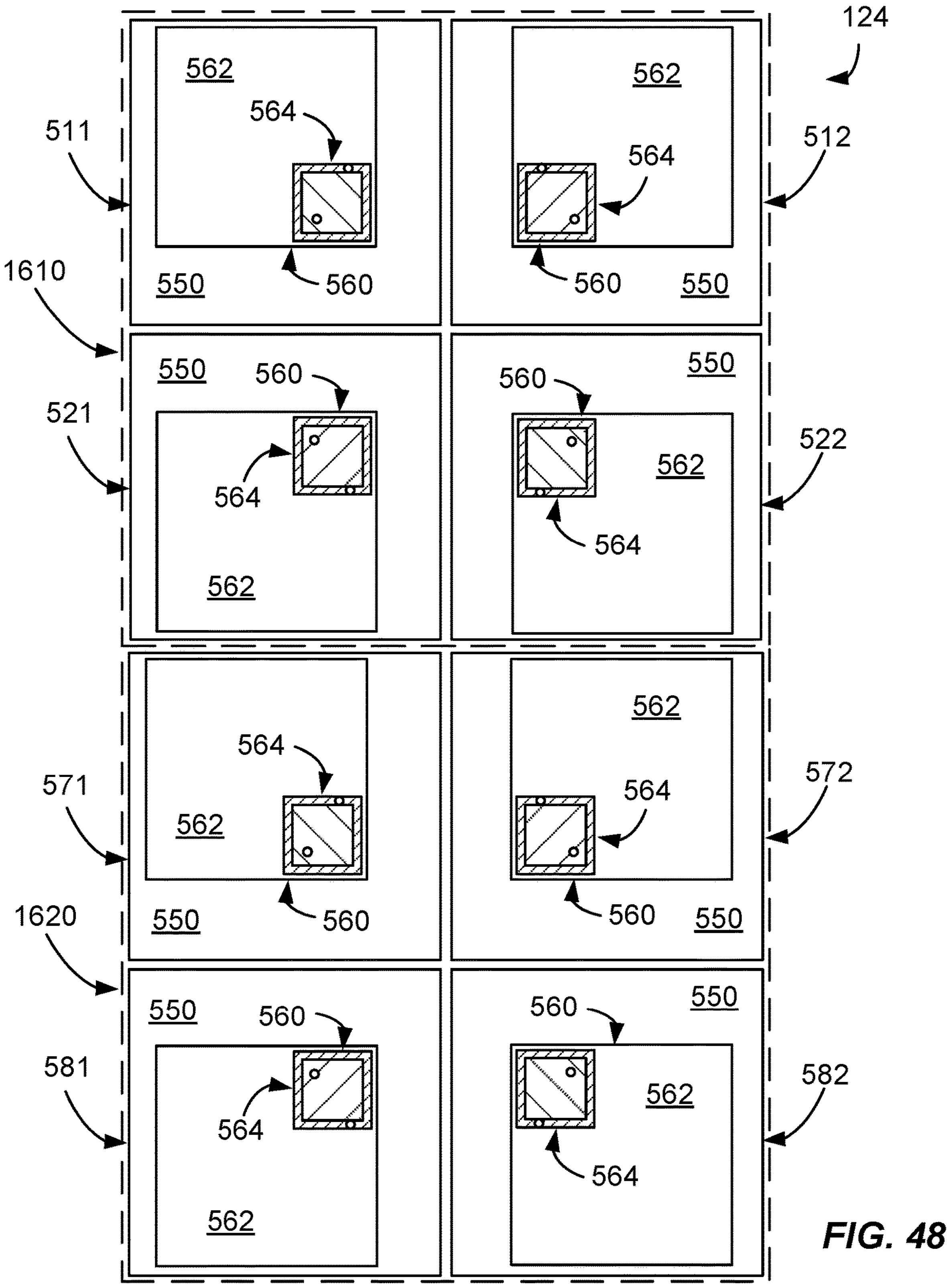
FIG. 48 includes an illustration of a bottom view of the array of bonding heads after die chucks have been repositioned for the destination substrate of FIG. 36.

FIGS. 16, 17, and 46 illustrate cells, wherein within each cell, die chucks are positioned such that source dies can be bonded to destination sites for destination dies are on immediately adjacent rows and columns. Within a cell, the die chucks can be positioned such that the die holding regions are at a pitch that is at or near an integer multiple of the pitch for the destination sites. FIG. 48 includes a bottom view the portion of the cells 1610 and 1620. As compared to FIG. 46, in FIG. 48, the die chucks 560 and positioned so that the die holding regions 564 along rows (X-direction) are farther apart. The organization as illustrated in FIG. 48 may be beneficial when the X-direction dimension, the Y-direction dimension, or both dimensions of die bodies for the bonding heads are greater than the X-direction pitch, the Y-direction pitch, or both pitches of the destination sites of the destination substrate.

For example, a device head 50 may have X-direction and Y-direction dimensions of between 40 mm to 120 mm each. The X-direction pitch for the destination sites may be between 0.5 mm to 100 mm. For example, the X-direction pitch may be 15 mm. Thus, after positioning and without further moving of the carriage 146, the array of bonding heads 124 may be able to bond source dies to every other column of destination sites. The left-hand bonding heads within the cells 1610 and 1620 (bonding heads 511, 521, 571, and 581) can be used to bond source dies to destination sites that are along Column 1, and the right-hand bonding heads within the cells 1610 and 1620 (bonding heads 512, 522, 572, and 582) can be used to bond source dies to destination sites that correspond to Column 3.

A portion of the destination substrate can lie between the die holding regions 564 for the left-hand and right-hand bonding heads along the same row within each of the cells 1610 and 1720 and such portion corresponds to Column 2 of the destination dies. Source dies coupled to the die holding regions 564 of the cells 1610 and 1620 can be bonded to the destination sites in Columns 1 and 3 without having to move the carriage 146 to a different position. For this particular example, the integer multiple is 2.

$DC_{511\_512}=2\times XP_{DS}$, where:

$DC_{511\_512}$ is the distance between the centers of the die holding regions 564 for the bonding heads 511 and 512, and $XP_{DS}$ is the X-direction pitch for the destination sites of the destination substrate.

When the X-direction pitch for the destination sites is 15 mm, the distance between the centers of the die holding regions 564 for the bonding heads 511 and 512 is 30 mm. In practice, slight differences can be attributed to the equipment or repeatability of a manufacturing process. An allowable tolerance can be +/−0.1% of $XP_{DS}$. Thus, the distance between the centers of the die holding regions 564 for the bonding heads 511 and 512 is 30 mm+/−0.05 mm. The relationship can be the same for the other corresponding pairs of bonding heads in the cells 1610 and 1620. The distance between the centers of the die holding regions 564 for the bonding heads 521 and 552 is 30 mm+/−0.05 mm, the distance between the centers of the die holding regions 564 for the bonding heads 551 and 561 is 30 mm+/−0.05 mm, and the distance between the centers of the die holding regions 564 for the bonding heads 552 and 562 is 30 mm+/−0.05 mm. The allowable tolerance may be less than +/−10% of $XP_{DS}$ in view of another consideration, and the allowable tolerance may be +/−5% of $XP_{DS}$, +/−2% of $XP_{DS}$, or +/−10% of $XP_{DS}$. As previously described, the size of contact pads for the source dies, the destination sites or both may be as small as 4 μm. The allowable tolerance may be between +/−1-μm to ensure sufficient physical contact between the contact pads for the source dies and the destination sites. In an implementation in which each of the bonding heads includes a positioning stage, the tolerance may be relaxed up to a fraction of the travel ranges of the positioning heads.

In the Y-direction, the positions of the bonding heads within the cells 1610 and 1620 are unaffected because the Y-direction pitch is the same or greater than the Y-direction dimension of the device head. Within each cell, source dies can be bonded to destination sites for destination dies along immediately adjacent rows, such as Rows 1 and 2 and Rows 7 and 8. Within each of cells 1610 and 1620, the integer multiple is one. Thus, within each of the cells 1610 and 1620, the Y-direction pitch between different rows of bonding heads is the same as or within an allowable tolerance of the Y-direction pitch for the destination sites. The allowable tolerance may be less than +/−10% of Y-direction pitch for the destination sites in view of another consideration, and the allowable tolerance may be +/−5%, +/−2%, or +/−10% of Y-direction pitch for the destination sites. As previously described, the size of contact pads for the source dies, the destination sites or both may be as small as 4 μm. The allowable tolerance may be +/−1 μm to ensure sufficient physical contact between the contact pads for the source dies and the destination sites. In an implementation in which the each of the bonding heads includes a positioning stage, the tolerance may be relaxed up to a fraction of the travel ranges of the positioning heads.

The die chucks 560 in the cell 1710 (FIG. 17) can be moved so that the die chucks 560 within the cell 1710 are at or near the same positions as the die chucks in the cell 1610 as illustrated in FIG. 48.

Figure 49:
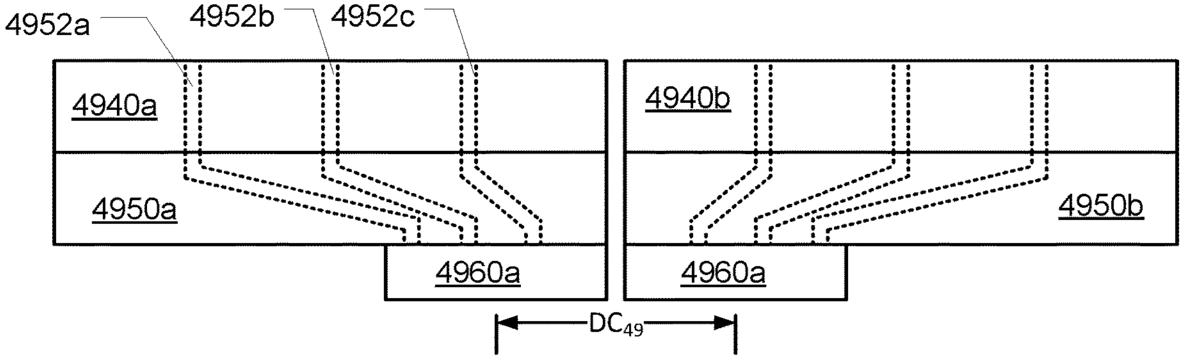
FIG. 49 includes an illustration of a side view of device heads with a first set of mounting plates and a first set of die chucks set at a first pitch in accordance with an alternative implementation.
Figure 50:
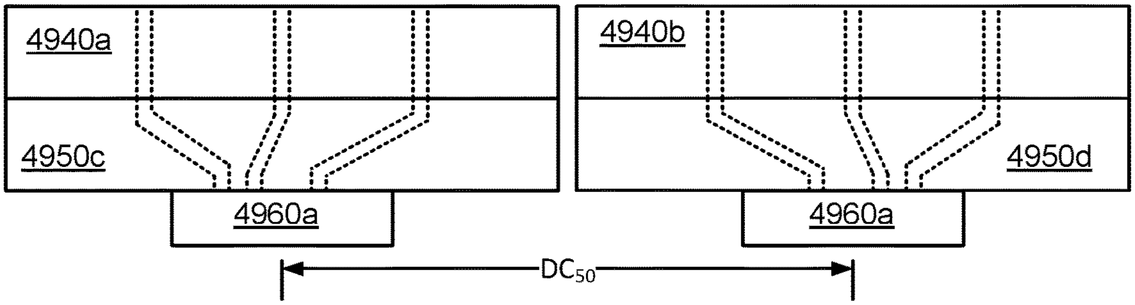
FIG. 50 includes an illustration of a side view of device heads with a second set of mounting plates and the die chucks set at a second pitch in accordance with an alternative implementation.
Figure 51:
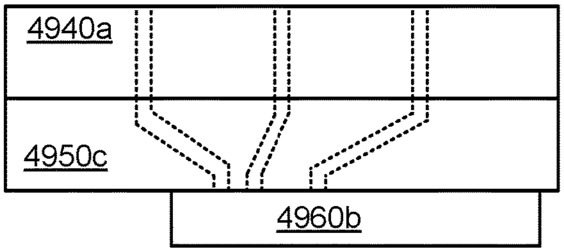
FIG. 51 includes an illustration of a side view of a device head with a third mounting plate and a second chuck in accordance with an alternative implementation.

FIGS. 49 to 55 disclose an additional alternative implementation. As illustrated in FIGS. 49 to 51, the additional alternative implementation includes a plurality of device heads 4940*a* and 4940*b*. Each of the device heads 4940 include device head channels 4952*a*, 4952*b*, and 4952*c*. Each of the device head channels 4952 is connected to vacuum source or a pressurized fluid source. The vacuum and a fluid source may each include one or more of valve(s), tank(s), pump(s), mass flow controller(s), external source(s), etc. that are used for controlling the pressure, timing, or both pressure and timing of vacuum and a fluid from the fluid source, or both. A detachable mounting plate 4950 is coupled to the device head 4940 and receives vacuum and pressurized fluid from the channels in each of the device heads 4940 and supplies the vacuum and pressurized fluid to one of a plurality of possible die chucks 4960. FIG. 49 is an illustration of two device heads 4940*a* and 4940*b*, mounting plates 4950*a* and 4950*b*, and die chucks 4960*a* coupled together such that center of each of the die holding regions 5564 has a pitch $DC_{49}$.

FIG. 50 is an illustration of two device heads 4940*a* and 4940*b*, different mounting plates 4950*c* and 4950*d* and die chucks 4960*a* coupled together such that center of each of the die holding regions 5564 has a pitch $DC_{50}$ that is a different pitch from the pitch $DC_{49}$. The pitch is adjusted by changing the mounting plates 4950 which changes the location of the mounting plate channels on the distal side of the mounting plate facing the proximal side of the die chucks. Each mounting plate or group of mounting plates in the library may have different locations of the channels on the distal side of the mounting plate but have the same location of the channels on the proximal side of the mounting plate. The system 100 can include the library of mounting plates which are coupled onto the device heads 4940 using, for example, the docking station described above. The mounting plates are coupled to the device heads using one or more coupling mechanisms selected from: vacuum coupling; electrostatic coupling; electromagnetic coupling; and mechanical coupling.

FIG. 51 is an illustration of a device head and a different mounting plate 4950*d* attached onto which a die chuck 4960*b* of a different size from the die chuck 4960*a* is mounted. Thus, the dies of a variety of geometry (shape and size) can be placed and bonded to the substrate using various combinations of mounting plates and die chucks. The mounting plates allow for the adjustment of die placement pitches and the die chuck(s) allow for die geometry adjustments. This implementation allows for the size of the die head or device head/mounting plate to be reduced and still handle a large range of pitches on the destination substrate. The device head/mounting plate can potentially be made smaller in size as the mounting plate does need to be large enough in size to cover both minimum and maximum pitches on the destination substrates to be used in the system. This can allow smaller pitches for destination sites on the destination substrates to be achieved.

Figure 52:
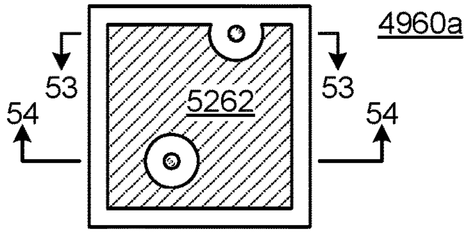
FIG. 52 includes an illustration of a top down view of a die chuck of the device head of FIGS. 49 to 50.
Figure 53:
FIG. 53 includes an illustration of a cross-sectional view of the die chuck of FIGS. 52 and 55 along sectioning line 53-53.
Figure 54:
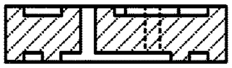
FIG. 54 includes an illustration of a cross-sectional view of the die chuck of FIGS. 52 and 55 along sectioning line 54-54.
Figure 55:
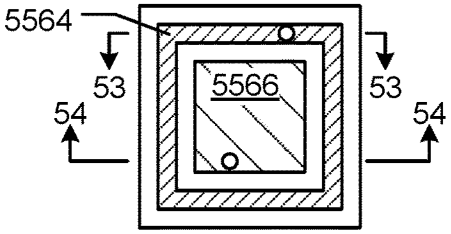
FIG. 55 includes an illustration of a bottom up view of a die chuck of the device head of FIGS. 49 to 50.

FIGS. 52 to 55 are illustrations of an exemplary die chuck 4960*a*. FIG. 52 is an illustration of the proximal side of die chuck 4960*a*. FIG. 53 is an illustration of cross section of the die chuck 4960*a* along sectioning line 53-53. FIG. 54 is an illustration of cross section of the die chuck 4960*a* along sectioning line 54-54. FIG. 55 is an illustration of the distal side of die chuck 4960*a*. The die chuck 4960*a* includes chucking vacuum receiving zone 5262 that is fluidly coupled with vacuum from the device head channel 4952*a* that travels through the mounting plate. The die chuck 4960*a* includes a die vacuum zone 5564 on the distal side of the die chuck and a channel that couples vacuum from device head channel 4952*c* that travels through the mounting plate. The die chuck 4960*a* includes a die modulation zone 5566 on the distal side of the die chuck or inside the die chuck and a channel that couples fluid from device head channel 4952*b* that travels through the mounting plate.

The plurality of the device heads 4940 are arranged at fixed positions relative to each other on the bridge. Each of the device heads 4940 may include or be attached to a positioning stage that is used to adjust the position of the die on its corresponding die chuck. Thus, the device heads 4940 can position the dies such that the relative pitches of the dies are integer multiples of the pitches of destination sites on the destination substrate. The range of the positioning stage is a fraction of the adjustment available by changing mounting plates. For example, changing the mounting plates can allow adjustment of the pitch between 100 mm and 0.5 mm while each of the positioning stages may provide adjustment range 0.05 μm to 0.5 mm depending on the application. The die chucks and die holding regions illustrated herein are square shape but may be any shape that matches the die (square, rectangle, circular, hexagonal, etc.).

Implementations as described herein can be helpful when bonding source dies to different destination substrate having different pitches for destination sites. Die chucks can be moved to different positions, such that the die holding regions can be at pitches at or within an acceptable tolerance of an integer multiple of the pitches of the destination sites. The die bodies can be placed at a very small pitch and remain stationary as the die chucks are moved for a different pitch of destination sites. In an alternative implementation, a set of die chucks can be replaced by another set of die chucks while the die bodies remain stationary. The die chucks are smaller and have less mass and allow the die chucks to be moved more readily and held by the die bodies more readily as compared to moving entire die heads. No tubes, cabling, or other mechanical feature within a device head or a die head support structure, such as a bridge, a carriage, or a base, is needed when moving the die chucks using the docking station. Such a configuration can simplify the design of the die head and its corresponding support structure(s) and reduce the likelihood of particle generation when the die chucks are moved or a set of die chucks are replaced.

Note that not all of the activities described above in the general description or the examples are required, that a portion of a specific activity may not be required, and that one or more further activities can be performed in addition to those described. Still further, the order in which activities are listed is not necessarily the order in which they are performed.

Benefits, other advantages, and solutions to problems have been described above with regard to specific implementations. However, the benefits, advantages, solutions to problems, and any feature(s) that can cause any benefit, advantage, or solution to occur or become more pronounced are not to be construed as a critical, required, or essential feature of any or all the claims.

The specification and illustrations of the implementations described herein are intended to provide a general understanding of the structure of the various implementations. The specification and illustrations are not intended to serve as an exhaustive and comprehensive description of all of the elements and features of apparatus and systems that use the structures or methods described herein. Separate implementations can also be provided in combination in a single implementation, and conversely, various features that are, for brevity, described in the context of a single implementation, can also be provided separately or in any subcombination. Further, reference to values stated in ranges includes each and every value within that range. Many other implementations can be apparent to skilled artisans only after reading this specification. Other implementations can be used and derived from the disclosure, such that a structural substitution, logical substitution, or another change can be made without departing from the scope of the disclosure. Accordingly, the disclosure is to be regarded as illustrative rather than restrictive.

What is claimed is:

1. A system, comprising:

a plurality of bonding heads including a first bonding head and a second bonding head, wherein each bonding head within the plurality of bonding heads includes:

a device head configured to be releasably coupled with a die chuck, the die chuck being selectively positionable within a die chuck mounting region; and wherein a distance between a first die holding region of a first die chuck of the first bonding head and a second die holding region of a second die chuck of the second bonding head is changeable by changing at least one of (i) a position of the first die chuck within a first die chuck mounting region and (ii) a position of the second die chuck within a second die chuck mounting region.

2. The system of claim 1, wherein each of the bonding heads further comprises:

a mounting plate; and the die chuck including a die holding region, wherein the mounting plate is disposed between the device head and the die chuck, and the mounting plate defines the die chuck mounting region.

3. The system of claim 2, wherein the mounting plate includes a vacuum channel for holding the die chuck at different positions.

4. The system of claim 3, wherein the die chuck comprises:

a distal side and a proximal side, wherein the device head is closer to the proximal side than to the distal side; and a chucking vacuum receiving zone along the proximal side of the die chuck, wherein the chucking vacuum receiving zone is configured to allow the die chuck to be held by a vacuum.

5. The system of claim 3, wherein the die chuck comprises:

a distal side and a proximal side, wherein the device head is closer to the proximal side than to the distal side;

a vacuum receiving zone along the proximal side of the die chuck;

a die vacuum receiving zone along on the distal side of the die chuck; and a vacuum connection within the die chuck and between the vacuum receiving zone and the die vacuum receiving zone.

6. The system of claim 5, wherein the die chuck comprises:

a modulation receiving zone along the proximal side of the die chuck;

a die modulation zone along the distal side of the die chuck; and a modulation connection within the die chuck and between the modulation receiving zone and the die modulation zone.

7. The system of claim 2, wherein:

the device head has a device head mass, and the die chuck has a die chuck mass that is less than half of the device head mass.

8. The system of claim 2, wherein a center of the die holding region is offset from a center of the die chuck mounting region when the die chuck is at each of different positions.

9. The system of claim 2, wherein the bonding head is configured to allow motion of the die chuck while the die chuck is coupled to the device head.

10. The system of claim 1, further comprising:

a docking station configured to move the die chuck relative to its corresponding device head;

a first coupler configured to couple the die chuck to the corresponding device head and to decouple the die chuck from the corresponding device head; and a second coupler configured to couple the die chuck to the docking station and to decouple the die chuck from the docking station.

11. The system of claim 10, wherein the second coupler is configured such that the docking station does not contact a die holding region of the die chuck.

12. The system of claim 1, further comprising a controller configured to transmit a signal to move a first die chuck of the first bonding head from a first position along a first device head of the first bonding head to a second position along the first device head, wherein the plurality of bonding heads includes the first bonding head.

13. The system of claim 1, further comprising:

a bridge coupled to the plurality of bonding heads;

a source substrate chuck;

a base spaced apart from the bridge;

a positioning stage coupled to the base;

a plurality of pick-up heads coupled to the positioning stage; and a docking station coupled to the positioning stage.

14. The system of claim 1, wherein each of the bonding heads further comprises one of a first mounting plate and a second mounting plate, wherein:

the first mounting plate defines a first location of a die holding region of the die chuck on the device head, the second mounting plate defines a second location of the die holding region of the die chuck on the device head, and the second location is different from the first location.

15. A method, comprising:

coupling a first die chuck to a docking station by activating a first coupler associated with the docking station, wherein:

a plurality of bonding heads includes a first bonding head, the first bonding head includes a first device head and the first die chuck, the first die chuck has a first die holding region, and the first die chuck is coupled to the first device head at a first position within a first die chuck mounting region;

decoupling the first die chuck from the first device head by deactivating a second coupler associated with the first device head;

moving the first docking station from a first location along a support structure to a second location along the support structure;

coupling the first die chuck to the first device head by activating the second coupler, wherein after coupling the first die chuck to the first device head, the first die chuck is at a second position within the first die chuck mounting region, wherein the second position is different from the first position; and decoupling the first die chuck from the docking station by deactivating the first coupler.

16. The method of claim 15, further comprising:

coupling a second die chuck to the docking station by activating a third coupler or the first coupler associated with the docking station, wherein:

the plurality of bonding heads includes a second bonding head, the second bonding head includes a second device head and the second die chuck, the second die chuck has a second die holding region, and the second die chuck is coupled to the second device head at a third position within a second die chuck mounting region;

decoupling the second die chuck from the second device head by deactivating a fourth coupler associated with the second device head;

moving the docking station from a third location along the support structure to a fourth location along the support structure;

coupling the second die chuck to the second device head by activating the fourth coupler, wherein after coupling the second die chuck to the second device head, the second die chuck is at a fourth position within the second die chuck mounting region, wherein the fourth position is different from the third position; and decoupling the second die chuck from the docking station by deactivating the third coupler or the first coupler, wherein:

the first die holding region and the second die holding region are at a first pitch when the first die chuck is at the first position and the second die chuck is at the third position, the first die holding region and the second die holding region are at a second pitch when the first die chuck is at the second position and the second die chuck is at the fourth position, and the second pitch is different from the first pitch.

17. The method of claim 16, further comprising:

mounting a destination substrate onto a destination substrate chuck coupled to a positioning stage, wherein the destination substrate has a plurality of destination sites at a destination site pitch, wherein the destination site pitch is closer to the second pitch than to the first pitch, wherein the docking station is coupled to the positioning stage.

18. The method of claim 17, further comprising:

picking up a set of dies from a source substrate with a plurality of pick-up heads;

transferring the set of dies from the plurality of pick-up heads to the plurality of bonding heads, wherein the plurality of bonding heads is a plurality of bonding heads, wherein transferring is performed after coupling the first die chuck to the first device head and coupling the second die chuck to the second device head;

measuring alignment errors of the set of dies held by the plurality of bonding heads;

adjusting a position of a first die within the set of the dies relative to the destination substrate on the destination substrate chuck based on an alignment error associated with the first die; and bonding the set of dies to the destination substrate with the plurality of bonding heads.

19. The method of claim 17, further comprising:

receiving the destination site pitch including a first destination site pitch in a first direction and a second destination site pitch in a second direction; and positioning die holding regions for a first cell of four bonding heads to be at a first integer multiple of the first destination site pitch and a second integer multiple of the second destination site pitch, wherein the first cell includes the first bonding head and the second bonding head.

20. The method of claim 19, further comprising:

positioning die holding regions for a second cell of four bonding heads with same pitches as the die holding regions for the first cell of four bonding heads.

21. The method of claim 15, wherein:

moving the docking station is performed between a pair of transfer operations, the plurality of bonding heads includes the first bonding head, and the first device head is coupled to the support structure and is not moved when the first die chuck is moved.

22. A method, comprising:

decoupling a first die chuck from a first device head, wherein:

a plurality of bonding heads includes a first bonding head, the first bonding head includes the first device head and the first die chuck, and before decoupling, the first die chuck has a first die holding region at a first position relative to the first device head;

decoupling a second die chuck from a second device head, wherein:

the plurality of bonding heads includes a second bonding head, the second bonding head includes the second device head and the second die chuck, and before decoupling, the second die chuck has a second die holding region at a second position relative to the second device head;

coupling a third die chuck to the first device head, wherein the third die chuck has a third die holding region at a third position relative to the first device head; and coupling a fourth die chuck to the second device head, wherein the fourth die chuck has a fourth die holding region at a fourth position relative to the second device head, wherein:

before decoupling the first die chuck and decoupling the second die chuck, the first die holding region and the second die holding region are at a first pitch, and after coupling the third die chuck and coupling the fourth die chuck, the third die holding region and the fourth die holding region are at a second pitch that is different from first pitch.

23. The method of claim 22, further comprising:

bonding a first die to a first destination substrate using the first die chuck;

bonding a second die to the first destination substrate using the second die chuck;

bonding a third die to a second destination substrate using the third die chuck; and bonding a fourth die to the second destination substrate using the fourth die chuck, wherein:

bonding the first die and bonding the second die are performed before decoupling the first die chuck and decoupling the second die chuck, and bonding the third die and bonding the fourth die are performed after coupling the third die chuck and coupling the fourth die chuck.

* * * * *